US011149196B2

(12) United States Patent
Ichihashi et al.

(10) Patent No.: US 11,149,196 B2
(45) Date of Patent: Oct. 19, 2021

(54) PYRROMETHENE-BORON COMPLEX, COLOR-CHANGING COMPOSITION, COLOR-CHANGING FILM, LIGHT SOURCE UNIT INCLUDING SAME, DISPLAY, AND LIGHTING

(71) Applicant: TORAY INDUSTRIES, INC., Tokyo (JP)

(72) Inventors: Yasunori Ichihashi, Otsu (JP); Masaaki Umehara, Otsu (JP); Hirotoshi Sakaino, Otsu (JP); Daisaku Tanaka, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/935,844

(22) Filed: Jul. 22, 2020

(65) Prior Publication Data

US 2020/0347292 A1 Nov. 5, 2020

Related U.S. Application Data

(62) Division of application No. 15/576,191, filed as application No. PCT/JP2016/065213 on May 23, 2016, now Pat. No. 10,836,959.

(30) Foreign Application Priority Data

May 26, 2015 (JP) ................................ 2015-106156
Jul. 17, 2015 (JP) ................................ 2015-142696
(Continued)

(51) Int. Cl.
*G02F 1/13357* (2006.01)
*H01L 33/50* (2010.01)
(Continued)

(52) U.S. Cl.
CPC .............. *C09K 11/06* (2013.01); *C07F 5/022* (2013.01); *C07F 5/027* (2013.01); *C09B 57/00* (2013.01);
(Continued)

(58) Field of Classification Search
CPC . H01L 33/502; G02F 1/133617; C09K 11/06; C09K 11/02; C09K 2211/1022; C07F 5/022; C07F 5/027; G02B 5/20
(Continued)

(56) References Cited

U.S. PATENT DOCUMENTS

| | | | |
|---|---|---|---|
| 5,189,029 | A | 2/1993 | Boyer et al. |
| 5,446,157 | A | 8/1995 | Morgan et al. |

(Continued)

FOREIGN PATENT DOCUMENTS

| | | | |
|---|---|---|---|
| JP | 08509471 | A | 10/1996 |
| JP | 08286033 | A | 11/1996 |

(Continued)

OTHER PUBLICATIONS

Chinese Office Action for Chinese Application No. 201680029782.9, dated Mar. 19, 2019, with translation, 10 pages.

(Continued)

*Primary Examiner* — Igwe U Anya
(74) *Attorney, Agent, or Firm* — RatnerPrestia

(57) ABSTRACT

An organic luminescent material suitable for color conversion material used for a liquid crystal display or LED lighting, excellent in luminous efficiency and durability, to which a pyrromethene-boron complex or a color conversion composition containing the pyrromethene-boron complex contributes, is provided.

19 Claims, 3 Drawing Sheets

(30) Foreign Application Priority Data

| | | |
|---|---|---|
| Jul. 17, 2015 | (JP) | 2015-142697 |
| Sep. 29, 2015 | (JP) | 2015-190907 |
| Sep. 30, 2015 | (JP) | 2015-193004 |
| Oct. 9, 2015 | (JP) | 2015-200792 |
| Nov. 26, 2015 | (JP) | 2015-230447 |
| Nov. 26, 2015 | (JP) | 2015-230448 |

(51) Int. Cl.

| | |
|---|---|
| ***C09K 11/06*** | (2006.01) |
| ***C09B 57/00*** | (2006.01) |
| ***G02B 5/20*** | (2006.01) |
| ***C07F 5/02*** | (2006.01) |
| ***C09K 11/02*** | (2006.01) |

(52) U.S. Cl.

CPC ................ *C09K 11/02* (2013.01); *G02B 5/20* (2013.01); *G02F 1/133617* (2013.01); *C09K 2211/1022* (2013.01); *H01L 33/502* (2013.01)

(58) Field of Classification Search

USPC ........................................................... 257/98

See application file for complete search history.

(56) References Cited

U.S. PATENT DOCUMENTS

| | | | | |
|---|---|---|---|---|
| 6,221,517 | B1 | 4/2001 | Eida et al. | |
| 2001/0007412 | A1 | 7/2001 | Eida et al. | |
| 2003/0082406 | A1 | 5/2003 | Murase et al. | |
| 2010/0213356 | A1 | 8/2010 | Berginc et al. | |
| 2010/0264406 | A1 | 10/2010 | Nagao et al. | |
| 2012/0037890 | A1* | 2/2012 | Okuda | C07F 5/022 257/40 |
| 2013/0307010 | A1 | 11/2013 | Hikmet et al. | |
| 2014/0211447 | A1 | 7/2014 | Harding et al. | |
| 2016/0230960 | A1 | 8/2016 | Seo et al. | |
| 2016/0271273 | A1 | 9/2016 | Sakurai et al. | |
| 2016/0272884 | A1 | 9/2016 | Kim et al. | |
| 2017/0200901 | A1* | 7/2017 | Fujita | H01L 51/0058 |
| 2017/0260212 | A1 | 9/2017 | Lee et al. | |
| 2017/0267921 | A1 | 9/2017 | Shin et al. | |
| 2018/0134952 | A1 | 5/2018 | Ichihashi et al. | |
| 2018/0179439 | A1 | 6/2018 | Umehara et al. | |

FOREIGN PATENT DOCUMENTS

| | | | |
|---|---|---|---|
| JP | 11176572 | A | 7/1999 |
| JP | 2000019738 | A | 1/2000 |
| JP | 2000208262 | A | 7/2000 |
| JP | 2001164245 | A | 6/2001 |
| JP | 2002317175 | A | 10/2002 |
| JP | 2002348568 | A | 12/2002 |
| JP | 2006251076 | A | 9/2006 |
| JP | 2007273440 | A | 10/2007 |
| JP | 4012627 | B2 | 11/2007 |
| JP | 4012628 | B2 | 11/2007 |
| JP | 201061824 | A | 3/2010 |
| JP | 2010276623 | A | 12/2010 |
| JP | 2011241160 | A | 12/2011 |
| JP | 2012022028 | A | 2/2012 |
| JP | 2014513865 | A | 6/2014 |
| JP | 2014136771 | A | 7/2014 |
| JP | 6299870 | B2 | 3/2018 |
| KR | 100856981 | B1 | 9/2008 |
| KR | 20100124707 | A | 11/2010 |
| KR | 20150050969 | A | 5/2015 |
| TW | 201643234 | A | 12/2016 |
| WO | 2007088055 | A1 | 8/2007 |
| WO | 2009116456 | A1 | 9/2009 |
| WO | 2015056779 | A1 | 4/2015 |
| WO | 2015064864 | A1 | 5/2015 |
| WO | 20160108411 | A1 | 7/2016 |

OTHER PUBLICATIONS

Chinese Office Action for Chinese Application No. 201680029782.9, dated Sep. 2, 2019, with translation, 8 pages.

European Communication for European Application No. EP16799988.7, dated Jul. 18, 2019, 7 pages.

Extended European Search Report for European Application No. 16 799 988.7, dated Oct. 16, 2018, 7 pages.

International Search Report and Written Opinion for International Application No. PCT/JP2016/065213, dated Aug. 23, 2016, 9 pages.

Japanese Office Action for Japanese Application No. 2016-561030, dated May 31, 2017, 7 pages.

Jiao et al., "Accessing Near-Infrared-Absorbing $BF_2$-Azadipyrromethenes via a Push-Pull Effect," The Journal of Organic Chemistry, vol. 79, Jan. 31, 2014, pp. 1830-1835.

Komatsu et al., "Development of 2,6-carboxy-substituted boron dipyrromethene (BODIPY) as a novel scaffold of ratiometric fluorescent probes for live cell imaging", Chemical Communications, Oct. 8, 2009, No. 43, pp. 7015-1017.

Korean Office Action for Korean Application No. 10-2017-7033768 dated Jun. 3, 2019, with translation, 31 pages.

Leen, V., Doctoral Thesis, Katholieke Universiteit Leuven, Faculty of Science, Dept. of Chemistry, Molecular Design and Synthesis, "Synthesis and application of reactive Bodipy dyes," May 2010, 210 pages.

Notification of Reasons for Refusal for Japanese Application No. 2016-534754, dated Nov. 16, 2017, including English translation, 6 pages.

Sabatini et al., "Intersystem Crossing in Halogenated Bodipy Chromophores Used for Solar Hydrogen Production", The Journal of Phys. Chemistry Letters, 2011, vol. 2, No. 3, pp. 223-2227.

Singapore Search Report and Written Opinion for Singapore Application No. 11201709751S, dated Jun. 28, 2018, 8 pages.

Tachikawa et al., "Super-Resolution Mapping of Reactive Sites on Titania-Based Nanoparticles with Water-Soluble Fluorogenic Probes", ACS Nano, Dec. 5, 2012, vol. 7, No. 1, pp. 263-275.

Taiwanese Office Action for Taiwanese Application No. 105116176, dated Apr. 8, 2019, with translation, 20 pages.

Topel et al., "Near IR Excitation of Heavy Atom Free Bodipy Photosensitizers Through the Intermediacy of Upconverting Nanoparticles", Chemical Communications, Jun. 16, 2014, vol. 50, No. 64, pp. 8896-8899.

Ueno et al., "Mechanism-based molecular design of highly selective fluorescence probes for nitrative stress," Journal of the American Chemical Society, vol. 128(33), Jul. 28, 2006, pp. 10640-10641.

Yamada et al., "Preparation of BODIPY Probes for Multicolor Fluorescence Imaging Studies of Membrane Dynamics", New J. Chem., 2001, 25, pp. 667-669.

Indian Examination Report for Indian Application No. 201747042185, dated Nov. 26, 2019, with translation, 7 pages.

Indonesian Examination Report for Indonesian Application No. PID201708344, dated Sep. 9, 2019, with translation, 5 pages.

Notice of Final Rejection for Korean Application No. 10-2017-7033768, dated Oct. 22, 2019, with translation, 8 pages.

Singapore Written Opinion for Singapore Application No. 11201709751S, dated Dec. 17, 2019, 6 pages.

* cited by examiner

PYRROMETHENE-BORON COMPLEX, COLOR-CHANGING COMPOSITION, COLOR-CHANGING FILM, LIGHT SOURCE UNIT INCLUDING SAME, DISPLAY, AND LIGHTING

CROSS REFERENCE TO RELATED APPLICATIONS

This is a Divisional Application of U.S. application Ser. No. 15/576,191, filed Nov. 21, 2017, which is the U.S. National Phase application of PCT/JP2016/065213, filed May 23, 2016, which claims priority to Japanese Patent Application No. 2015-106156, filed May 26, 2015; Japanese Patent Application No. 2015-142696, filed Jul. 17, 2015; Japanese Patent Application No. 2015-142697, filed Jul. 17, 2015; Japanese Patent Application No. 2015-190907, filed Sep. 29, 2015; Japanese Patent Application No. 2015-193004, filed Sep. 30, 2015; Japanese Patent Application No. 2015-200792, filed Oct. 9, 2015; Japanese Patent Application No. 2015-230447, filed Nov. 26, 2015; and Japanese Patent Application No. 2015-230448, filed Nov. 26, 2015; the disclosures of these applications being incorporated herein by reference in their entireties for all purposes.

TECHNICAL FIELD OF THE INVENTION

The present invention relates to a pyrromethene-boron complex, a color conversion composition, a color conversion film, and a light source unit, a display and lighting each containing the same.

BACKGROUND OF THE INVENTION

The multi-coloring technology by a color conversion system is being vigorously studied on its application to a liquid crystal display, an organic EL display, lighting, etc. Color conversion is to convert light emitted from a light emitter into light having a longer wavelength and indicates converting, for example, blue emission into green or red emission. A composition having this color conversion function is formed into a film and combined, for example with a blue light source, and three primary colors of blue, green and red can thereby be extracted from the blue light source, i.e., white light can be extracted. A white light source obtained by combining a blue light source with a film having a color conversion function is used as a light source unit, and combined with a liquid crystal driving portion and a color filter, whereby a full-color display can be manufactured. In the case of not using a liquid crystal driving portion, the white light source can be used directly as a white light source and can be applied, for example, as a white light source for LED lighting.

A problem to be solved in a liquid crystal display includes improvement of color reproducibility. For improving the color reproducibility, it is effective to make narrow the half-value width of each emission spectrum of blue, green and red of a light source unit to thereby increase the color purity of each of blue, green and red colors. As a means to solve this task, a technique using, as a component of a color conversion composition, a quantum dot by an inorganic semiconductor fine particle has been proposed (see, for example, Patent Document 1). The technique using a quantum dot had certainly succeeded in making the half-value width of green and red emission spectra narrow and enhancing color reproducibility, but on the other hand, the quantum dot was weak to heat and water or oxygen in air, and the durability was insufficient.

A technique using, as a component of a color conversion composition, an organic luminescent material in place of a quantum dot has also been proposed. As for examples of the technique using an organic luminescent material as a component of a color conversion composition, those using a pyridine-phthalimide condensation product (see, for example, Patent Document 2) or using a coumarin derivative (see, for example, Patent Document 3), and with regard to a red luminescent material, those using a perylene derivative (see, for example, Patent Document 4), using a rhodamine derivative (see, for example, Patent Document 5), or using a pyrromethene derivative (see, for example, Patent Documents 6 and 7), have been disclosed.

PATENT DOCUMENTS

Patent Document 1: JP-A-2012-22028
Patent Document 2: JP-A-2002-348568
Patent Document 3: JP-A-2007-273440
Patent Document 4: JP-A-2002-317175
Patent Document 5: JP-A-2001-164245
Patent Document 6: JP-A-2011-241160
Patent Document 7: JP-A-2014-136771

SUMMARY OF THE INVENTION

Even when a color conversion composition is formed using such an organic luminescent material, however, the technique is still not satisfied in terms of color reproducibility, luminous efficiency and enhancement of durability. Among others, a technique capable of achieving both high luminous efficiency and high durability, or a technique capable of satisfying both high-color-purity green emission and durability is insufficient.

A problem to be solved by the present invention is to enhance color reproducibility, luminous efficiency and durability in a color conversion composition used for a liquid crystal display or LED lighting.

One aspect of the present invention is directed to a color conversion composition for converting incident light into light having longer wavelength than the incident light, in which the color conversion composition contains a compound represented by formula (1) and a binder resin:

[Chem. 1]

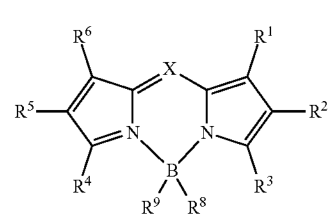

(1)

(in which

X is C—$R^7$ or N, each of $R^1$ to $R^7$, which may be the same as or different from one another, is selected from hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, an aldehyde group, a substituted or unsubstituted carbonyl group, a carboxyl group, a substituted or unsubstituted oxycarbonyl group, a substituted or unsubstituted carbamoyl group, a substituted or unsubstituted ester group, a substituted or unsubstituted sulfonyl group, a substituted or unsubstituted amide group, a substituted or unsubstituted amino group, a nitro group, a substituted or unsubstituted silyl group, a substituted or unsubstituted siloxanyl group, a substituted or unsubstituted boryl group, and a substituted or unsubstituted phosphine oxide group, and each of $R^8$ and $R^9$, which may be the same as or different from one another, is selected from a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, and a halogen, provided that at least either one of the following (A) and (B) is satisfied:

(A) at least one of $R^1$ to $R^7$ is an electron-withdrawing group, and (B) each of $R^1$, $R^3$, $R^4$ and $R^6$, which may be the same as or different from one another, is hydrogen, a halogen, a substituted or unsubstituted alkyl group, a substituted or unsubstituted cycloalkyl group, a substituted or unsubstituted alkoxy group, a substituted or unsubstituted aryl ether group, a substituted or unsubstituted heterocyclic group, a substituted or unsubstituted alkylthio group, a substituted or unsubstituted aryl thioether group, a substituted or unsubstituted amino group, a substituted or unsubstituted silyl group, or a cyano group, X is C—$R^7$, and $R^7$ is either a substituted or unsubstituted aryl group or a substituted or unsubstituted heteroaryl group).

In addition, another aspect of the present invention is directed to a pyrromethene-boron complex represented by the formula (3) below:

[Chem. 2]

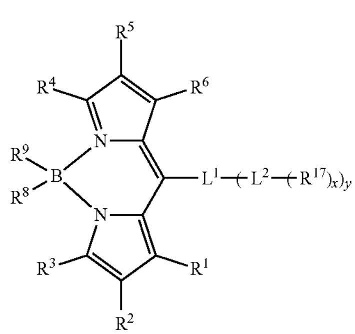

(3)

Each of $R^1$ to $R^6$, which may be the same as or different from one another, is selected from hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, an aldehyde group, a substituted or unsubstituted carbonyl group, a carboxyl group, a substituted or unsubstituted oxycarbonyl group, a substituted or unsubstituted carbamoyl group, a substituted or unsubstituted ester group, a substituted or unsubstituted sulfonyl group, a substituted or unsubstituted amide group, a substituted or unsubstituted amino group, a nitro group, a substituted or unsubstituted silyl group, a substituted or unsubstituted siloxanyl group, a substituted or unsubstituted boryl group, and a substituted or unsubstituted phosphine oxide group, and each of $R^8$ and $R^9$ is selected from a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, and a halogen, $L^1$ and $L^2$ are a single bond, a substituted or unsubstituted arylene group, or a substituted or unsubstituted heteroarylene group, and x and y are an integer of 1 to 5, provided that $R^{17}$ is an electron-withdrawing group and at least one of $R^1$ to $R^6$ is an electron-withdrawing group).

The color conversion film using the pyrromethene-boron complex or color conversion composition of the present invention can achieve both high color purity and durability, so that both color reproducibility and durability can be satisfied.

DETAILED DESCRIPTION OF EMBODIMENTS OF THE INVENTION

Figure 1:
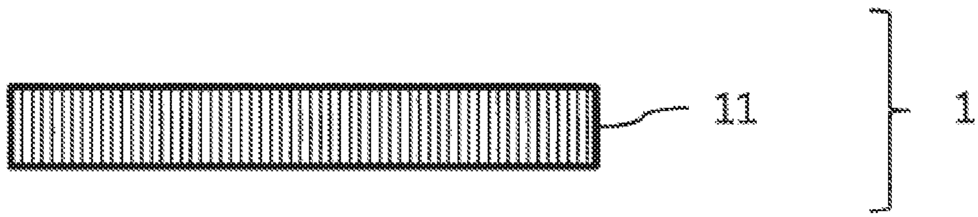
FIG. 1 is a schematic cross-sectional view illustrating one example of the color conversion film of the present invention.

One feature of the present invention is a color conversion composition for converting incident light into light having longer wavelength than the incident light, in which the color conversion composition includes a compound represented by formula (1) and a binder resin.

Another feature of the present invention is a pyrromethene-boron complex represented by formula (3).

The embodiments of the present invention are specifically described below, but the present invention is not limited to the following embodiments and can be implemented by making various modifications according to the purpose or usage.

<Compound Represented by Formula (1)>

The pyrromethene-boron complex represented by formula (1) is described in detail.

[Chem. 3]

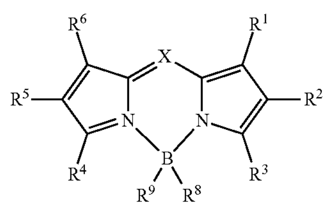

(1)

In the formula, X is C—$R^7$ or N.

Each of $R^1$ to $R^7$, which may be the same as or different from one another, is selected from hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, an aldehyde group, a substituted or unsubstituted carbonyl group, a carboxyl group, a substituted or unsubstituted oxycarbonyl group, a substituted or unsubstituted carbamoyl group, a substituted or unsubstituted ester group, a substituted or unsubstituted sulfonyl group, a substituted or unsubstituted amide group, a substituted or unsubstituted amino group, a nitro group, a substituted or unsubstituted silyl group, a substituted or unsubstituted siloxanyl group, a substituted or unsubstituted boryl group, and a substituted or unsubstituted phosphine oxide group.

Each of $R^8$ and $R^9$, which may be the same as or different from one another, is selected from a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, and a halogen, provided that at least either one of the following (A) and (B) is satisfied:

(A) at least one of $R^1$ to $R^7$ is an electron-withdrawing group, and (B) each of $R^1$, $R^3$, $R^4$ and $R^6$, which may be the same as or different from one another, is hydrogen, a halogen, a substituted or unsubstituted alkyl group, a substituted or unsubstituted cycloalkyl group, a substituted or unsubstituted alkoxy group, a substituted or unsubstituted aryl ether group, a substituted or unsubstituted heterocyclic group, a substituted or unsubstituted alkylthio group, a substituted or unsubstituted aryl thioether group, a substituted or unsubstituted amino group, a substituted or unsubstituted silyl group, or a cyano group, X is C—$R^7$, and $R^7$ is either a substituted or unsubstituted aryl group or a substituted or unsubstituted heteroaryl group.

In all of the groups above, hydrogen may be deuterium. The same applies to the compounds described below or a partial structure thereof.

In the following description, for example, a substituted or unsubstituted aryl group having a carbon number of 6 to 40 means that the number of carbons is from 6 to 40 including the number of carbons contained in a substituent substituted on the aryl group, and the same applies to other substituents of which carbon number is specified.

In all of the groups above, when the group is substituted, the substituent is preferably an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an aldehyde group, a carbonyl group, a carboxyl group, an oxycarbonyl group, a carbamoyl group, an amino group, a nitro group, a silyl group, a siloxanyl group, a boryl group or a phosphine oxide group, more preferably a substituent that is specifically recited as a preferable substituent in the description of each substituent. These substituents may be further substituted with the above-described substituent.

The term "unsubstituted" in the "substituted or unsubstituted" means that a hydrogen atom or a deuterium atom is substituted.

The same applies to the "substituted or unsubstituted" in the compounds described below or a partial structure thereof.

The alkyl group indicates, for example, a saturated aliphatic hydrocarbon group such as methyl group, ethyl group, n-propyl group, isopropyl group, n-butyl group, sec-butyl group and tert-butyl group, which may or may not have a substituent. The additional substituent in the case of being substituted is not particularly limited and includes, for example, an alkyl group, a halogen, an aryl group and a heteroaryl group, and this is a common feature in the following description. The carbon number of the alkyl group is not particularly limited but in view of easy availability and cost, is preferably from 1 to 20, more preferably from 1 to 8.

The cycloalkyl group indicates, for example, a saturated alicyclic hydrocarbon group such as cyclopropyl group, cyclohexyl group, norbornyl group and adamantyl group, which may or may not have a substituent. The carbon number of the alkyl group moiety is not particularly limited but is preferably from 3 to 20.

The heterocyclic group indicates, for example, an aliphatic ring having an atom other than carbon in the ring, such as pyrane ring, piperidine ring and cyclic amide, which may or may not have a substituent. The carbon number of the heterocyclic group is not particularly limited but is preferably from 2 to 20.

The alkenyl group indicates, for example, an unsaturated aliphatic hydrocarbon group containing a double bond, such as vinyl group, allyl group and butadienyl group, which may or may not have a substituent. The carbon number of the alkenyl group is not particularly limited but is preferably from 2 to 20.

The cycloalkenyl group indicates, for example, an unsaturated alicyclic hydrocarbon group containing a double bond, such as cyclopentenyl group, cyclopentadienyl group and cyclohexenyl group, which may or may not have a substituent.

The alkynyl group indicates, for example, an unsaturated aliphatic hydrocarbon group containing a triple bond, such as ethynyl group, which may or may not have a substituent. The carbon number of the alkenyl group is not particularly limited but is preferably from 2 to 20.

The alkoxy group indicates, for example, a functional group to which an aliphatic hydrocarbon group is bonded through an ether bond, such as methoxy group, ethoxy group and propoxy group, and the aliphatic hydrocarbon group may or may not have a substituent. The carbon number of the alkoxy group is not particularly limited but is preferably from 1 to 20.

The alkylthio group is a group formed by substituting an oxygen atom of an ether bond of an alkoxy group with a sulfur atom. The hydrocarbon group of the alkylthio group may or may not have a substituent. The carbon number of the alkylthio group is not particularly limited but is preferably from 1 to 20.

The aryl ether group indicates, for example, a functional group to which an aromatic hydrocarbon group is bonded through an ether bond, such as phenoxy group, and the aromatic hydrocarbon group may or may not have a substituent. The carbon number of the aryl ether group is not particularly limited but is preferably from 6 to 40.

The aryl thioether group is a group formed by substituting an oxygen atom of an ether bond of an aryl ether group with a sulfur atom. The aromatic hydrocarbon group in the aryl thioether group may or may not have a substituent. The carbon number of the aryl thioether group is not particularly limited but is preferably from 6 to 40.

The aryl group indicates, for example, an aromatic hydrocarbon group such as phenyl group, biphenyl group, terphenyl group, naphthyl group, fluorenyl group, benzofluorenyl group, dibenzofluorenyl group, phenanthryl group, anthracenyl group, benzophenanthryl group, benzoanthracenyl group, chrysenyl group, pyrenyl group, fluoranthenyl group, triphenylenyl group, benzofluoranthenyl group, dibenzoanthracenyl group, perylenyl group and helicenyl group.

Among these, a phenyl group, a biphenyl group, a terphenyl group, a naphthyl group, a fluorenyl group, a phenanthryl group, an anthracenyl group, a pyrenyl group, a fluoranthenyl group, and triphenylenyl group are preferred. The aryl group may or may not have a substituent. The carbon number of the aryl group is not particularly limited but is preferably from 6 to 40, more preferably from 6 to 30.

In the case where $R^1$ to $R^9$ are a substituted or unsubstituted aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, still more preferably a phenyl group, a biphenyl group, or a terphenyl group, yet still more preferably a phenyl group.

In the case where each substituent is further substituted with an aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, still more preferably a phenyl group.

The heteroaryl group indicates, for example, a cyclic aromatic group having one or a plurality of atoms other than carbon in the ring, such as pyridyl group, furanyl group, thiophenyl group, quinolinyl group, isoquinolinyl group, pyrazinyl group, pyrimidyl group, pyridazinyl group, triazinyl group, naphthylidinyl group, cinnolinyl group, phthaladinyl group, quinoxalinyl group, quinazolinyl group, benzofuranyl group, benzothiophenyl group, indolyl group, dibenzofuranyl group, dibenzothiophenyl group, carbazolyl group, benzocarbazolyl group, carbolinyl group, indolocarbazolyl group, benzofurocarbazolyl group, benzothienocarbazolyl group, dihydroindenocarbazolyl group, benzoquinolinyl group, acridinyl group, dibenzoacridinyl group, benzimidazolyl group, imidazopyridyl group, benzoxazolyl group, benzothiazolyl group and phenanthrolinyl group. Here, the naphthylidinyl group indicates any of 1,5-naphthylidinyl group, 1,6-naphthylidinyl group, 1,7-naphthylidinyl group, 1,8-naphthylidinyl group, 2,6-naphthylidinyl group, and 2,7-naphthylidinyl group. The heteroaryl group may or may not have a substituent. The carbon number of the heteroaryl group is not particularly limited but is preferably from 2 to 40, more preferably from 2 to 30.

In the case where $R^1$ to $R^9$ are a substituted or unsubstituted heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, still more preferably a pyridyl group.

In the case where each substituent is further substituted with a heteroaryl group, the heteroaryl group is preferably a pyridyl group, a furanyl group, a thiophenyl group, a quinolinyl group, a pyrimidyl group, a triazinyl group, a benzofuranyl group, a benzothiophenyl group, an indolyl group, a dibenzofuranyl group, a dibenzothiophenyl group, a carbazolyl group, a benzimidazolyl group, an imidazopyridyl group, a benzoxazolyl group, a benzothiazolyl group, or a phenanthrolinyl group, more preferably a pyridyl group, a furanyl group, a thiophenyl group, or a quinolinyl group, still more preferably a pyridyl group.

A halogen indicates an atom selected from fluorine, chlorine, bromine and iodine.

Each of the carbonyl group, carboxyl group, oxycarbonyl group and carbamoyl group may or may not have a substituent. The substituent includes, for example, an alkyl group, a cycloalkyl group, an aryl group, and a heteroaryl group, and these may be further substituted.

The ester group indicates, for example, a functional group to which a substituent is bonded through an ester bond, such as alkyl group, cycloalkyl group, aryl group and heteroaryl group, and the substituent may be further substituted. The carbon number of the ester group is not particularly limited but is preferably from 1 to 20. More specifically, the ester group includes a methyl ester group, an ethyl ester group, a propyl ester group, a butyl ester group, an isopropyl ester group, a hexyl ester group, a phenyl ester group, etc.

The amide group indicates a functional group to which a substituent is bonded though an amide bond, such as alkyl group, cycloalkyl group, aryl group and heteroaryl group, and the substituent may be further substituted. The carbon number of the amide group is not particularly limited but is preferably from 1 to 20. More specifically, the amide group includes a methylamide group, an ethylamide group, a propylamide group, a butylamide group, an isopropylamide group, a hexylamide group, a phenylamide group, etc.

The amino group is a substituted or unsubstituted amino group. The substituent in the case of being substituted includes, for example, an aryl group, a heteroaryl group, a linear alkyl group, and a branched alkyl group. For the aryl group and heteroaryl group, a phenyl group, a naphthyl group, a pyridyl group, and a quinolinyl group are preferred. These substituents may be further substituted. The carbon number is not particularly limited but is preferably from 2 to 50, more preferably from 6 to 40, still more preferably from 6 to 30.

The silyl group indicates, for example, an alkylsilyl group such as trimethylsilyl group, triethylsilyl group, tert-butyldimethylsilyl group, propyldimethylsilyl group and vinyldimethylsilyl group, or an arylsilyl group such as phenyldimethylsilyl group, tert-butyldiphenylsilyl group, triphenylsilyl group and trinaphthylsilyl group. The substituent on silicon may be further substituted. The carbon number of the silyl group is not particularly limited but is preferably from 1 to 30.

The siloxanyl group indicates a silicon compound group via an ether bond, such as trimethylsiloxanyl group. The substituent on silicon may be further substituted.

The boryl group is a substituted or unsubstituted boryl group. The substituent in the case of being substituted includes, for example, an aryl group, a heteroaryl group, a linear alkyl group, a branched alkyl group, an aryl ether group, an alkoxy group, and a hydroxyl group, and among these, an aryl group and an aryl ether group are preferred.

The phosphine oxide group is a group represented by —P(═O)$R^{10}R^{11}$. $R^{10}$ and $R^{11}$ are selected from the same group as those for $R^1$ to $R^9$.

The acyl group indicates a functional group to which a substituent is bonded through a carbonyl bond, such as alkyl group, cycloalkyl group, aryl group and heteroaryl group, and the substituent may be further substituted. The carbon number of the acyl group is not particularly limited but is preferably from 1 to 20. More specifically, the acyl group includes an acetyl group, a propionyl group, a benzoyl group, an acrylyl group, etc.

The sulfonyl group indicates a functional group to which a substituent is bonded through a —S(═O)$_2$— bond, such as alkyl group, cycloalkyl group, aryl group and heteroaryl group, and the substituent may be further substituted.

The arylene group indicates a divalent or higher valent group derived from an aromatic hydrocarbon group, such as benzene, naphthalene, biphenyl, fluorene and phenanthrene, and the group may or may not have a substituent. A divalent or trivalent arylene group is preferred. The arylene group specifically includes a phenylene group, a biphenylene group, and a naphthylene group.

The heteroarylene group indicates a divalent or higher valent group derived from an aromatic group having one or a plurality of atoms other than carbon in the ring, such as pyridine, quinoline, pyrimidine, pyrazine, triazine, quinoxaline, quinazoline, dibenzofuran and dibenzothiophene, and the group may or may not have a substituent. A divalent or trivalent heteroarylene group is preferred. The carbon number of the heteroarylene group is not particularly limited but is preferably from 2 to 30. The heteroarylene group is specifically a 2,6-pyridylene group, a 2,5-pyridylene group, a 2,4-pyridylene group, a 3,5-pyridylene group, a 3,6-pyridylene group, a 2,4,6-pyridylene group, a 2,4-pyrimidinylene group, a 2,5-pyrimidinylene group, a 4,6-pyrimidinylene group, a 2,4,6-pyrimidinylene group, a 2,4,6-triazinylene group, a 4,6-dibenzofuranylene group, a 2,6-dibenzofuranylene group, a 2,8-dibenzofuranylene group, or a 3,7-dibenzofuranylene group.

The electron-withdrawing group, otherwise called an electron-accepting group, is in the organic electron theory an atomic group that draws electrons by an induction effect or a resonance effect from an atomic group on which the group is substituted. The electron-withdrawing group includes a group in which the value of a substituent constant (σp (para)) of Hammett rule is positive. The substituent constant (σp (para)) of Hammett rule can be quoted from KAGAKU BINRAN (Chemical Handbook), Basic Edition, 5th rev. (page II-380).

A phenyl group takes a positive value in some examples, but the phenyl group is not encompassed by the electron-withdrawing group of the present application.

Examples of the electron-withdrawing group include —F (σp: +0.06), —Cl (σp: +0.23), —Br (σp: +0.23), —I (σp: +0.18), —$CO_2R^{12}$ (σp: +0.45 when $R^{12}$ is an ethyl group), —$CONH_2$ (σp: +0.38), —$COR^{12}$ (σp: +0.49 when $R^{12}$ is a methyl group), —$CF_3$ (σp: +0.50), —$SO_2R^{12}$ (σp: +0.69 when $R^{12}$ is a methyl group), and —$NO_2$ (σp: +0.81). Each $R^{12}$ is independently represents a hydrogen atom, a substituted or unsubstituted aromatic hydrocarbon group having a ring-forming carbon number of 6 to 30, a substituted or unsubstituted heterocyclic group having a ring-forming carbon number of 5 to 30, a substituted or unsubstituted alkyl group having a carbon number of 1 to 30, or a substituted or unsubstituted cycloalkyl group having a carbon number of 1 to 30. Specific examples of each of these groups include the same examples as above.

The electron-withdrawing group is preferably fluorine, a fluorine-containing aryl group, a fluorine-containing heteroaryl group, a fluorine-containing alkyl group, a substituted or unsubstituted acyl group, a substituted or unsubstituted ester group, a substituted or unsubstituted amide group, a substituted or unsubstituted sulfonyl group, or a cyano group, because such a group is less likely to be chemically decomposed.

The electron-withdrawing group is more preferably a fluorine-containing alkyl group, a substituted or unsubstituted acyl group, a substituted or unsubstituted ester group, or a cyano group, because concentration quenching is prevented and this leads to an effect of enhancing the emission quantum yield. Among others, a substituted or unsubstituted ester group is preferred.

Preferable examples of $R^{12}$ include a substituted or unsubstituted aromatic hydrocarbon group having a ring-forming carbon number of 6 to 30, a substituted or unsubstituted alkyl group having a carbon number of 1 to 30, and a substituted or unsubstituted cycloalkyl group having a carbon number of 1 to 30. A more preferable substituent is, in view of solubility, a substituted or unsubstituted alkyl group having a carbon number of 1 to 30. Specifically, examples thereof include a methyl group, an ethyl group, a propyl group, a butyl group, a hexyl group, an isopropyl group, an isobutyl group, a sec-butyl group, and a tert-butyl group. In view of ease of synthesis and easy availability of raw material, an ethyl group is preferably used.

The compound represented by formula (1) has a pyrromethene-boron complex skeleton. The pyrromethene-boron complex skeleton is a strong skeleton with high planarity and thus a high fluorescence quantum yield is exhibited, and the peak half-value width of the emission spectrum is small, thus efficient color conversion and high color purity can be achieved.

The compound represented by formula (1) satisfies at least either one of the above-described (A) and (B). In the following, the present invention is described by taking the case of satisfying (A) as embodiment 1A and taking the case of satisfying (B) as embodiment 1B.

Embodiment 1A

In embodiment 1A, the compound represented by formula (1) necessarily has an electron-withdrawing group in the pyrromethene-boron complex skeleton. In the color conversion composition of the present embodiment, the pyrromethene-boron complex contained is excited by excitation light and emits light with a wavelength different from that of excitation light to thereby perform color conversion of the light. Introduction of an electron-withdrawing group into the pyrromethene-boron complex skeleton makes it possible to decrease the electron density of the pyrromethene-boron complex skeleton. Consequently, the stability of the compound represented by formula (1) against oxygen is enhanced, and the durability can be improved.

The compound represented by formula (1) in embodiment 1A specifically includes embodiment 1A-1 where at least one of $R^1$ to $R^6$ is an electron-withdrawing group, embodiment 1A-2 where X is C—$R^7$ and $R^7$ is an electron-withdrawing group, and embodiment 1A-3 where the compound is a compound represented by formula (3).

[Chem. 4]

(3)

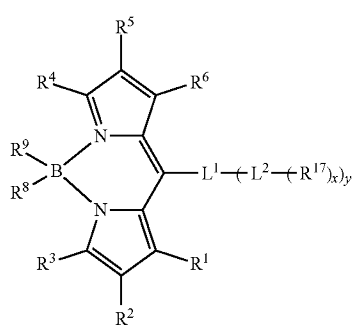

In the formula, each of $R^1$ to $R^6$, which may be the same as or different from one another, is selected from hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, an aldehyde group, a substituted or unsubstituted carbonyl group, a carboxyl group, a substituted or unsubstituted oxycarbonyl group, a substituted or unsubstituted carbamoyl group, a substituted or unsubstituted ester group, a substituted or unsubstituted sulfonyl group, a substituted or unsubstituted amide group, a substituted or unsubstituted amino group, a nitro group, a substituted or unsubstituted silyl group, a substituted or unsubstituted siloxanyl group, a substituted or unsubstituted boryl group, and a substituted or unsubstituted phosphine oxide group, each of $R^8$ and $R^9$ is selected from a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, and a halogen, $L^1$ and $L^2$ are a single bond, a substituted or unsubstituted arylene group, or a substituted or unsubstituted heteroarylene group, and x and y are an integer of 1 to 5, provided that $R^{17}$ is an electron-withdrawing group and at least one of $R^1$ to $R^6$ is an electron-withdrawing group.

Embodiment 1A-1

In embodiment 1A-1, an electron-withdrawing group is substituted directly on the pyrromethene-boron complex skeleton, so that the electron density of the pyrromethene-boron complex skeleton can be greatly decreased. Consequently, the stability against oxygen is enhanced, and the durability can be greatly improved.

In embodiment 1A-1, it is preferred that X is C—$R^7$ and $R^7$ is a substituted or unsubstituted aryl group or a substituted or unsubstituted heteroaryl group. In this case, the durability can be more improved.

In embodiment 1A-1, in order to further enhance the light stability, it is preferable to appropriately suppress twisting between $R^7$ and carbon-carbon bond of the pyrromethene skeleton. If excessive twisting occurs, the light stability decreases due to, e.g., an increase in the reactivity for excitation light. From such a viewpoint, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, still more preferably a substituted or unsubstituted phenyl group.

In addition, $R^7$ is preferably an appropriately bulky substituent. When $R^7$ has a certain degree of bulkiness, aggregation of molecules can be prevented, and the luminous efficiency or durability is more improved.

Further preferable examples of the bulky substituent include a structure represented by the following formula (2):

[Chem. 5]

(2)

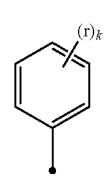

in the formula, r is selected from the group consisting of hydrogen, an alkyl group, a cycloalkyl group, a heterocyclic group, an alkenyl group, a cycloalkenyl group, an alkynyl group, a hydroxyl group, a thiol group, an alkoxy group, an alkylthio group, an aryl ether group, an aryl thioether group, an aryl group, a heteroaryl group, a halogen, a cyano group, an acyl group, an ester group, an amide group, a sulfonyl group, a silyl group, a boryl group, a phosphine oxide group, and an amino group, k is an integer of 1 to 3, and when k is 2 or more, r may be the same as or different from one another.

r is preferably a substituted or unsubstituted aryl group or a substituted or unsubstituted heteroaryl group. When r is a substituted or unsubstituted aryl group or a substituted or unsubstituted heteroaryl group, concentration quenching due to aggregation can be prevented, and a high fluorescence quantum yield is obtained.

From the viewpoint that a higher fluorescence quantum yield is provided, r is preferably a substituted or unsubstituted aryl group. Among aryl groups, preferable examples include a phenyl group and a naphthyl group. In the case where r is an aryl group, k in formula (2) is preferably 1 or 2, and in view of higher effect of preventing aggregation of molecules, k is more preferably 2. Furthermore, at least one r is preferably substituted with an alkyl group. In this case, in view of thermal stability, particularly preferable examples of the alkyl group include a methyl group, an ethyl group, and a tert-butyl group.

In addition, from the viewpoint of controlling the fluorescence wavelength or absorption wavelength, increasing the compatibility with a solvent or enhancing the luminous efficiency, r is preferably a substituted or unsubstituted alkyl group or a substituted or unsubstituted alkoxy group, more preferably a methyl group, an ethyl group, a tert-butyl group or a methoxy group. From the viewpoint of dispersibility, a tert-butyl group or a methoxy group is particularly preferred, and this prevents quenching due to aggregation of molecules to each other.

Embodiment 1A-2

In embodiment 1A-2, further at least one of $R^1$ to $R^6$ is preferably an electron-withdrawing group. The electron density of the pyrromethene-boron complex skeleton can thereby be decreased. In turn, the stability against oxygen is more enhanced, and the durability can be more improved.

Embodiment 1A-3

In embodiment 1A-3, an electron-withdrawing group is introduced not only into $R^1$ to $R^6$ but also into $R^{17}$, and the electron density of the pyrromethene-boron complex skeleton can thereby be further decreased. In turn, the stability against oxygen is greatly enhanced, and the durability can be more improved.

$L^1$ is preferably a substituted or unsubstituted arylene group in view of light stability.

When $L^1$ is a substituted or unsubstituted arylene group, the substituent $L^1$ greatly affects the durability of the compound represented by formula (3), i.e., the reduction in the light emission intensity over time. $L^1$ is a rigid group having a small degree of freedom of movement and causing less aggregation, and the durability is therefore improved.

From the viewpoint of providing a higher fluorescence quantum yield and causing less thermal decomposition and in view of light stability, $L^1$ is preferably a substituted or unsubstituted phenylene group. As the arylene group, for the reason that the emission wavelength is not impaired, a phenylene group, a biphenylene group, and a naphthylene group are preferred.

When $L^2$ is a substituted or unsubstituted arylene group, the conjugation expands and the stability against light is therefore more enhanced. As a result, the durability of the pyrromethene-boron complex represented by formula (3) of the present invention can be improved.

From the viewpoint of providing a higher fluorescence quantum yield and causing less thermal decomposition and in view of light stability, $L^2$ is preferably a substituted or unsubstituted phenylene group. Furthermore, when $L^2$ is a substituted or unsubstituted phenylene group, aggregation of molecules can be prevented, and the luminous efficiency or durability is more improved.

When $L^2$ is a single bond, $R^{17}$ can appropriately decrease the electron density of the pyrromethene-boron complex. In turn, the stability against oxygen is enhanced, and the durability can be improved.

In formula (3), it is preferred that x=1 and y=1. That is, it is preferable to contain one $R^{17}$ in formula (3). When one $R^{17}$ having an electron-withdrawing property is contained, the electron density of the pyrromethene-boron complex represented by formula (3) decreases appropriately. As a result, the durability can be improved while maintaining a high fluorescence quantum yield.

In formula (3), it is also preferred that x+y=3. That is, it is also preferable to contain two $R^{17}$ in formula (3). When two $R^{17}$ having an electron-withdrawing property are contained, the electron density of the pyrromethene-boron complex represented by formula (3) decreases greatly. As a result, the durability can be further improved.

Furthermore, in formula (3), it is also preferred that x=1 and y=2. That is, it is also preferable to contain two $L^2$-$R^{17}$ in formula (3). When not only two $R^{17}$ having an electron-withdrawing property are contained but also two $L^2$ are contained, the substituent as a whole becomes bulky, making it possible to prevent aggregation of molecules, and the durability can be further improved while maintaining a high fluorescence quantum yield.

In formula (3), x and y are preferably 1 or 2. However, when $R^{17}$ is fluorine, x and y are preferably 1 to 5. When x and y are 1 to 3, the number of $R^{17}$ can be limited and since reduction in the fluorescence quantum yield due to molecular vibration of the atomic group of $R^7$ can be suppressed, a high fluorescence quantum yield is exhibited. However, when $R^{17}$ is fluorine, since the number of atoms of fluorine is 1, reduction in the fluorescence quantum yield due to molecular vibration scarcely occurs in the first place, and the durability improving effect is greater. For this reason, when $R^{17}$ is fluorine, x and y are preferably 1 to 5.

One particularly preferable example of the compound represented by formula (3) is a compound where all of $R^1$, $R^3$, $R^4$ and $R^6$, which may be the same as or different from one another, are a substituted or unsubstituted alkyl group, $L^1$ is a substituted or unsubstituted arylene group, $L^2$ is a single bond or a substituted or unsubstituted arylene group, and x and y are 1 or 2.

Another particularly preferable example of the compound represented by formula (3) is a compound where all of $R^1$, $R^3$, $R^4$ and $R^6$, which may be the same as or different from one another, are a substituted or unsubstituted alkyl group, $L^1$ is a substituted or unsubstituted arylene group, $L^2$ is a single bond or a substituted or unsubstituted arylene group, x and y are 1 or 2, and $R^{17}$ is a halogen, a cyano group, or a substituted or unsubstituted ester group.

According to the configurations above, the compound represented by formula (1) in embodiment 1A has a pyrromethene-boron complex skeleton and an electron-withdrawing group in the molecule, and all of highly efficient light emission, high color purity and high durability can thereby be achieved.

With the compound represented by formula (1) in embodiment 1A, since a high fluorescence quantum yield is exhibited and the peak half-value width of the emission spectrum is small, efficient color conversion and high color purity can be achieved.

Furthermore, various properties and physical properties such as luminous efficiency, color purity, thermal stability, light stability and dispersibility can be adjusted by introducing an appropriate substituent into an appropriate position of the compound represented by formula (1) in embodiment 1A.

In formula (1) and formula (3) of embodiment 1A, at least one of $R^2$ and $R^5$ is preferably an electron-withdrawing group, because the stability of the compound represented by formula (1) in embodiment 1A against oxygen is more enhanced and the durability can be more improved without impairing the luminous efficiency and color purity.

Furthermore, in formula (1) and formula (3) of embodiment 1A, it is more preferred that $R^2$ and $R^5$ are an electron-withdrawing group, because the stability of the compound represented by formula (1) in embodiment 1A against oxygen is further enhanced and the durability can be greatly improved without impairing the luminous efficiency and color purity.

In formula (1) and formula (3) of embodiment 1A, at least one of $R^1$, $R^3$, $R^4$ and $R^6$ is preferably a substituted or unsubstituted aryl group. In this case, the light stability is more enhanced. The aryl group is preferably a phenyl group, a biphenyl group, a terphenyl group, or a naphthyl group, more preferably a phenyl group or a biphenyl group, particularly preferably a phenyl group.

In formula (1) and formula (3) of embodiment 1A, in the case where at least one of $R^1$, $R^3$, $R^4$ and $R^6$ is a substituted or unsubstituted heteroaryl group, the heteroaryl group is preferably a pyridyl group, a quinolinyl group, or a thiophenyl group, more preferably a pyridyl group or a quinolinyl group, particularly preferably a pyridyl group.

Embodiment 1B

In embodiment 1B, the substituent $R^7$ greatly affects the reduction in the durability of the compound represented by formula (1). More specifically, when $R^7$ is hydrogen, the hydrogen has high reactivity and readily reacts with water or oxygen in the air to cause decomposition. Furthermore, when $R^7$ is, for example, a substituent having a large degree of freedom of movement of the molecular chain, such as alkyl group, the reactivity certainly decreases, but the compounds aggregate to each other over time in the composition, resulting in reduction of the light emission intensity due to concentration quenching. Accordingly, $R^7$ is either a substituted or unsubstituted aryl group or a substituted or unsubstituted heteroaryl group, which are a rigid group having a small degree of freedom of movement and causing less aggregation.

From the viewpoint of providing a higher fluorescence quantum yield and causing less thermal decomposition and in view of stability against excitation light, the substituent is preferably a substituted or unsubstituted aryl group. Among aryl groups, for the reason that the emission wavelength is not impaired, the substituent is preferably a substituted or unsubstituted phenyl group, a substituted or unsubstituted biphenyl group, a substituted or unsubstituted naphthyl group, a substituted or unsubstituted fluorenyl group, a substituted or unsubstituted spirofluorenyl group, a substituted or unsubstituted anthracenyl group, a substituted or unsubstituted pyrenyl group, a substituted or unsubstituted phenanthrenyl group, a substituted or unsubstituted triphenylenyl group, a substituted or unsubstituted chrysenyl group, or a substituted or unsubstituted dibenzochrysenyl group, more preferably a substituted or unsubstituted phenyl group, a substituted or unsubstituted biphenylyl group, a substituted or unsubstituted naphthyl group, a substituted or unsubstituted fluorenyl group, a substituted or unsubstituted spirofluorenyl group, a substituted or unsubstituted anthracenyl group, a substituted or unsubstituted pyrenyl group, or a substituted or unsubstituted phenanthrenyl group.

In order to further enhance the stability against excitation light, it is necessary to appropriately suppress twisting between $R^7$ and carbon-carbon bond of the pyrromethene skeleton. If excessive twisting occurs, the light stability decreases due to, e.g., an increase in the reactivity for excitation light. From such a viewpoint, $R^7$ is preferably a substituted or unsubstituted phenyl group, a substituted or unsubstituted biphenyl group, a substituted or unsubstituted terphenyl group, or a substituted or unsubstituted naphthyl group, more preferably a substituted or unsubstituted phenyl group, a substituted or unsubstituted biphenyl group, or a substituted or unsubstituted terphenyl group, particularly preferably a substituted or unsubstituted phenyl group. In the case of being bonded to a substituted phenyl group, from the viewpoint of lessening steric hindrance and suppressing twisting of the bond, the substituent is preferably bonded at a meta- or para-position relative to the bonding site to the pyrromethene skeleton.

In addition, $R^7$ is preferably an appropriately bulky substituent. When $R^7$ has a certain degree of bulkiness, aggregation of molecules can be prevented, and the luminous efficiency or durability is more improved.

Further preferable examples of the bulky substituent include a structure represented by the following formula (2):

[Chem. 6]

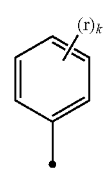

(2)

in the formula, r is selected from the group consisting of hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, a substituted or unsubstituted acyl group, a substituted or unsubstituted ester group, a substituted or unsubstituted amide group, a substituted or unsubstituted sulfonyl group, a substituted or unsubstituted silyl group, a substituted or unsubstituted boryl group, a substituted or unsubstituted phosphine oxide group, and a substituted or unsubstituted amino group, k is an integer of 1 to 3, and when k is 2 or more, r may be the same as or different from one another.

r is preferably a substituted or unsubstituted aryl group or a substituted or unsubstituted heteroaryl group. When r is a substituted or unsubstituted aryl group or a substituted or unsubstituted heteroaryl group, concentration quenching due to aggregation can be prevented, and a high fluorescence quantum yield is obtained.

From the viewpoint that a higher fluorescence quantum yield is provided, r is preferably a substituted or unsubstituted aryl group. Among aryl groups, preferable examples include a phenyl group and a naphthyl group. Furthermore, at least one r is preferably substituted with an alkyl group. In this case, in view of thermal stability, particularly preferable examples of the alkyl group include a methyl group, an ethyl group, and a tert-butyl group.

In addition, from the viewpoint of controlling the fluorescence wavelength or absorption wavelength or increasing the compatibility with a solvent, r is preferably a substituted or unsubstituted alkyl group, a substituted or unsubstituted alkoxy group, or a halogen, more preferably a methyl group, an ethyl group, a tert-butyl group or a methoxy group. In view of dispersibility, a tert-butyl group or a methoxy group is particularly preferred, and in this case, quenching due to aggregation of molecules to each other is prevented.

k in formula (2) is preferably 1 or 2. When k in formula (2) is 1 or 2, aggregation of molecules can be prevented owing to reasonable bulkiness, and the luminous efficiency or durability is more improved. Furthermore, in view of higher effect of preventing aggregation of molecules, k is more preferably 2.

The properties common to the compound represented by formula (1) in all embodiments are described below.

Compared with the case where all of $R^1$, $R^3$, $R^4$ and $R^6$ are hydrogen, when at least one of $R^1$, $R^3$, $R^4$ and R is a substituted or unsubstituted alkyl group, a substituted or unsubstituted aryl group, or a substituted or unsubstituted heteroaryl group, better thermal stability and light stability are exhibited.

It is preferred that at least one of $R^1$, $R^3$, $R^4$ and $R^6$ is a substituted or unsubstituted alkyl group. When at least one of $R^1$, $R^3$, $R^4$ and $R^6$ is a substituted or unsubstituted alkyl group, light emission with excellent color purity is obtained. The alkyl group is preferably an alkyl group having a carbon number of 1 to 6, such as methyl group, ethyl group, n-propyl group, isopropyl group, n-butyl group, sec-butyl group, tert-butyl group, pentyl group and hexyl group, and in addition, because of excellent thermal stability, more preferably a methyl group, an ethyl group, an n-propyl group, an isopropyl group, a n-butyl group, a sec-butyl group, or a tert-butyl group. From the viewpoint of further preventing concentration quenching and enhancing the emission quantum yield, a sterically bulky tert-butyl group is still more preferred. In view of ease of synthesis and easy availability of raw material, a methyl group is also preferably used.

In the case where all of $R^1$, $R^3$, $R^4$ and $R^6$, which may be the same as or different from one another, are a substituted or unsubstituted alkyl group, good solubility in a binder resin or a solvent is advantageously obtained, and thus that is preferred. In view of ease of synthesis and easy availability of raw material, the alkyl group is preferably a methyl group.

In the case where all of $R^1$, $R^3$, $R^4$ and $R^6$, which may be the same as or different from one another, are a substituted or unsubstituted aryl group or a substituted or unsubstituted heteroaryl, better thermal stability and light stability are advantageously exhibited, and thus that is preferred. It is more preferred that all of $R^1$, $R^3$, $R^4$ and $R^6$, which may be the same as or different from one another, are a substituted or unsubstituted aryl group.

Some substituents enhance a plurality of properties, but the substituent exhibiting sufficient performance in all is limited. In particular, it is difficult to achieve both high luminous efficiency and high color purity. Accordingly, a plurality of kinds of substituents are introduced, and a compound that is balanced in terms of light emission characteristics, color purity, etc. can thereby be obtained.

Particularly, in the case where all of $R^1$, $R^3$, $R^4$ and $R^6$, which may be the same as or different from one another, are a substituted or unsubstituted aryl group, a plurality of kinds of substituents are preferably introduced, for example, such that $R^1 \neq R^4$, $R^3 \neq R^6$, $R^1 \neq R^3$ or $R^4 \neq R^6$. Here, ≠ indicates that the groups are groups having different structures. An aryl group affecting the color purity and an aryl group affecting the efficiency can be introduced at the same time, so that a fine-tuning can be made.

Among others, $R^1 \neq R^3$ or $R^4 \neq R^6$ is preferred from the viewpoint of enhancing the luminous efficiency and the color purity in a balanced manner. While one or more aryl groups affecting the color purity are introduced into each of pyrrole rings on both sides, an aryl group affecting the efficiency can be introduced into other sites, so that both properties can be enhanced maximally. In the case where $R^1 \neq R^3$ or $R^4 \neq R^6$, in view of heat resistance and color purity, it is more preferred that $R^1 = R^4$ and $R^3 = R^6$.

The aryl group mainly affecting the color purity is preferably an aryl group substituted with an electron-donating group. The electron-donating group includes an alkyl group, an alkoxy group. In particular, an alkyl group having a carbon number of 1 to 8 or an alkoxy group having a carbon number of 1 to 8 is preferred, and a methyl group, an ethyl group, a tert-butyl group or a methoxy group is more preferred. From the aspect of dispersibility, a tert-butyl group or a methoxy group is particularly preferred, and this prevents quenching due to aggregation of molecules to each other. The substitution position of the substituent is not particularly limited, but since twisting of the bond needs to be suppressed so as to enhance the light stability, the substituent is preferably bonded at a meta- or para-position relative to the bonding site to the pyrromethene skeleton.

The aryl group mainly affecting the efficiency is preferably an aryl group having a bulky substituent such as tert-butyl group, adamantyl group and methoxy group.

In the case where all of $R^1$, $R^3$, $R^4$ and $R^6$, which may be the same as or different from one another, are a substituted or unsubstituted aryl group, each of them is preferably selected from the following Ar-1 to Ar-6. In this case, the combination of $R^1$, $R^3$, $R^4$ and $R^6$ includes, but is not limited to, the combinations shown in Tables 1-1 to 1-11.

[Chem. 7]

Ar-1

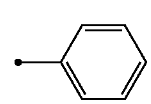

-continued

Ar-2

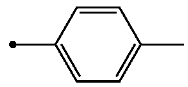

Ar-3

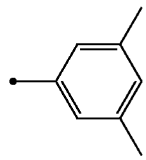

Ar-4

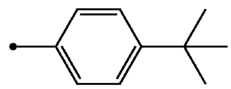

Ar-5

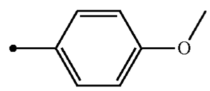

Ar-6

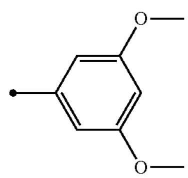

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |

TABLE 1-2-continued

| R1 | R3 | R4 | R6 |
|---|---|---|---|
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
|---|---|---|---|
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
|---|---|---|---|
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
|---|---|---|---|
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |

TABLE 1-5-continued

| R1 | R3 | R4 | R6 |
|---|---|---|---|
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
|---|---|---|---|
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |

TABLE 1-6-continued

| R1 | R3 | R4 | R6 |
|---|---|---|---|
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |

TABLE 1-7-continued

| R1 | R3 | R4 | R6 |
|---|---|---|---|
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
|---|---|---|---|
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |

TABLE 1-8-continued

| R1 | R3 | R4 | R6 |
|---|---|---|---|
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
|---|---|---|---|
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-4 | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |

TABLE 1-9-continued

| R1 | R3 | R4 | R6 |
|---|---|---|---|
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |

TABLE 1-10-continued

| R1 | R3 | R4 | R6 |
|---|---|---|---|
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-1 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

Each of $R^8$ and $R^9$ is preferably an alkyl group, an aryl group, a heteroaryl group, fluorine, a fluorine-containing alkyl group, a fluorine-containing heteroaryl group, or a fluorine-containing aryl group, and for the reason that the compound is stable against excitation light and a higher fluorescence quantum yield is obtained, each substituent is more preferably fluorine or a fluorine-containing aryl group, still more preferably fluorine in view of ease of synthesis.

Here, the fluorine-containing aryl group is an aryl group containing fluorine and includes, for example, a fluorophenyl group, a trifluoromethylphenyl group, and a pentafluorophenyl group. The fluorine-containing heteroaryl group is a heteroaryl group containing fluorine and includes, for example, a fluoropyridyl group, a trifluoromethylpyridyl group, and a trifluoropyridyl group. The fluorine-containing alkyl group is an alkyl group containing fluorine and includes a trifluoromethyl group, a pentafluoroethyl group.

Examples of the compound represented by formula (1) are illustrated below, but the present invention is not limited thereto.

[Chem. 8]

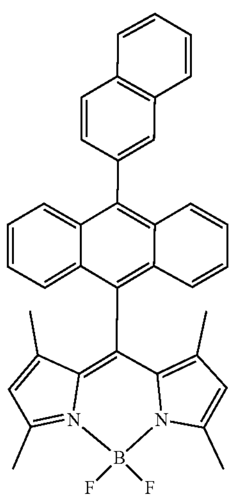

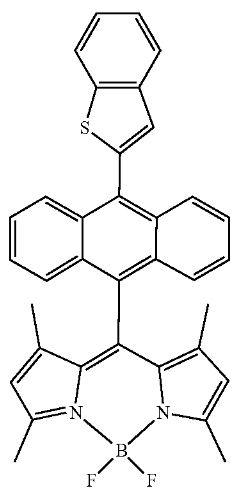

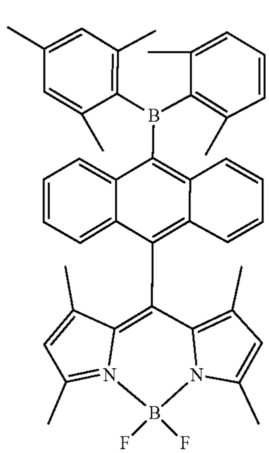

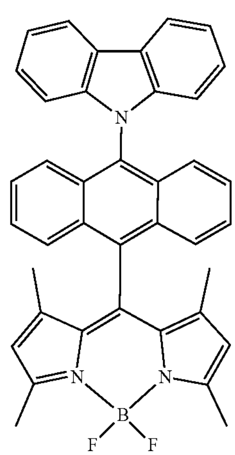

-continued

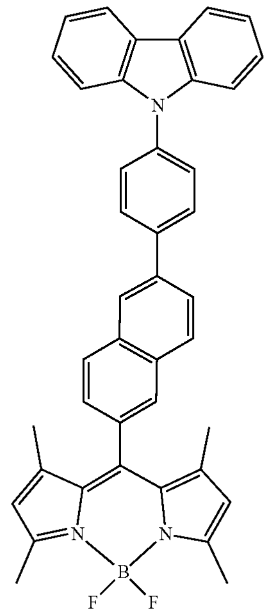

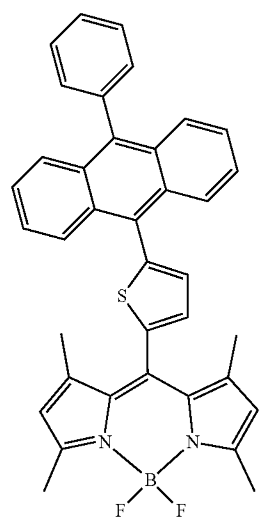

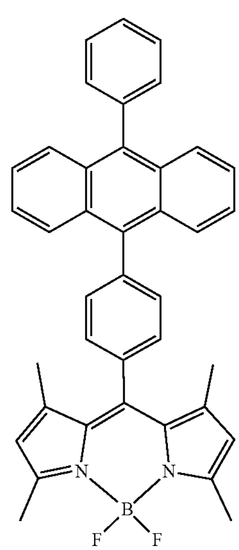

-continued
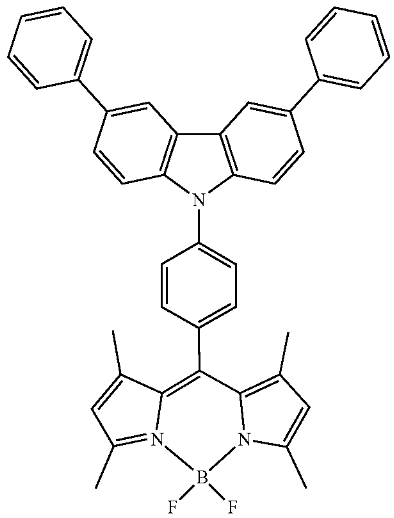
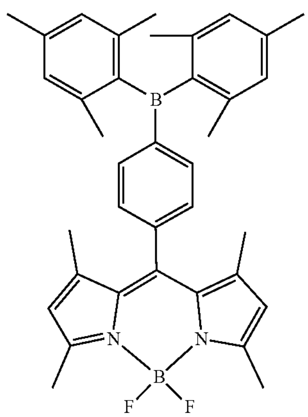
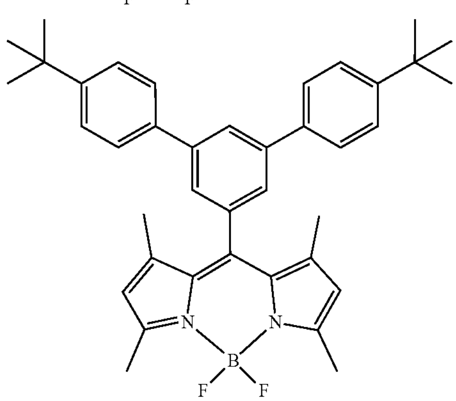
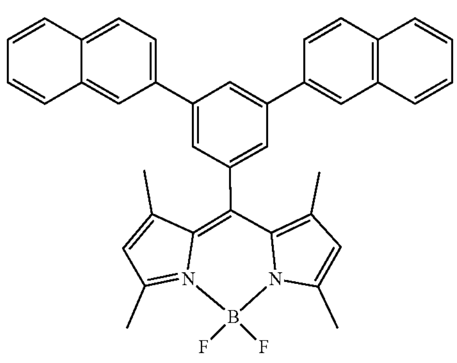
-continued
[Chem. 9]
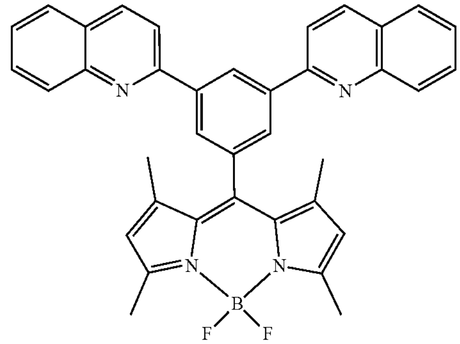
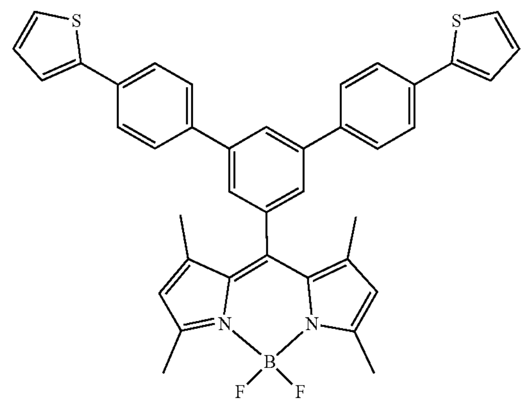
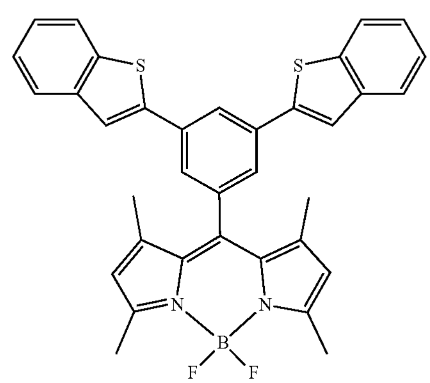
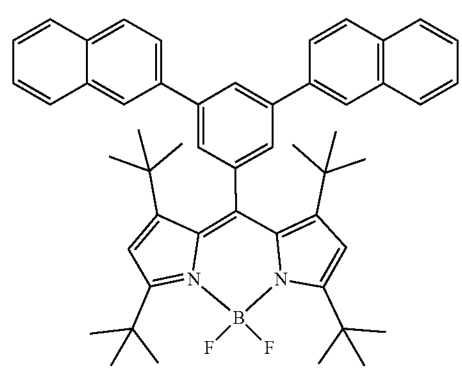

-continued
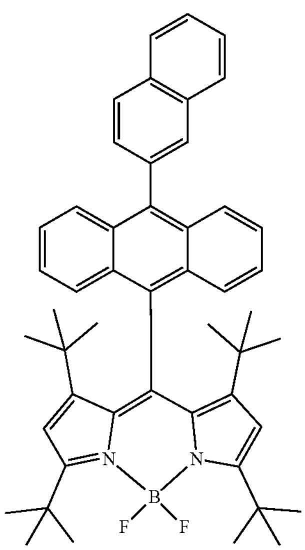
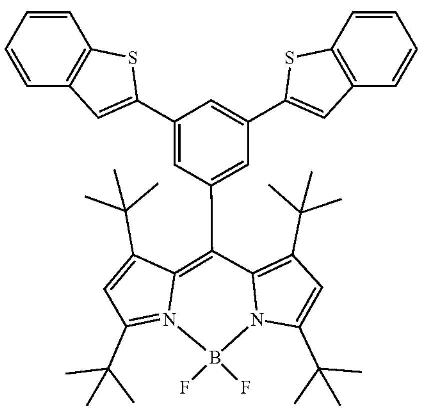
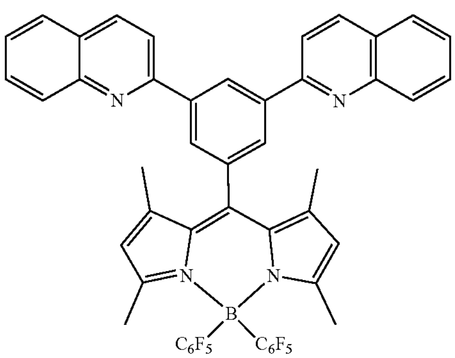
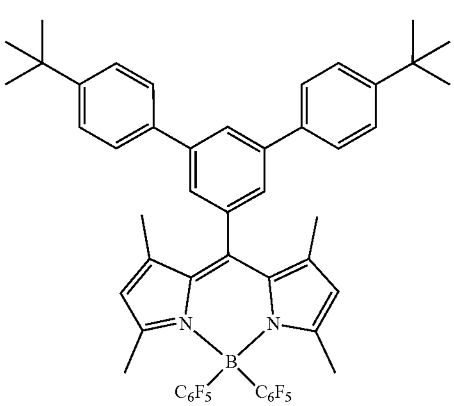
-continued
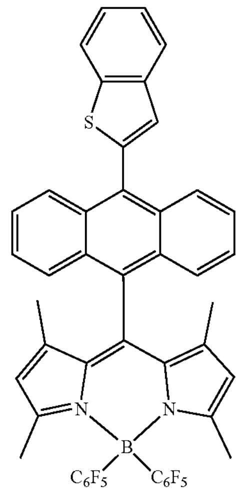
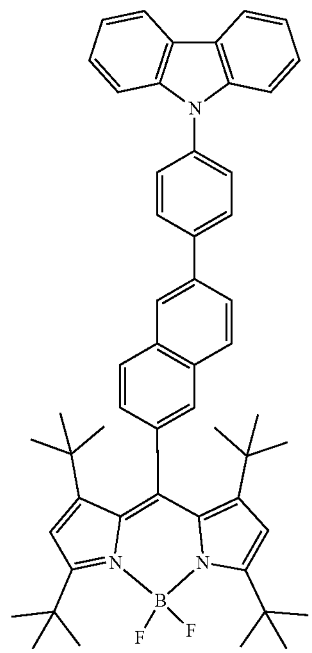
[Chem. 10]
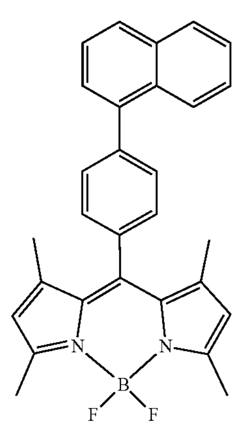
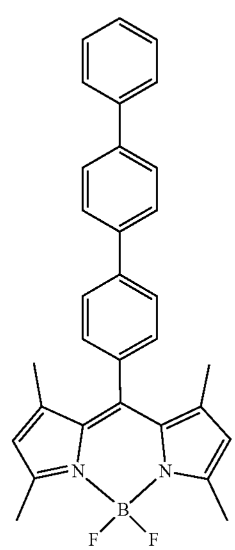

-continued
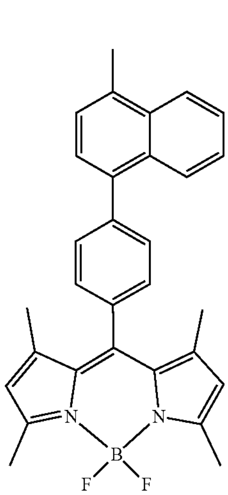
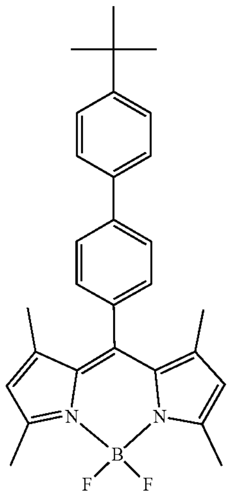
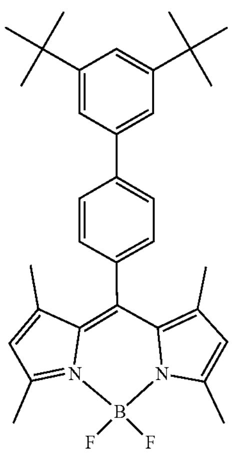
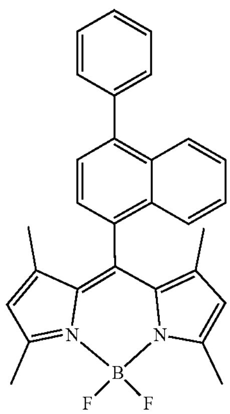
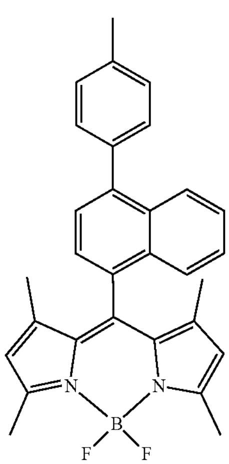
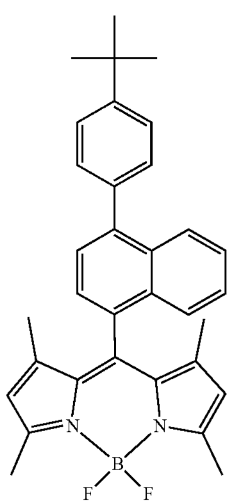
-continued
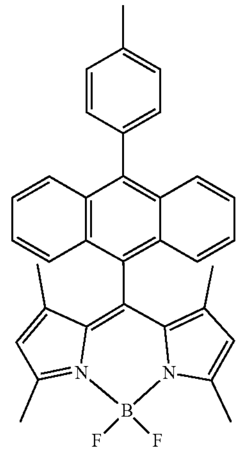
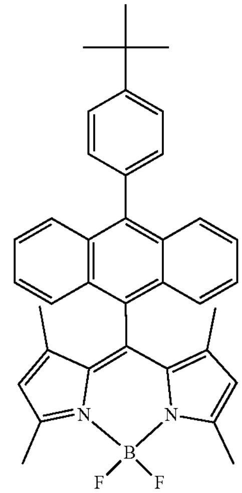
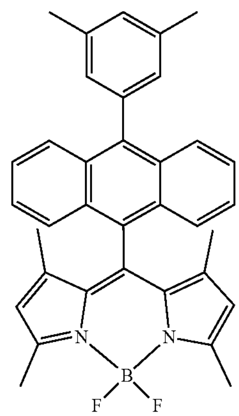
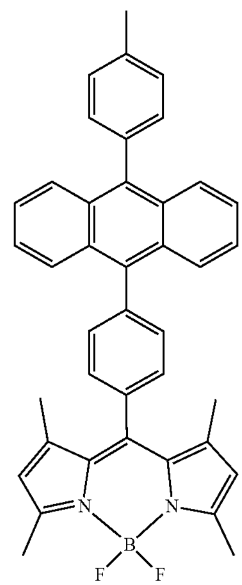
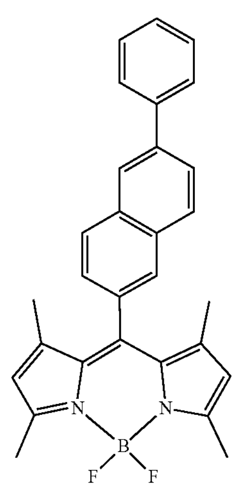
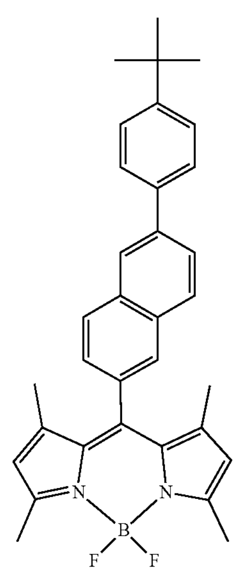

-continued
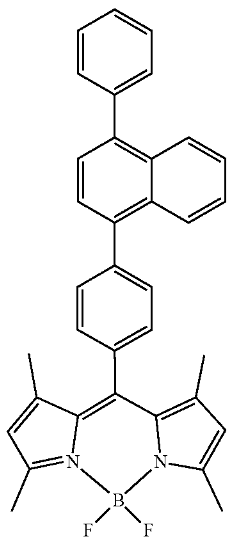
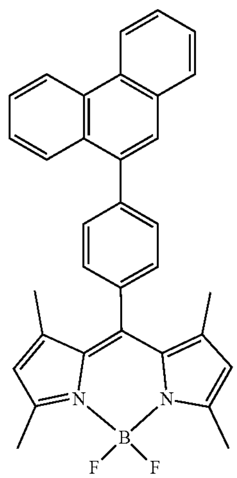
[Chem. 11]
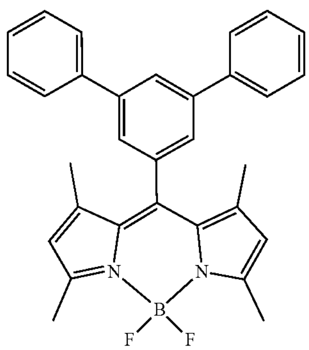
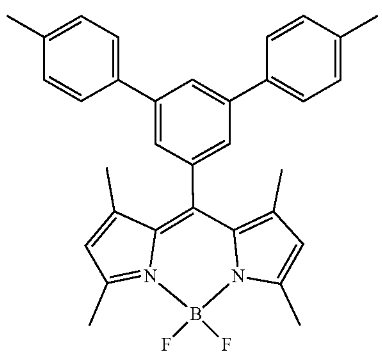
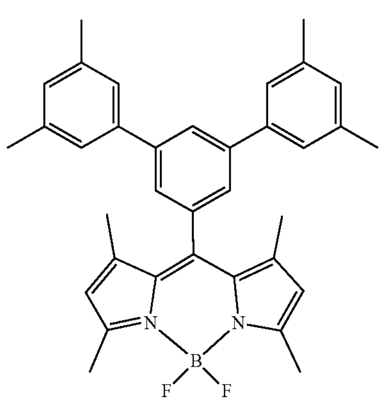
-continued
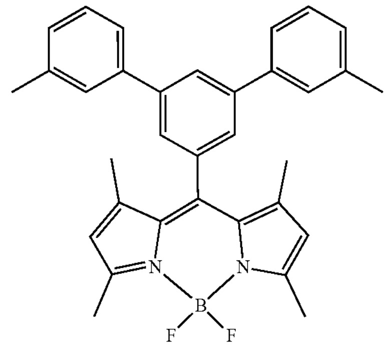
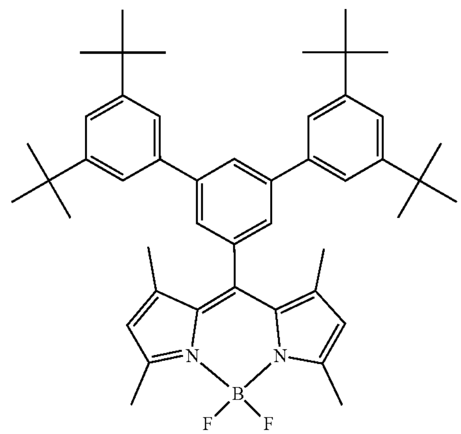
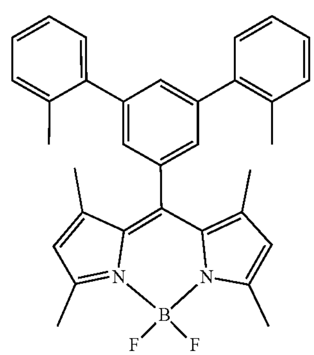
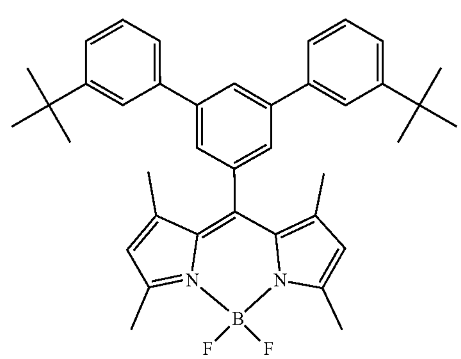

-continued
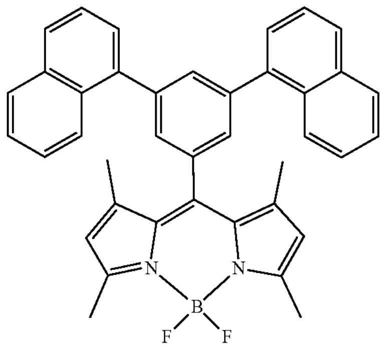
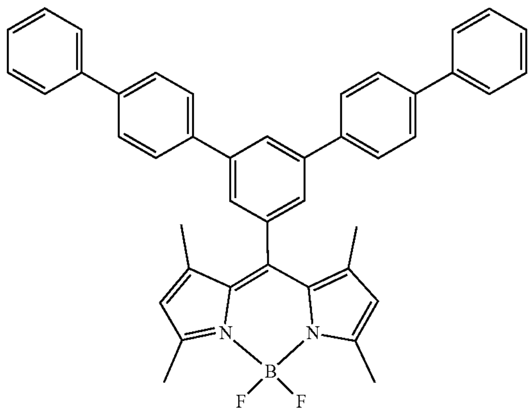
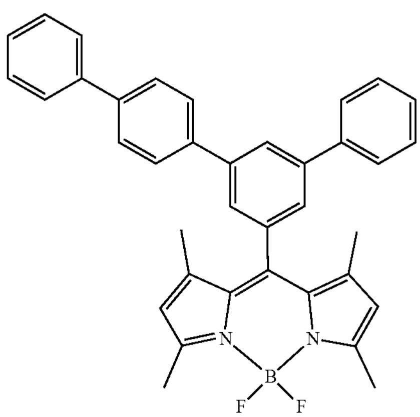
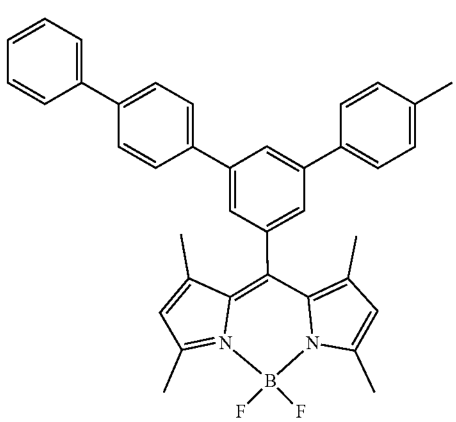
-continued
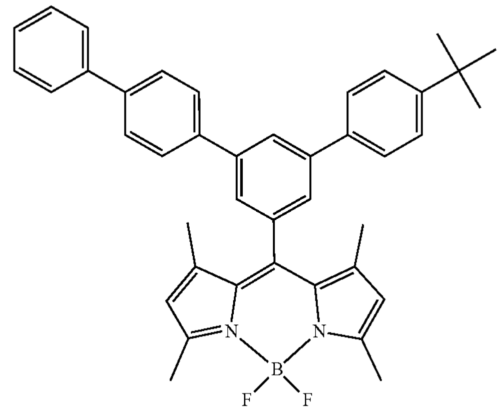
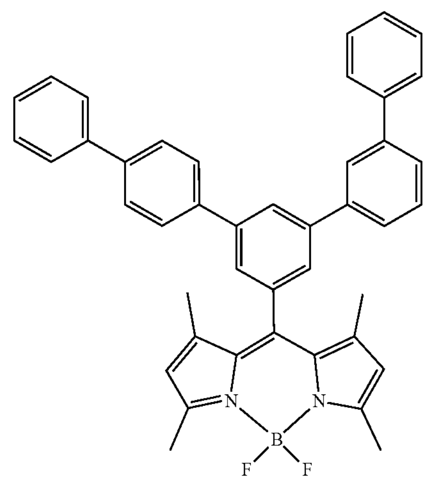
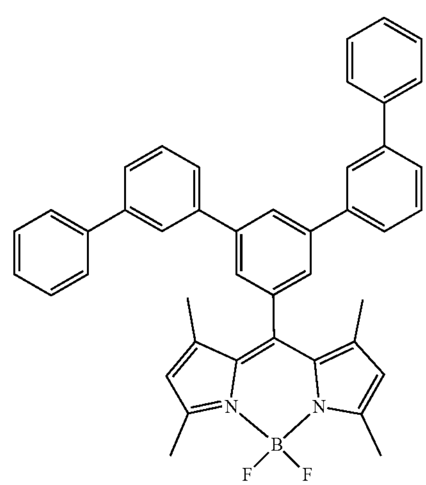

-continued
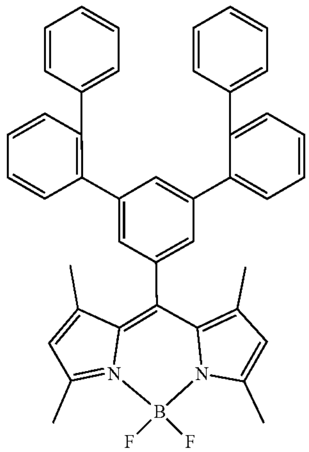
[Chem..12]
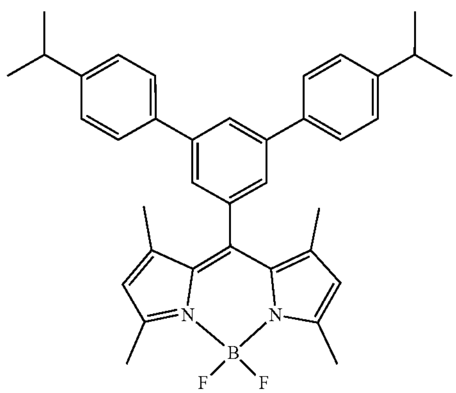
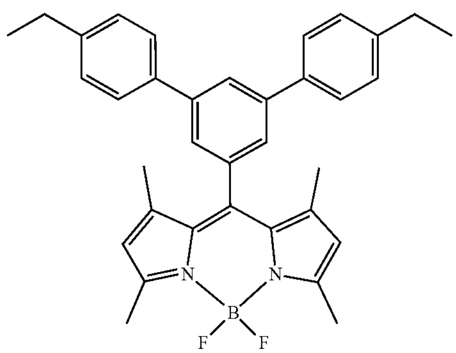
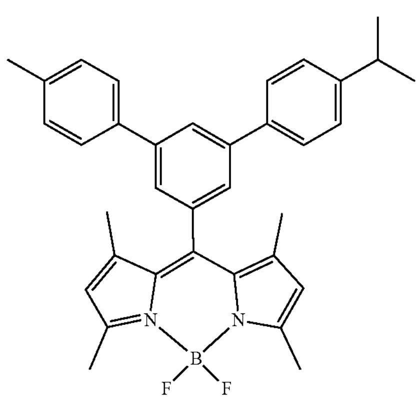
-continued
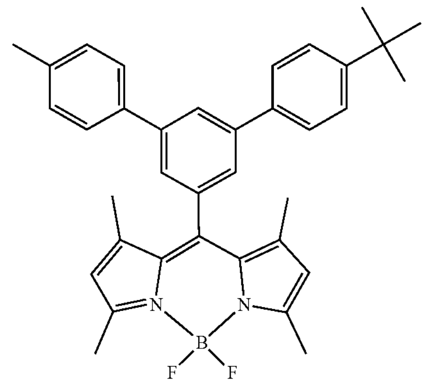
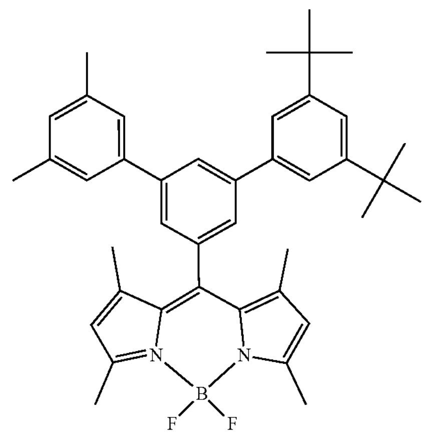
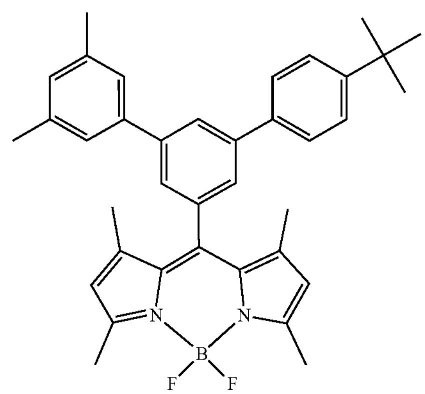
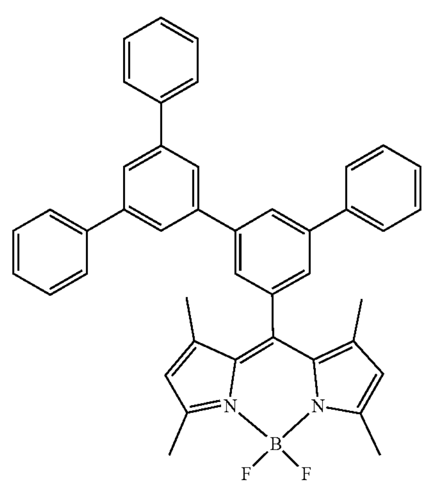

-continued
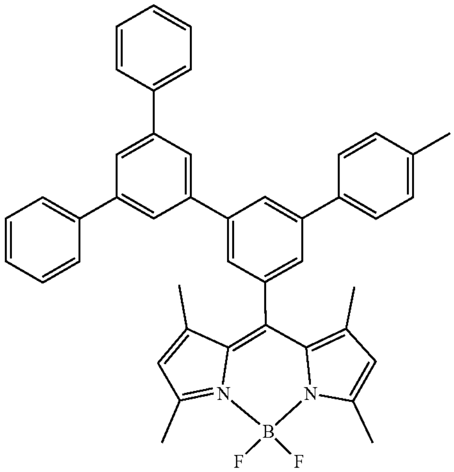
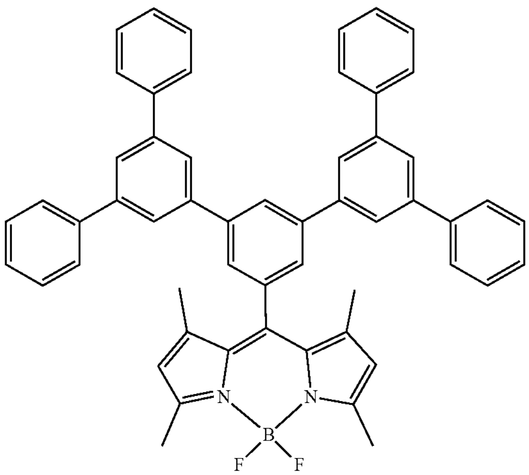
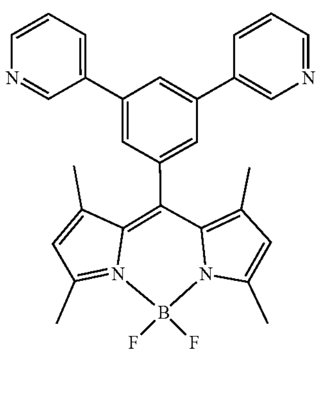
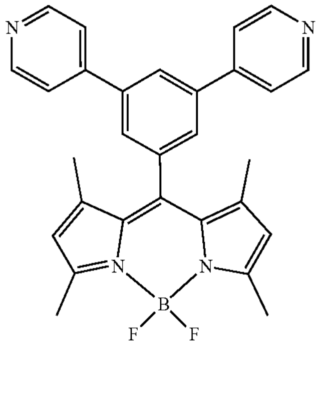
-continued
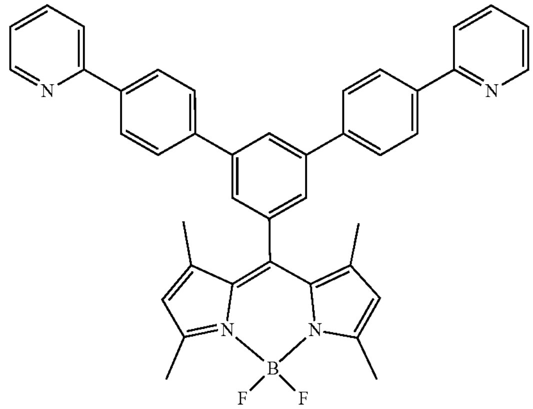
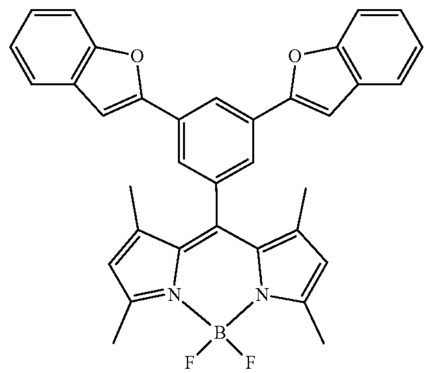
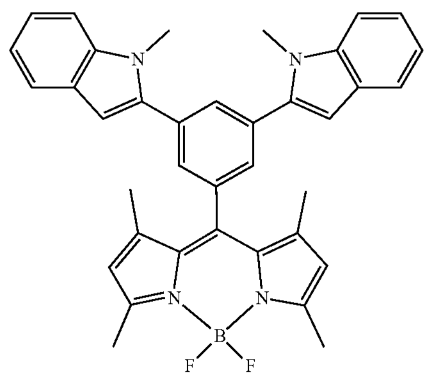
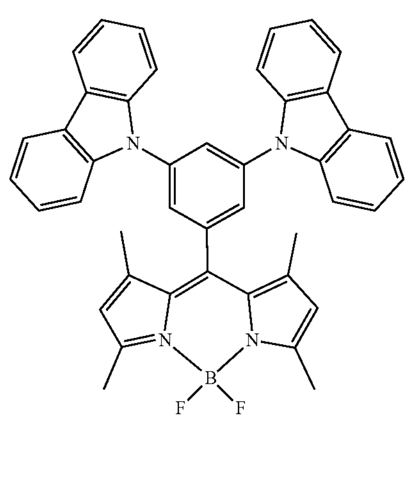

-continued
[Chem. 13]
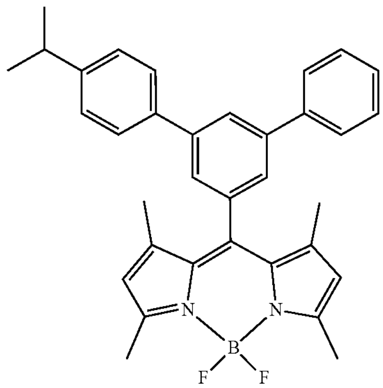
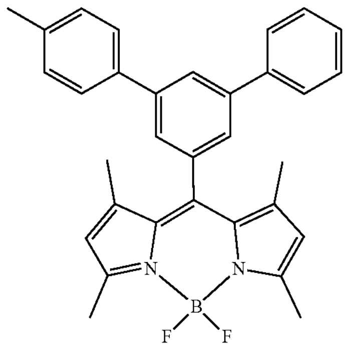
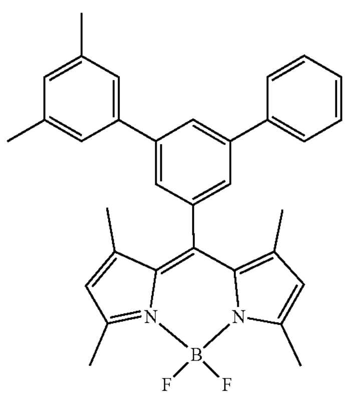
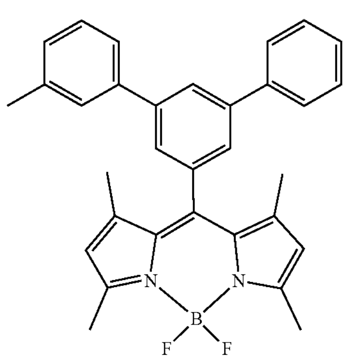
-continued
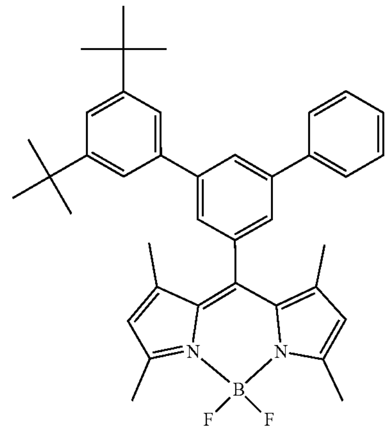
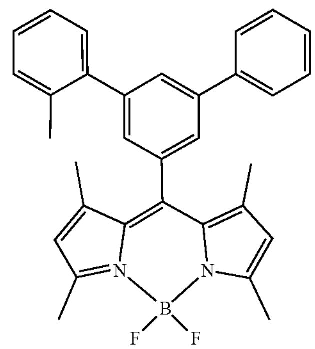
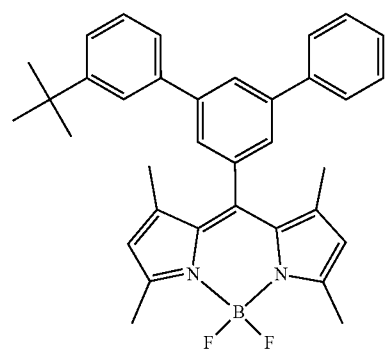
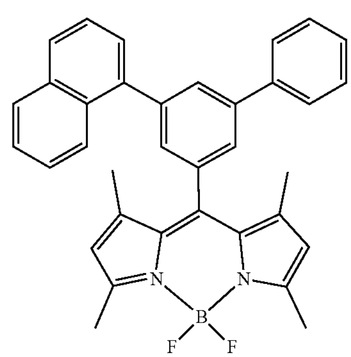

-continued
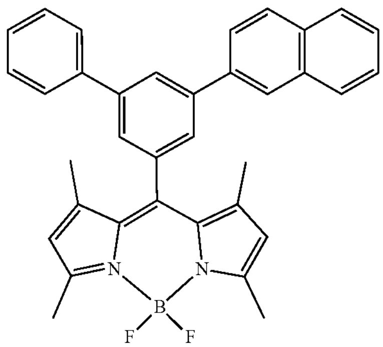
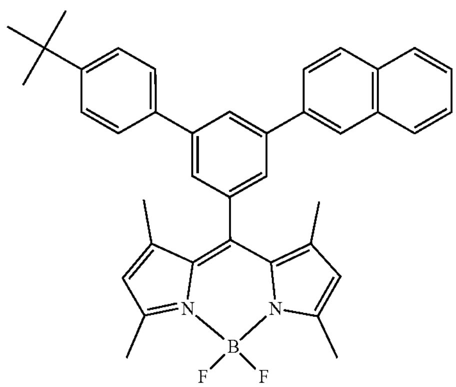
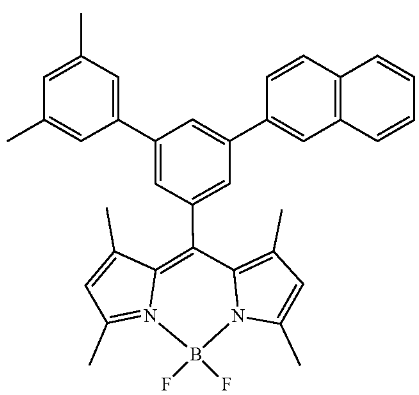
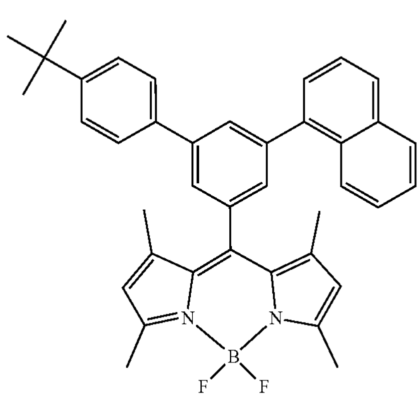
-continued
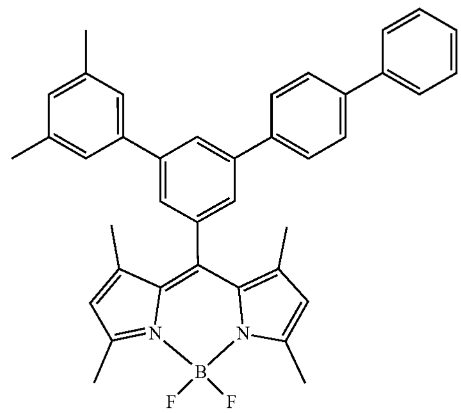
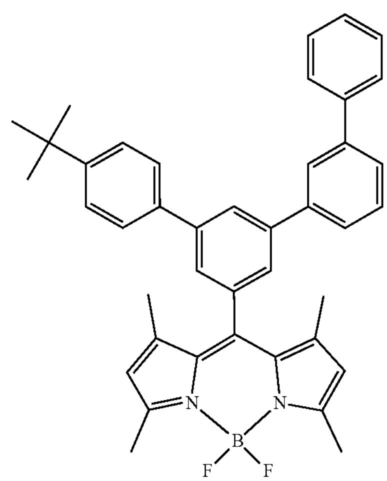
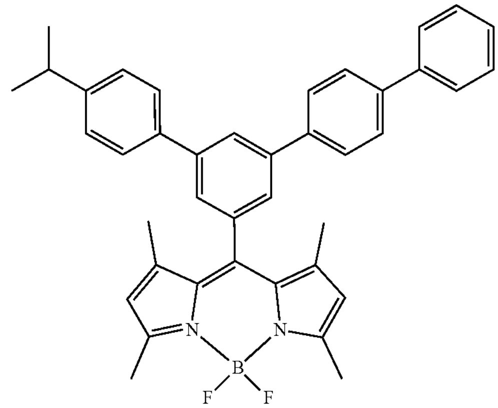

-continued
[Chem. 14]
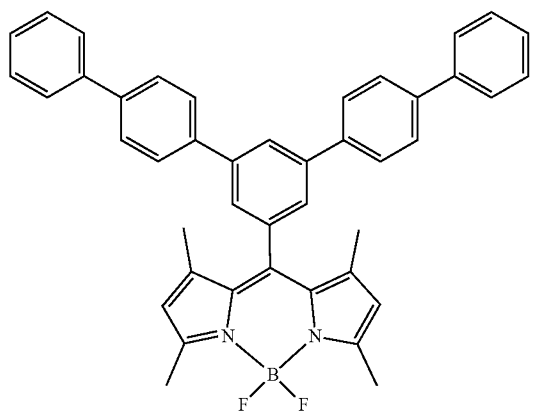
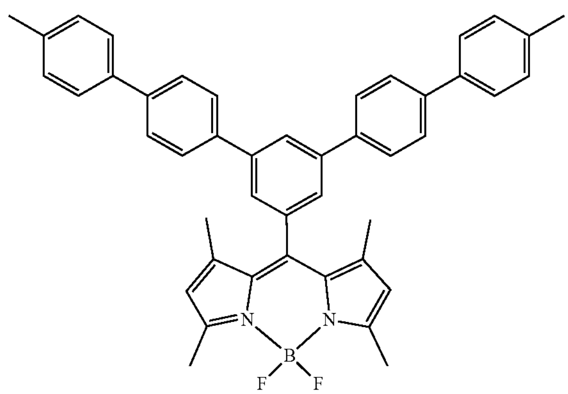
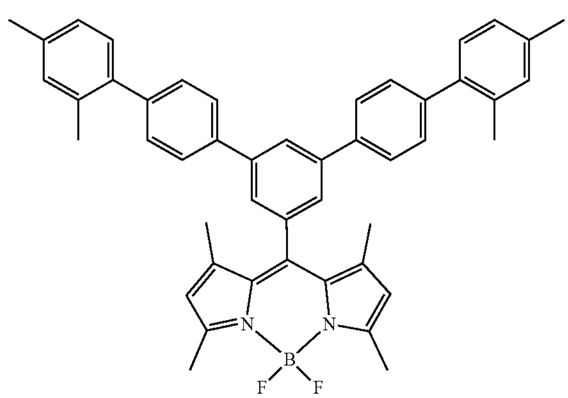
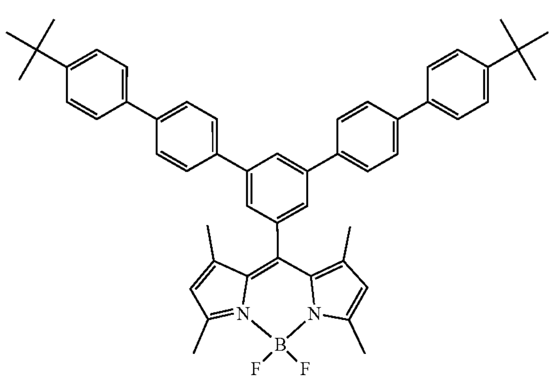
-continued
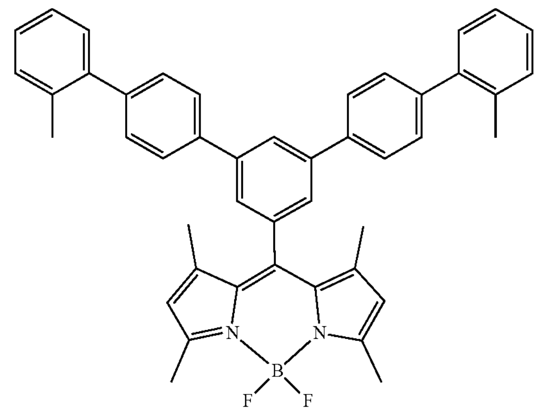
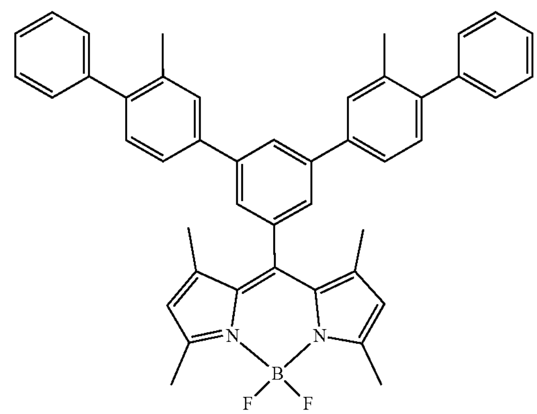
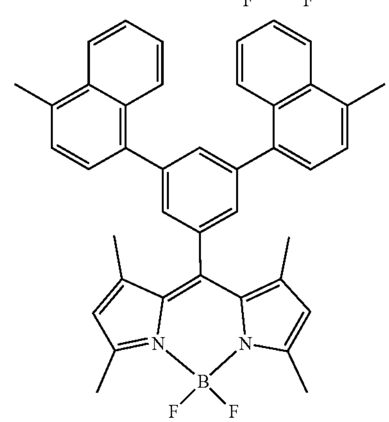
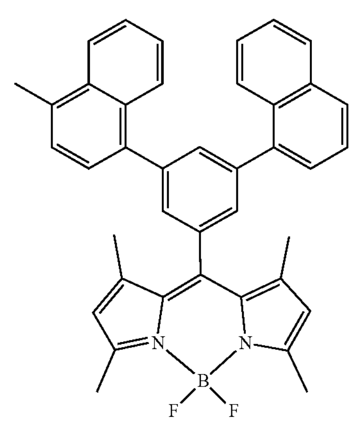

-continued
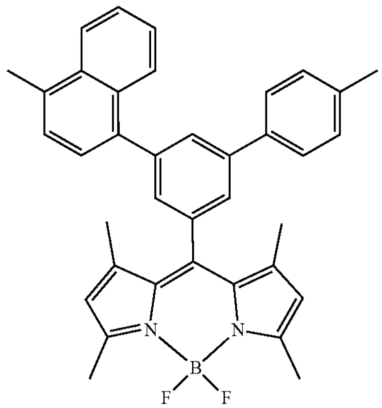
[Chem. 15]
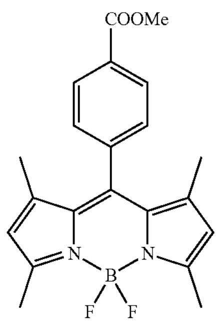
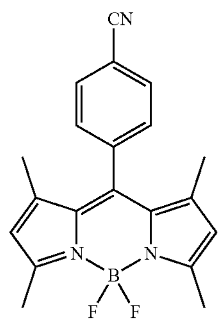
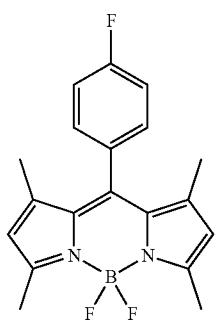
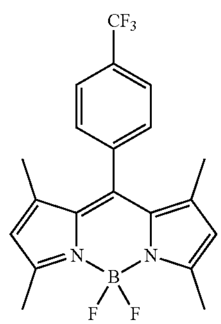
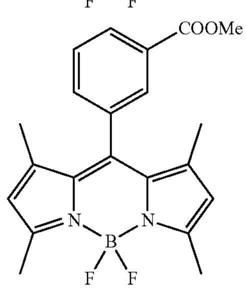
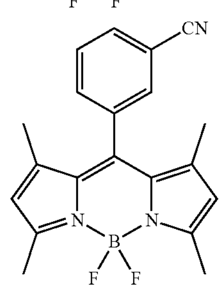
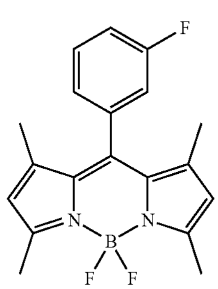
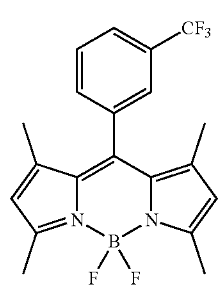
-continued
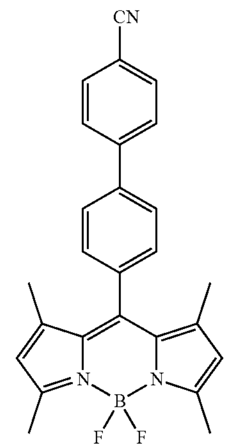
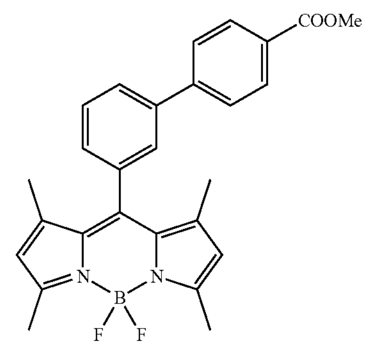
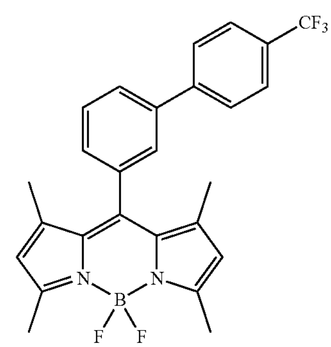
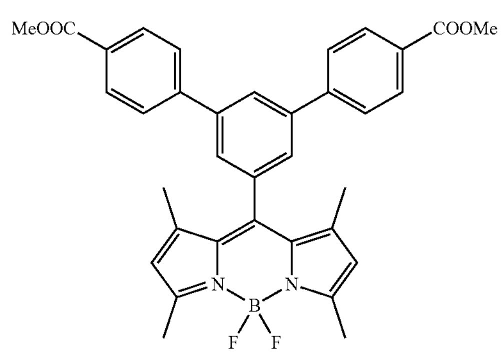

-continued
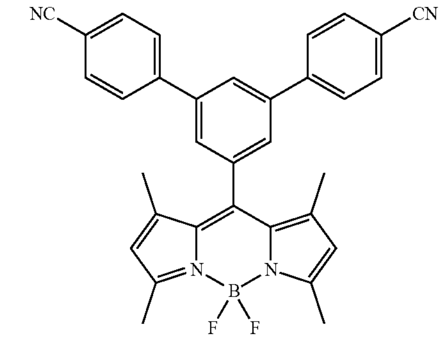
[Chem. 16]
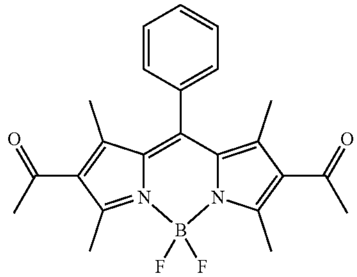
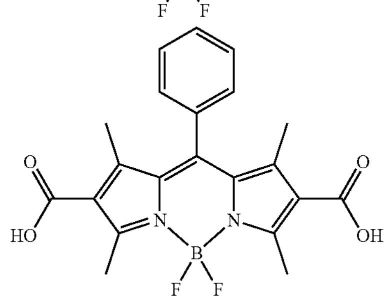
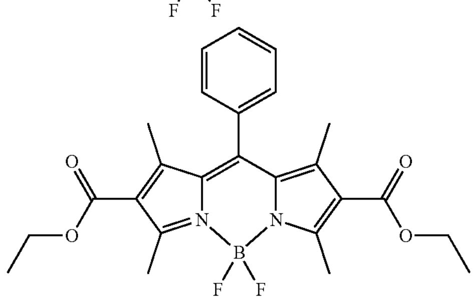
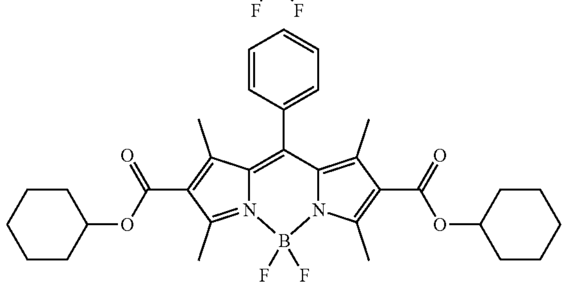
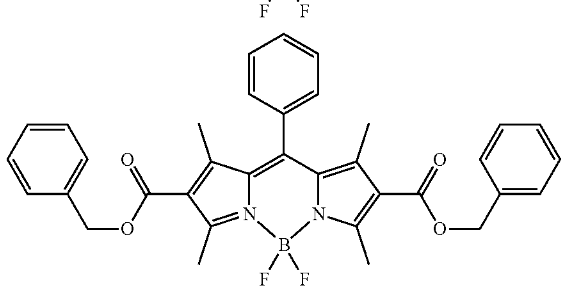
-continued
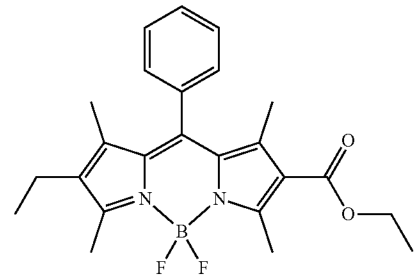
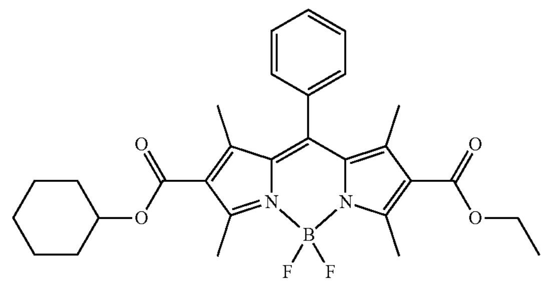
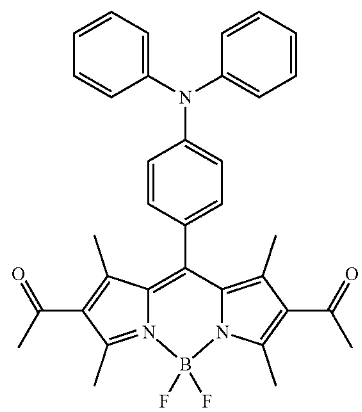
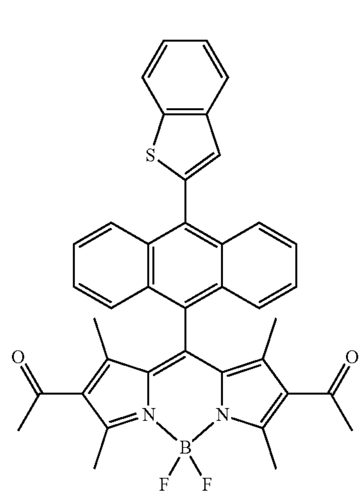

-continued
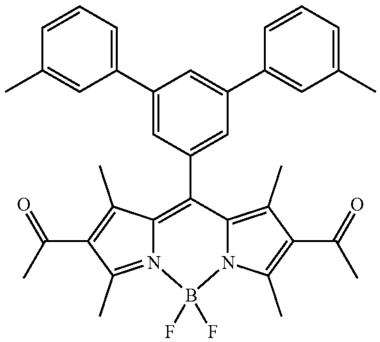
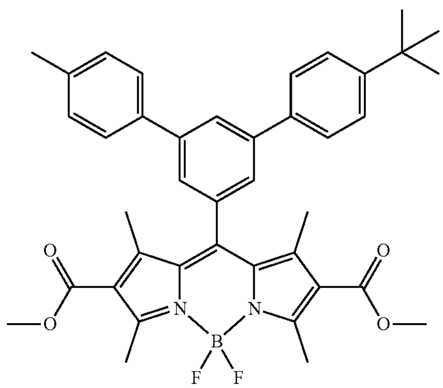
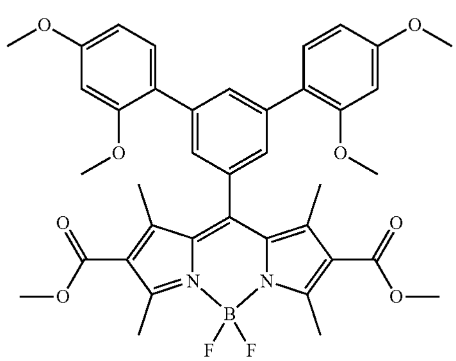
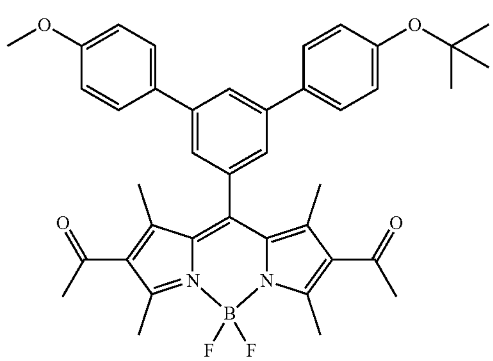
-continued
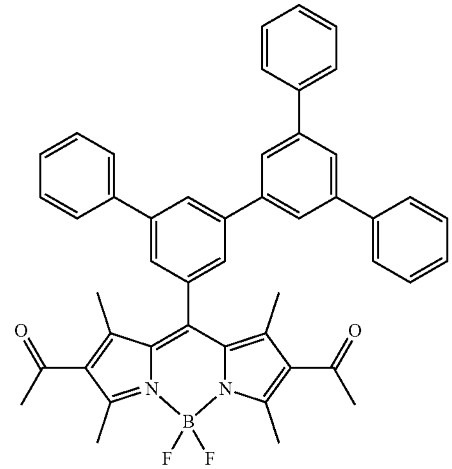
[Chem. 17]
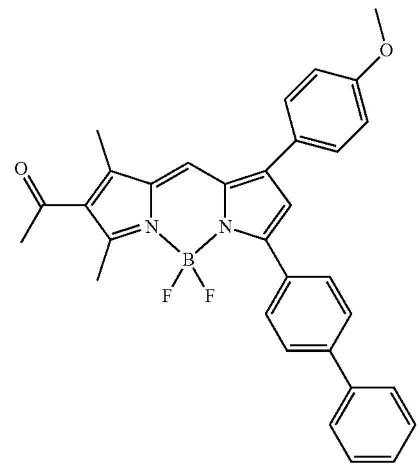
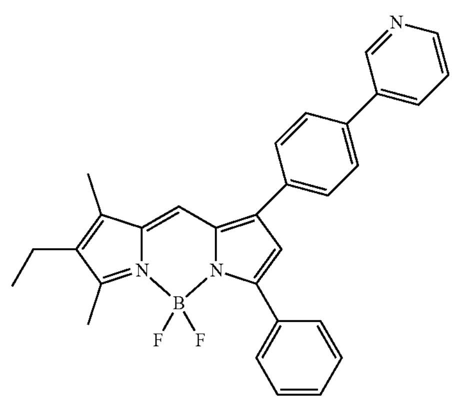
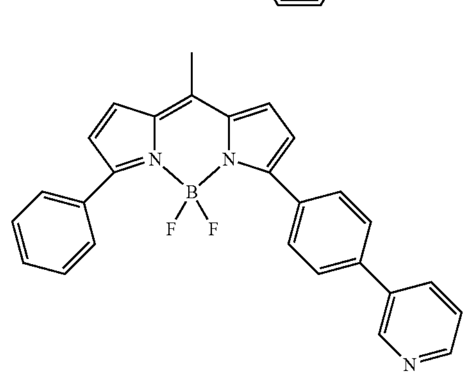

-continued
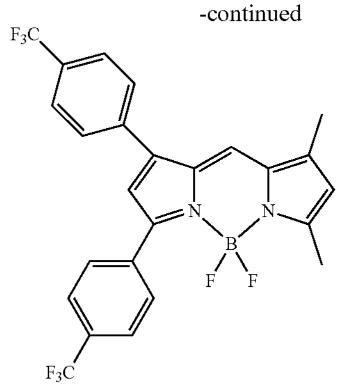
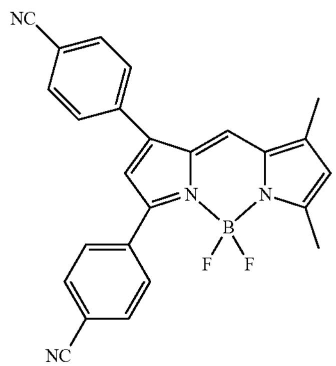
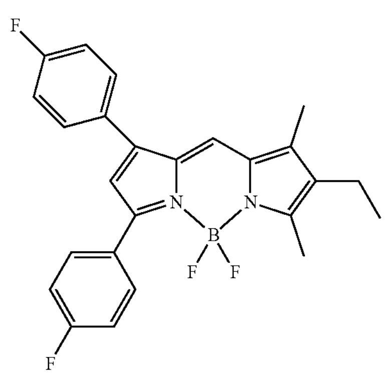
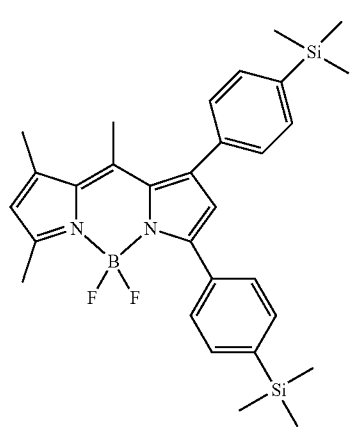
-continued
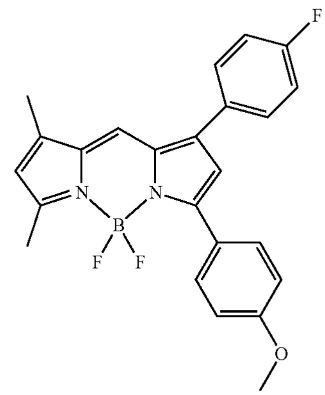
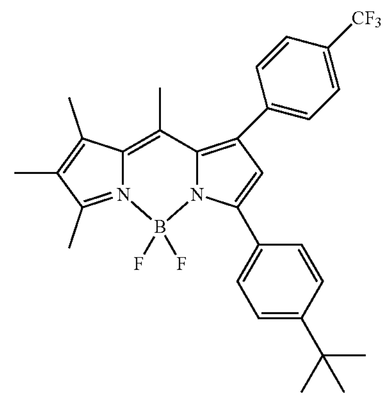
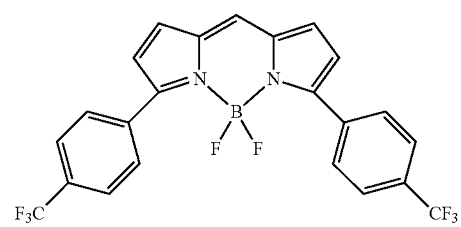
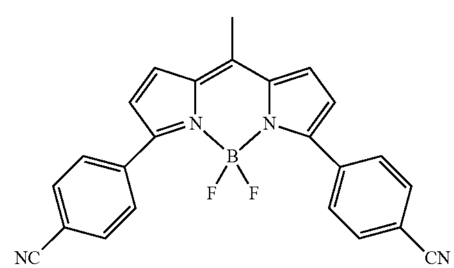
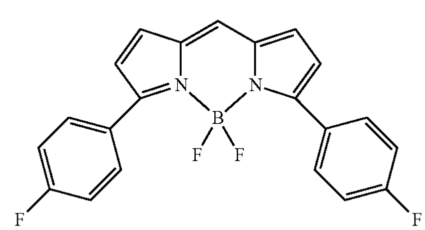

-continued
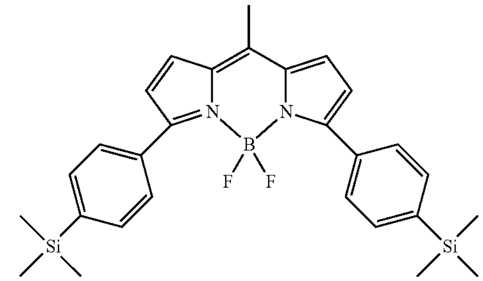
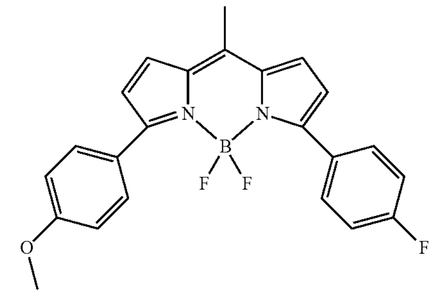
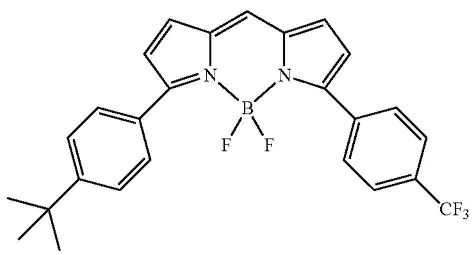
{Chem 18}
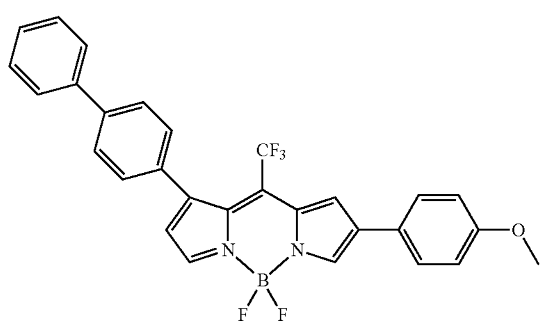
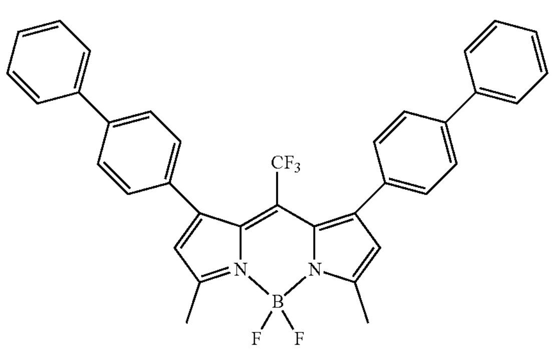
-continued
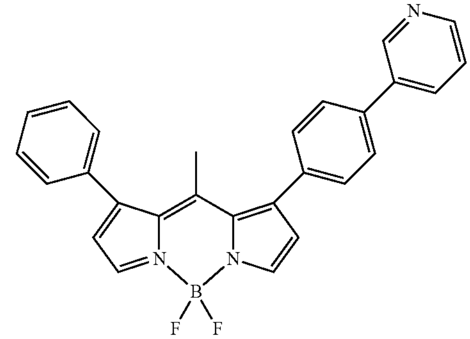
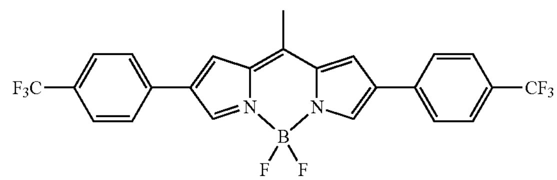
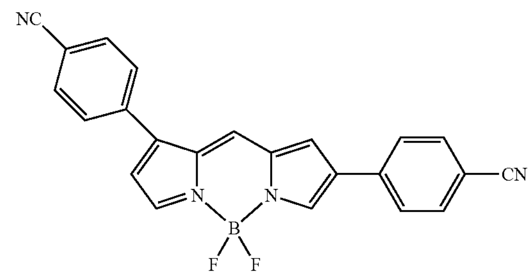
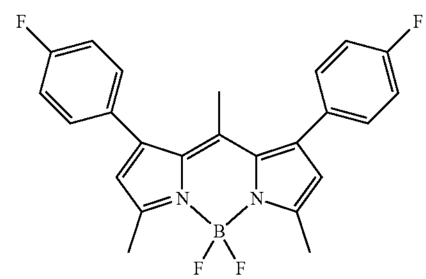
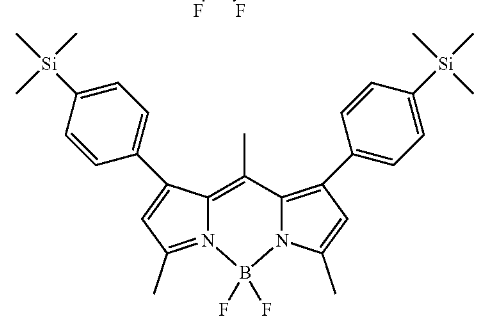
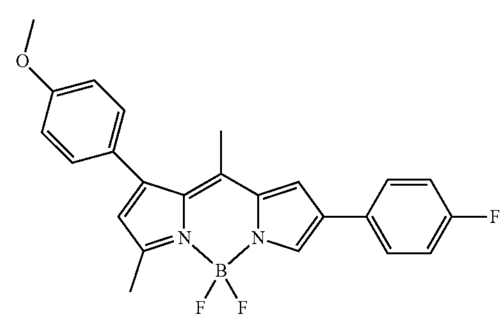

-continued
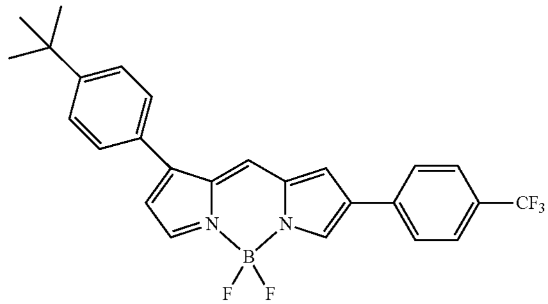
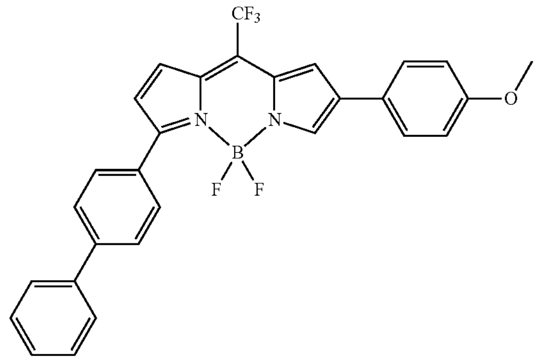
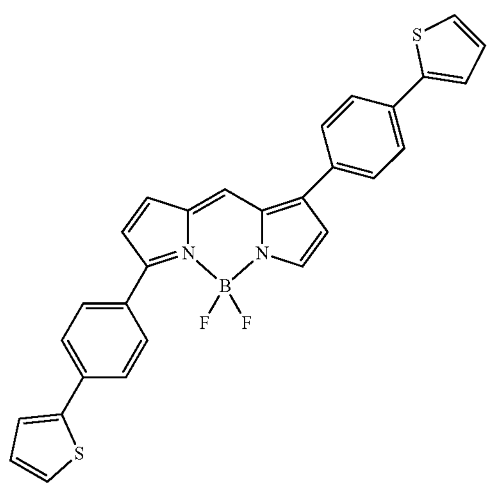
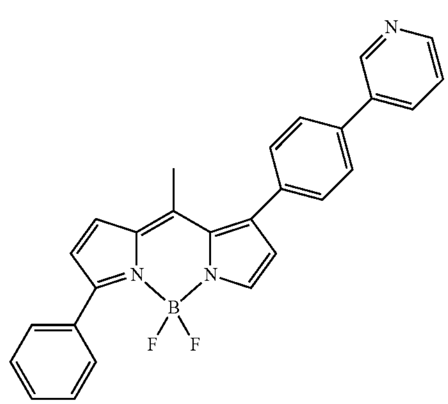
-continued
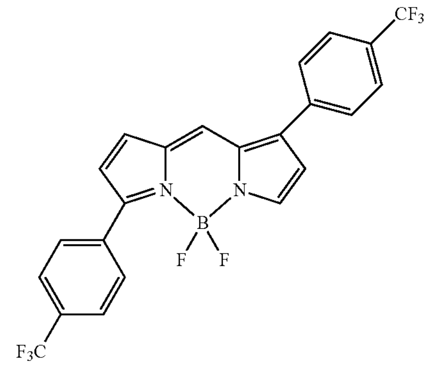
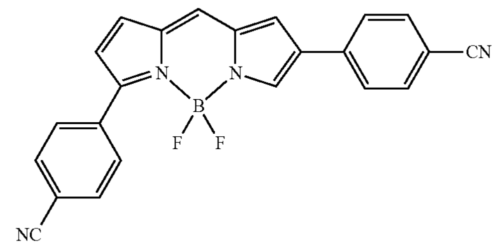
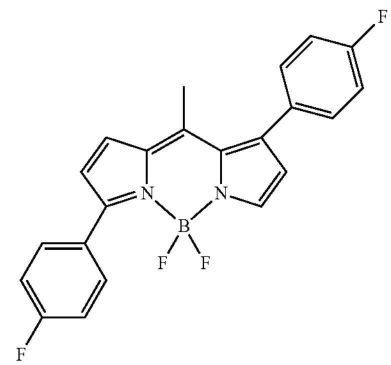
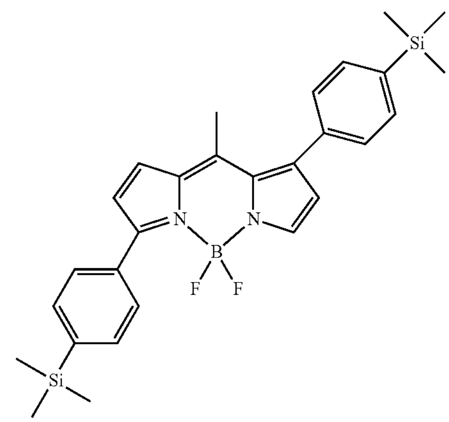
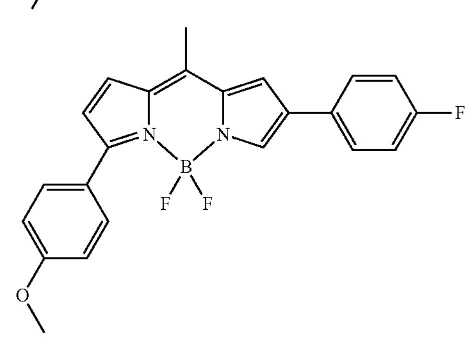

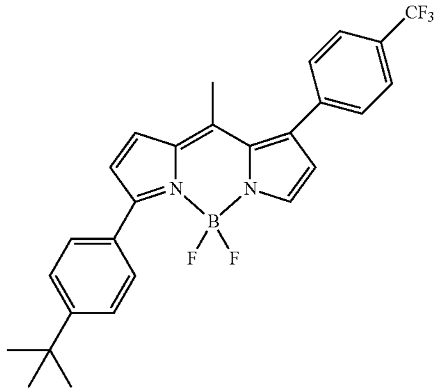
[Chem. 19]
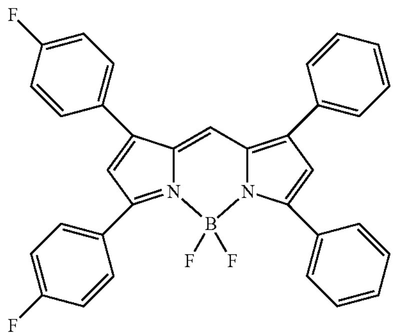
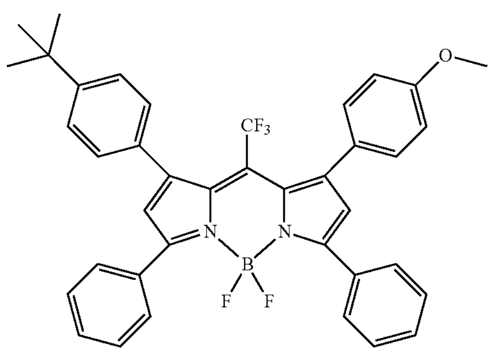
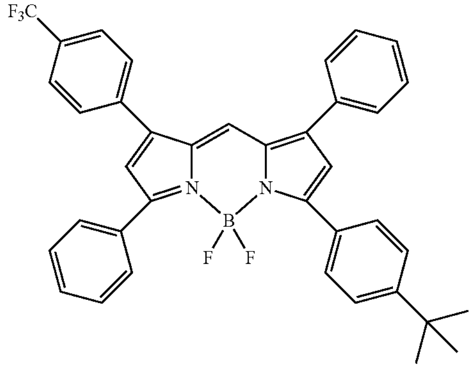
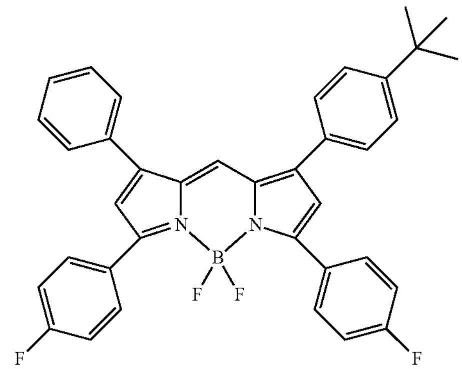
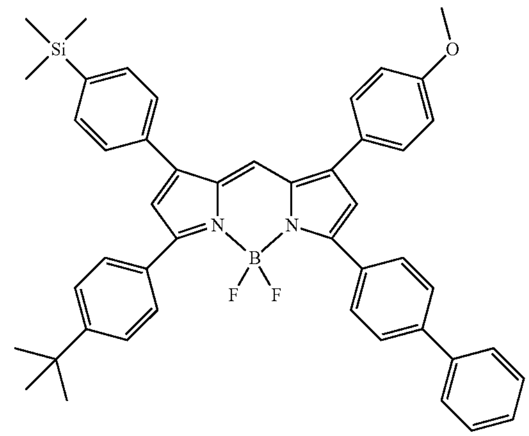
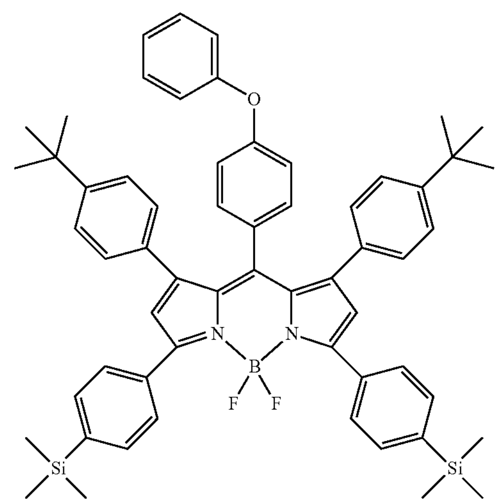
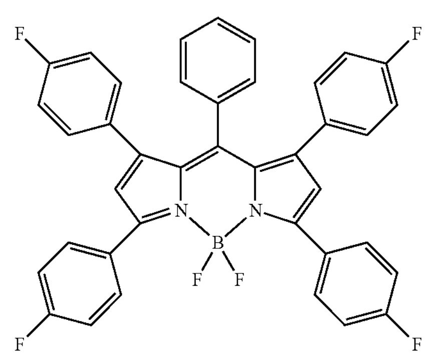

-continued
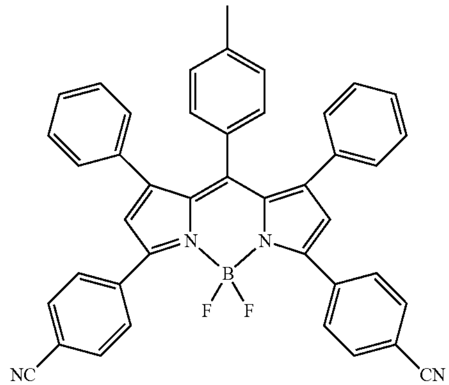
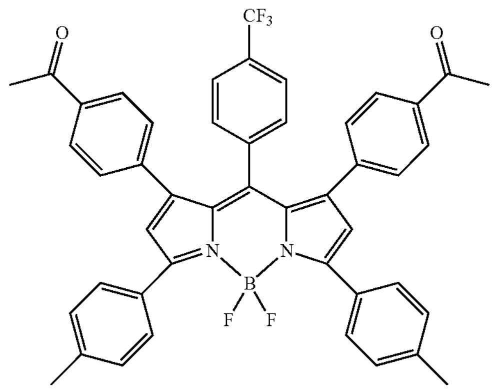
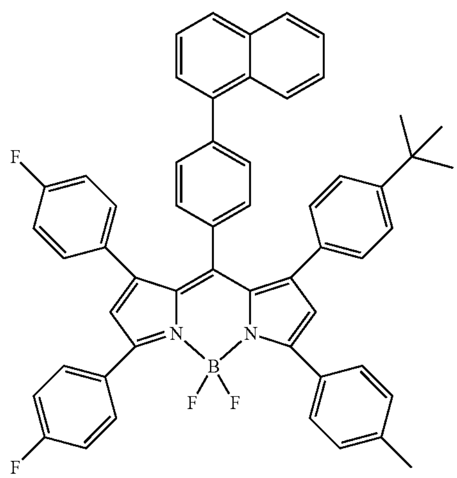
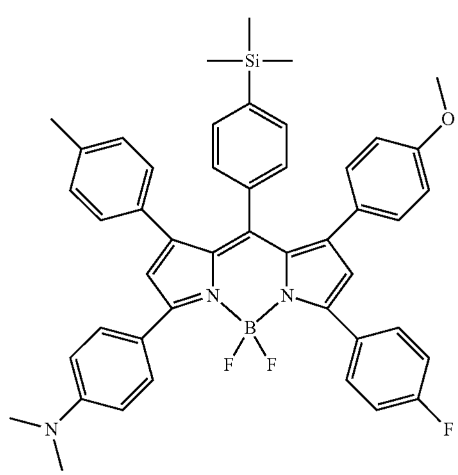
-continued
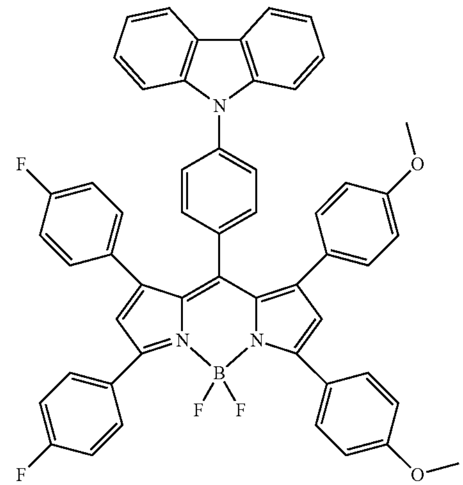
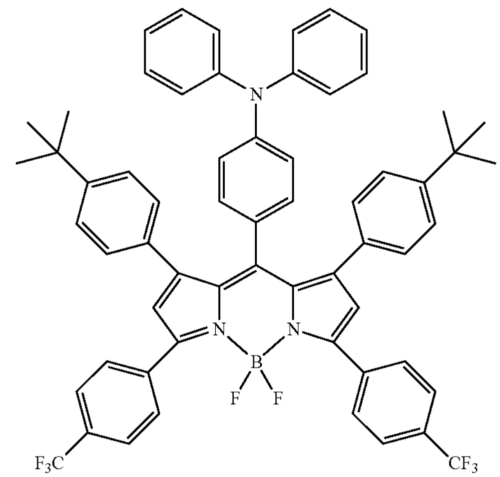
[Chem. 20]
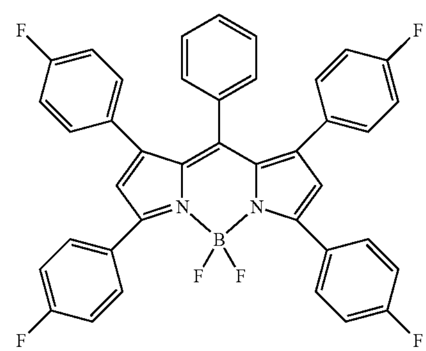
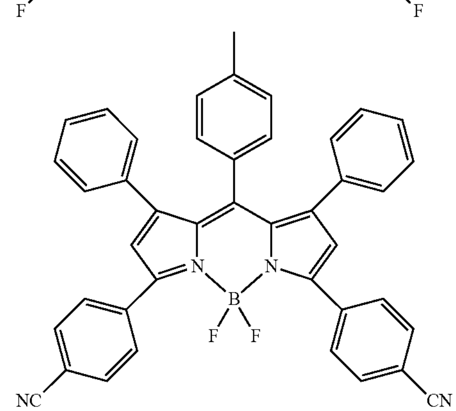

-continued
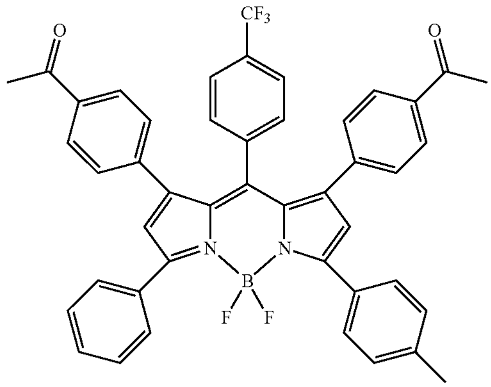
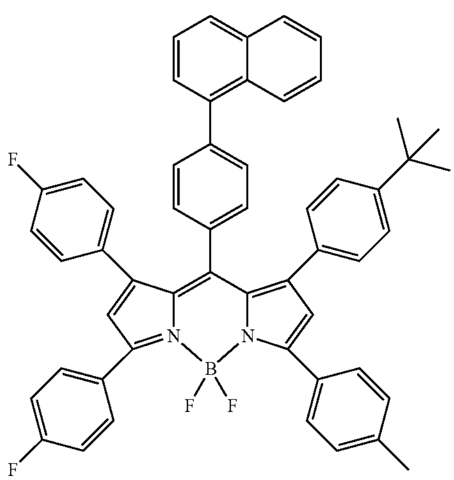
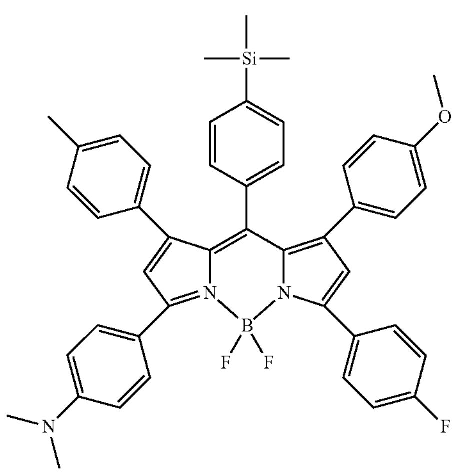
-continued
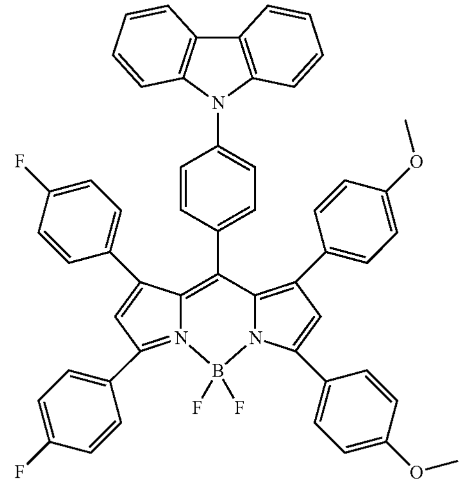
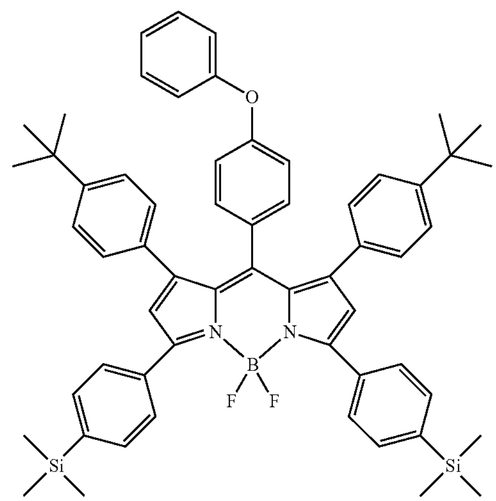
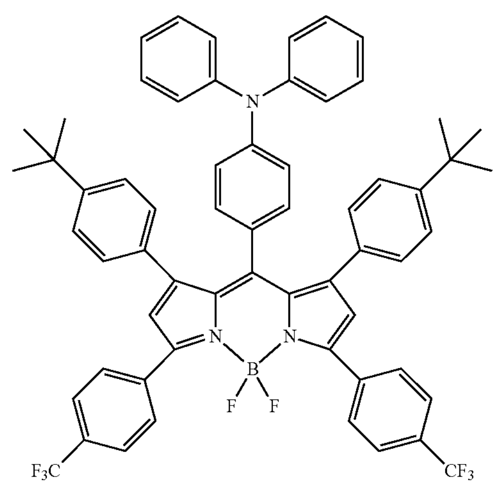

-continued
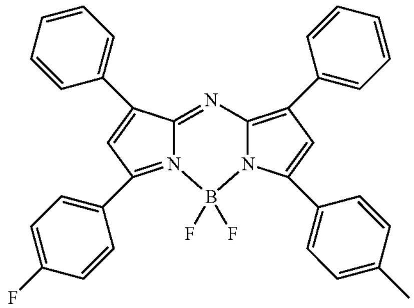
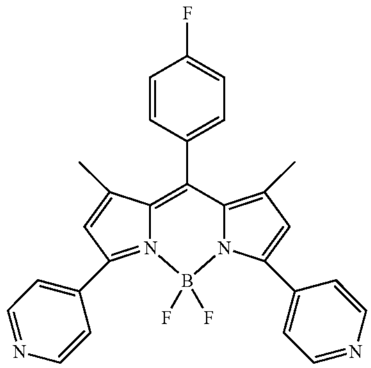
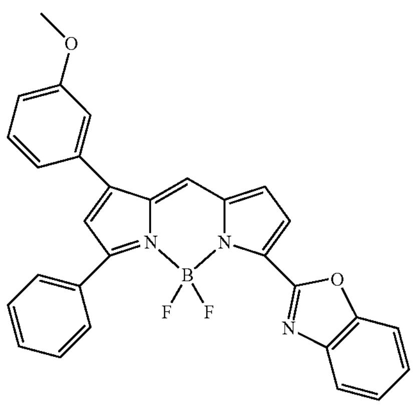
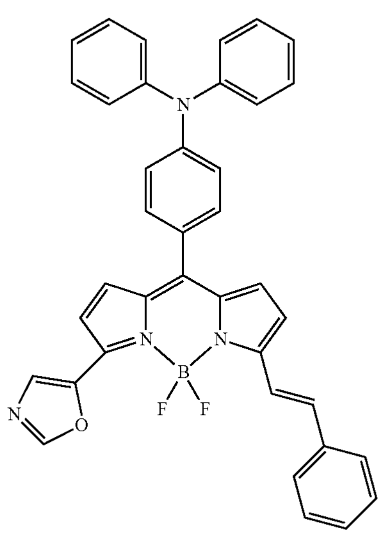
-continued
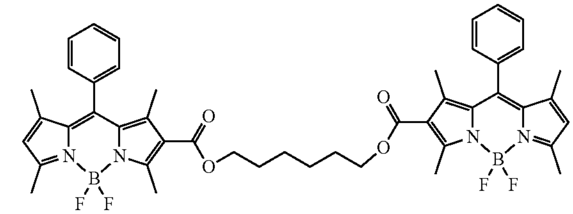
[Chem. 21]
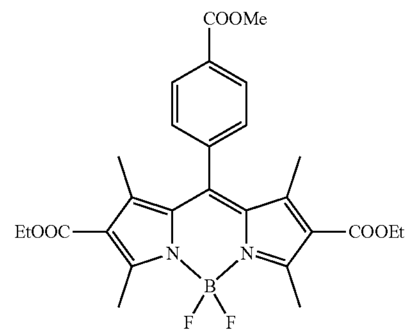
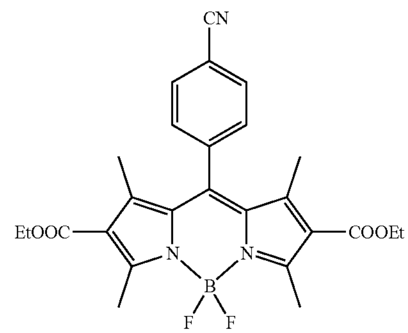
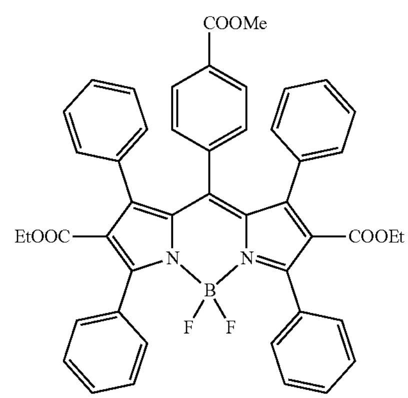
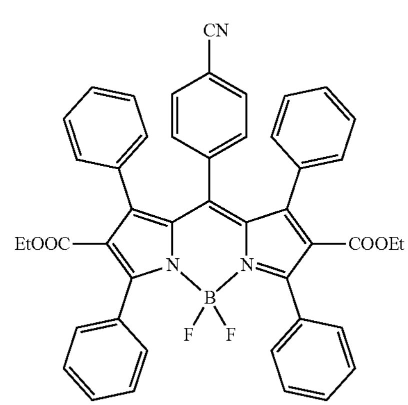

-continued

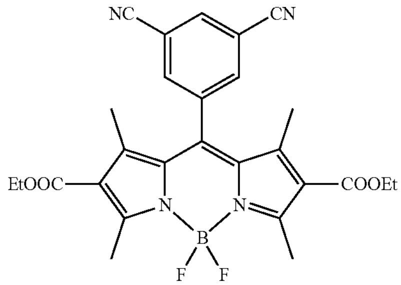

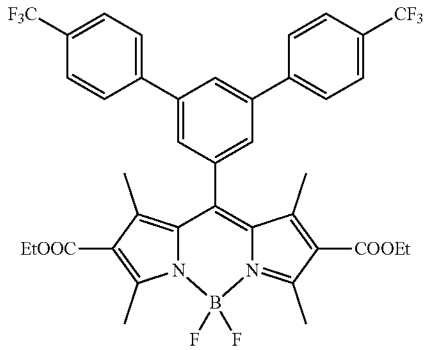

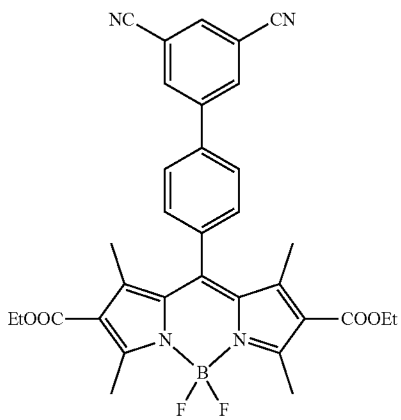

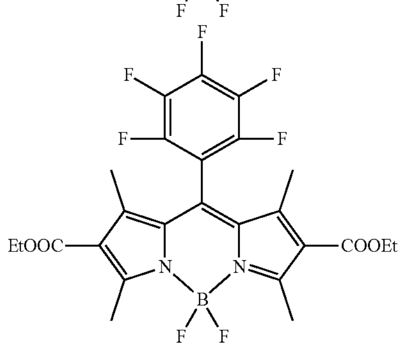

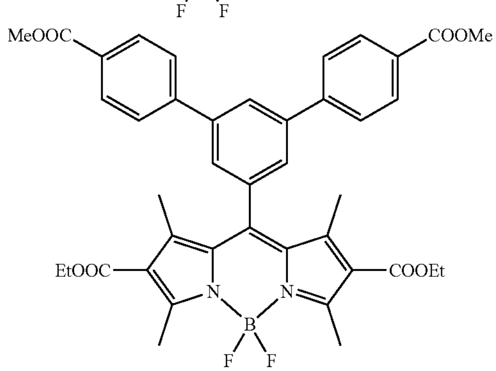

-continued

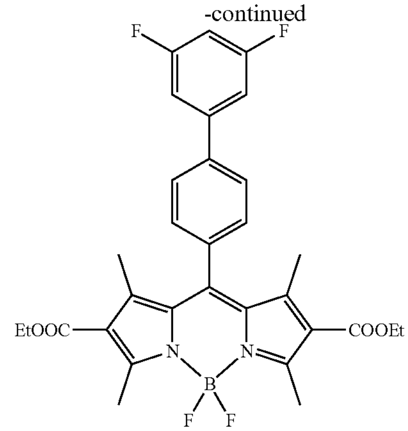

The compound represented by formula (1) can be produced by the method described, for example, in JP-T-8-509471 or JP-A-2000-208262. More specifically, a target pyrromethene-based metal complex is obtained by reacting a pyrromethene compound with a metal salt in the co-presence of a base.

As to the synthesis of a pyrromethene-boron fluoride complex, the compound can be produced by referring to the method described in J. Org. Chem., Vol. 64, No. 21, pp. 7813-7819 (1999), Angew. Chem., Int. Ed. Engl., Vol. 36, pp. 1333-1335 (1997), etc. The method includes, but is not limited to, for example, a method of heating a compound represented by the following formula (4) and a compound represented by formula (5) in 1,2-dichloromethane in the presence of phosphorus oxychloride, and then reacting a compound represented by the following formula (6) in 1,2-dichloroethane in the presence of triethylamine. Here, $R^1$ to $R^9$ are the same as above. J represents a halogen.

[Chem. 22]

(4)

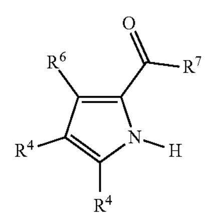

(5)

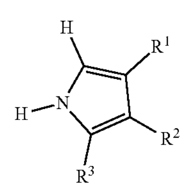

(6)

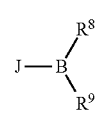

Furthermore, the method for introduction of an aryl group or a heteroaryl group includes, but is not limited to, a method of producing a carbon-carbon bond by using a coupling reaction of a halogenated derivative with a boronic acid or a boronic ester derivative. Similarly, the method for introduction of an amino group or a carbazolyl group includes, but is not limited to, a method of producing a carbon-nitrogen bond by using a coupling reaction of a halogenated derivative with an amine or carbazole derivative under with a metal catalyst such as palladium.

The compound represented by formula (1) in embodiment 1B preferably emits light having a peak wavelength observed in the region of 500 to 580 nm by use of excitation light. Hereinafter, emission of light having a peak wavelength observed in the region of 500 to 580 nm is referred to as "green emission".

The compound represented by formula (1) in embodiment 1B preferably provides green emission by use of excitation light with a wavelength of 430 to 500 nm. In general, excitation light having lager energy is more likely to cause decomposition of a material, but the excitation energy of excitation light with a wavelength of 430 to 500 nm is relatively small, and green emission having a good color purity is therefore obtained without causing decomposition of a luminescent material in the color conversion composition.

The compound represented by formula (1) in embodiment 1A preferably emits light having a peak wavelength observed in the region of 500 to 580 nm by use of excitation light.

The compound represented by formula (1) in embodiment 1A preferably provides green emission by use of excitation light with a wavelength of 430 to 500 nm. In general, excitation light having lager energy is more likely to cause decomposition of a material, but the excitation energy of excitation light with a wavelength of 430 to 500 nm is relatively small, and green emission having a good color purity is therefore obtained without causing decomposition of a luminescent material in the color conversion composition.

The compound represented by formula (1) in embodiment 1A preferably emits light having a peak wavelength observed in the region of 580 to 750 nm by use of excitation light. Hereinafter, emission of light having a peak wavelength observed in the region of 580 to 750 nm is referred to as "red emission".

The compound represented by formula (1) in embodiment 1A preferably provides red emission by use of excitation light with a wavelength of 430 to 580 nm. In general, excitation light having lager energy is more likely to cause decomposition of a material, but the excitation energy of excitation light with a wavelength of 430 to 500 nm is relatively small, and red emission having a good color purity is therefore obtained without causing decomposition of a luminescent material in the color conversion composition.

<Color Conversion Composition>

The color conversion composition of the present invention preferably contains a compound represented by formula (1) or (3) and a binder resin.

The color conversion composition of the present invention may appropriately further contain a compound, if desired, other than the compound represented by formula (1) or (3). For example, the composition may contain an assist dopant such as rubrene so as to further enhance the energy transfer efficiency from excitation light to the compound represented by formula (1) or (3). In the case of intending to add an emission color other than the emission color of the compound represented by formula (1) or (3), the above-described organic luminescent material can be added. In addition, other than the organic luminescent material, a known luminescent material such as inorganic phosphor, fluorescent pigment, fluorescent dye and quantum dot may be added in combination.

Examples of the organic luminescent material other than the compound represented by formula (1) or (3) are illustrated below, but the present invention is not limited thereto.

[Chem. 23]

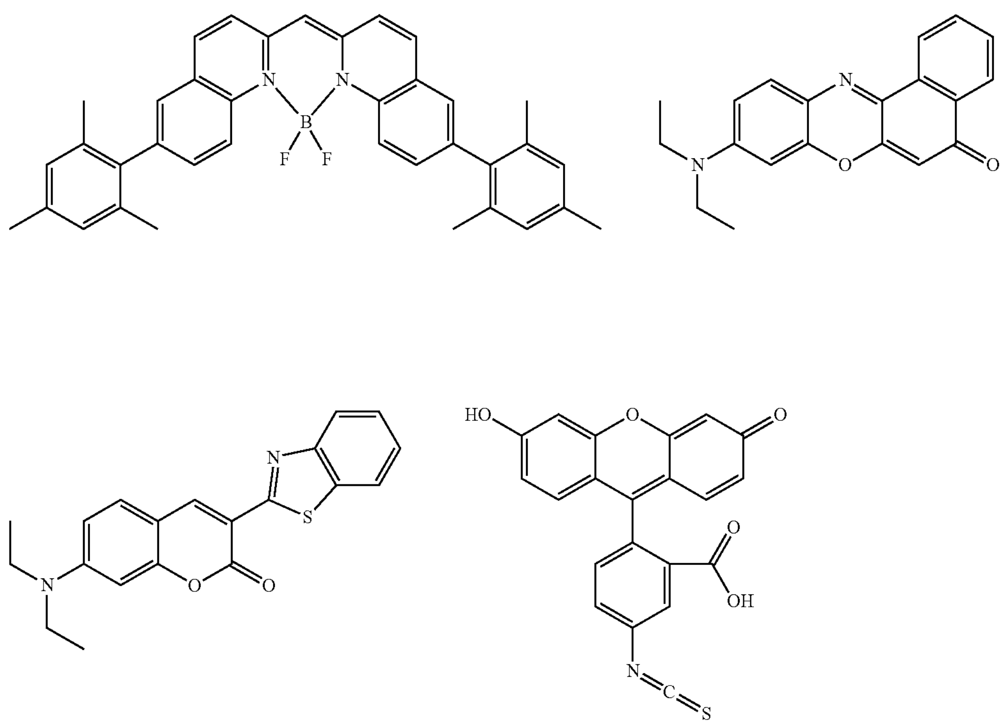

-continued
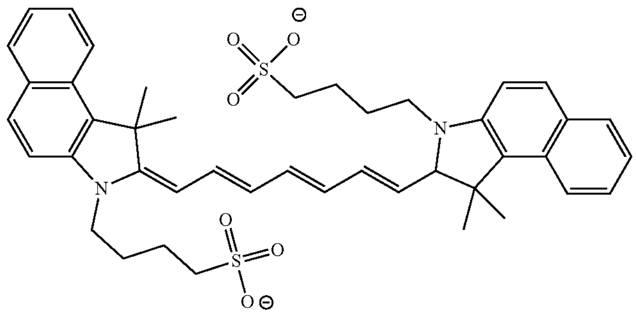
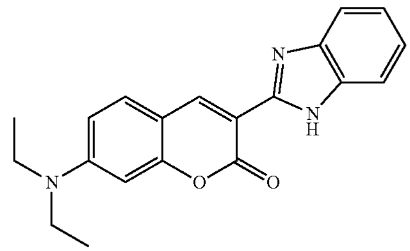
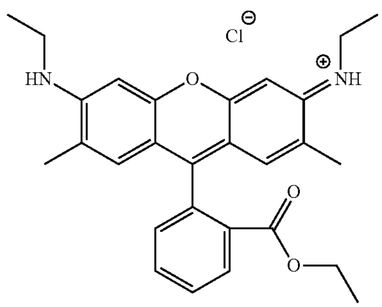
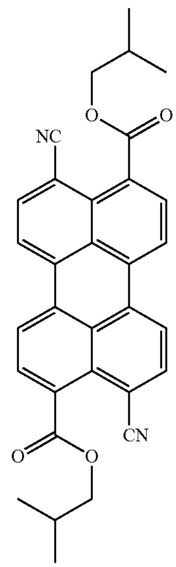
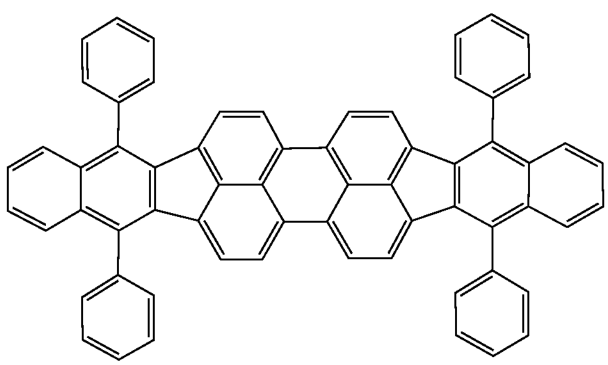
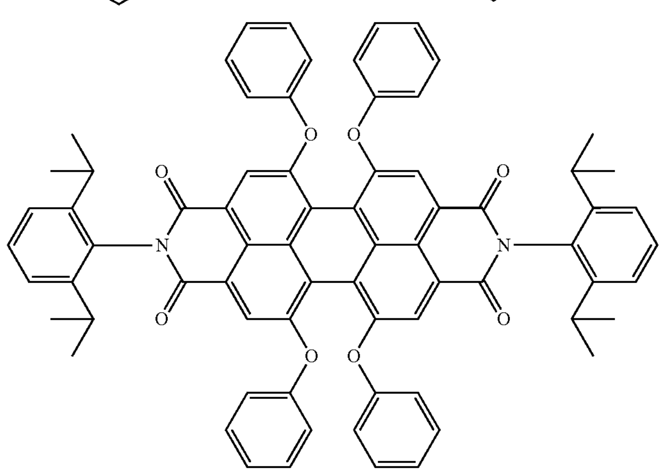

-continued

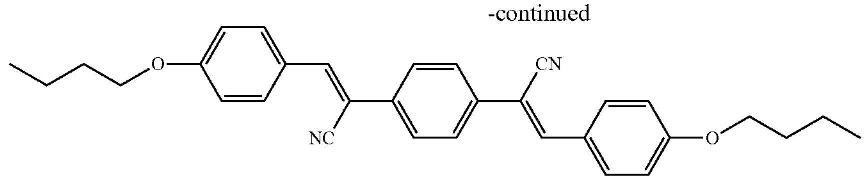

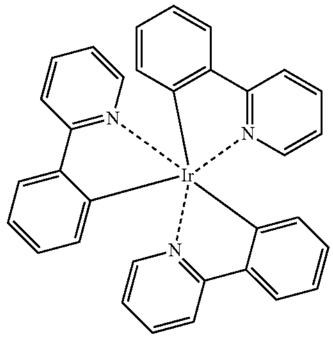

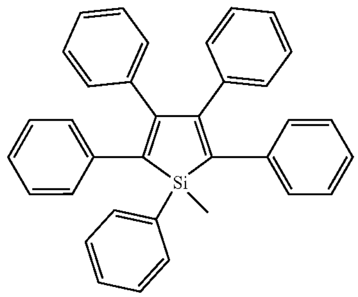

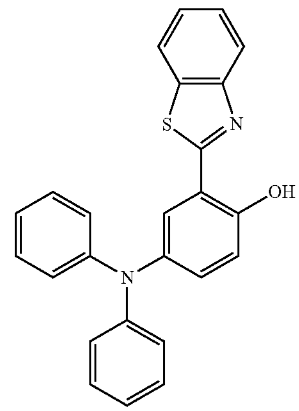

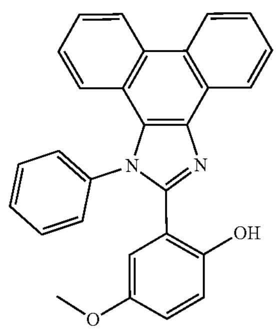

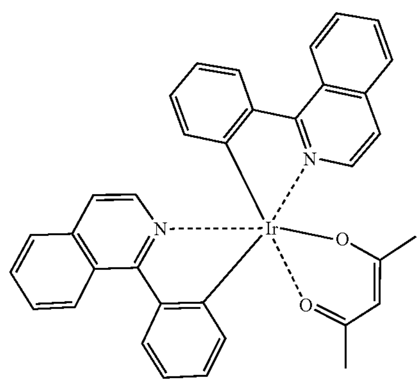

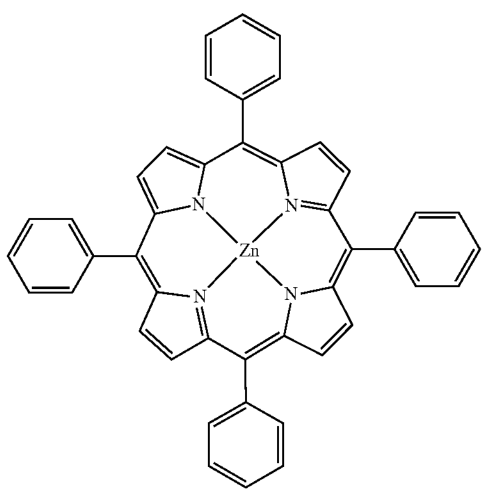

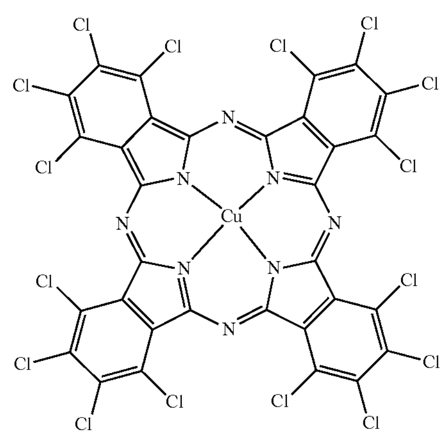

For one embodiment of the color conversion composition of the present invention, light having a peak wavelength observed in the region of 500 to 580 nm is preferably emitted by use of excitation light.

For one embodiment of the color conversion composition of the present invention, light having a peak wavelength observed in the region of 580 to 750 nm is preferably emitted by use of excitation light.

In one embodiment of the color conversion composition of the present invention, it is preferable to contain (a) a luminescent material (hereinafter, referred to as "luminescent material (a)") emitting light having a peak wavelength of 500 to 580 nm by use of excitation light and (b) a luminescent material (hereinafter, referred to as "luminescent material (b)") emitting light having a peak wavelength observed in the region of 580 to 750 nm upon excitation by at least either one of excitation light and luminescence from the luminescent material (a), with at least one of the luminescent materials (a) and (b) being a compound represented by formula (1) or (3). It is more preferable to use excitation light having a wavelength of 430 to 500 nm.

Part of the excitation light having a wavelength of 430 to 500 nm partially transmits through the color conversion film of the present invention, and in the case of using a blue LED having a sharp emission peak, each of blue, green and red colors exhibits an emission spectrum in a sharp profile, making it possible to obtain while light with good color purity. As a result, particularly in a display, more vivid colors and a larger color gamut can be efficiently produced. In the lighting applications, compared with a currently prevailing white LED fabricated by combining a blue LED and a yellow phosphor, the light emission characteristics in the green and red regions are improved, and the color rendering properties are thereby enhanced to provide a preferable white light source.

The suitable luminescent material (a) includes, but is not limited to, a coumarin derivative such as coumarin 6, coumarin 7 and coumarin 153, a cyanine derivative such as indocyanine green, a fluorescein derivative such as fluorescein, fluorescein isothiocyanate and carboxyfluorescein diacetate, a phthalocyanine derivative such as phthalocyanine green, a perylene derivative such as diisobutyl-4,10-dicyanoperylene-3,9-dicarboxylate, a pyrromethene derivative, a stilbene derivative, an oxazine derivative, a naphthalimide derivative, a pyrazine derivative, a benzimidazole derivative, a benzoxazole derivative, a benzothiazole derivative, an imidazopyridine derivative, an azole derivative, a compound having a fused aryl ring, such as anthracene, or a derivative thereof, an aromatic amine derivative, an organic metal complex compound, etc. Among these compounds, a pyrromethene derivative gives a high fluorescence quantum yield, exhibits light emission with high color purity, and is therefore a particularly suitable compound, and above all, a compound represented by formula (1) is preferred, because the durability is greatly improved.

The suitable luminescent material (b) includes, but is not limited to, a cyanine derivative such as 4-dicyanomethylene-2-methyl-6-(p-dimethylaminostyryl)-4H-pyrane, a rhodamine derivative such as rhodamine B, rhodamine 6G, rhodamine 101 and sulforhodamine 101, a pyridine derivative such as 1-ethyl-2-(4-(p-dimethylaminophenyl)-1,3-butadienyl)-pyridinium-perchlorate, a perylene derivative such as N,N'-bis(2,6-diisopropylphenyl)-1,6,7,12-tetraphenoxyperylene-3,4:9,10-bisdicarboimide, a porphyrin derivative, a pyrromethene derivative, an oxazine derivative, a pyrazine derivative, a compound having a fused aryl ring, such as naphthacene or dibenzodiindenoperylene or a derivative thereof, an organic metal complex compound. Among these compounds, a pyrromethene derivative gives a high fluorescence quantum yield, exhibits light emission with high color purity, and is therefore a particularly suitable compound, and above all, a compound represented by formula (1) or (3) is preferred, because the durability is drastically improved.

In addition, when both of the luminescent materials (a) and (b) are a compound represented by formula (1) or (3), all of highly efficient light emission, high color purity and high durability can be advantageously achieved.

The content of the compound represented by formula (1) or (3) in the color conversion composition of the present invention may vary depending on the molar extinction coefficient, fluorescence quantum yield and absorption intensity at excitation wavelength of the compound and the thickness or transmittance of the film formed, but the content thereof is usually from $1.0\times10^{-4}$ to 30 parts by weight, preferably from $1.0\times10^{-3}$ to 10 parts by weight, more preferably from $1.0\times10^{-2}$ to 5 parts by weight, per 100 parts by weight of the binder resin.

In the case where the color conversion composition contains both (a) a luminescent material providing green emission and (b) a luminescent material providing red emission, since part of green emission is converted to red emission, the content $w_a$ of the luminescent material (a) and the content $w_b$ of the luminescent material (b) preferably have a relationship of $w_a \geq w_b$. The content ratio of respective materials is $w_a:w_b$=from 1000:1 to 1:1, preferably from 500:1 to 2:1, more preferably from 200:1 to 3:1. Here, $w_a$ and $w_b$ are the weight percent relative to the weight of the binder resin.

<Binder Resin>

The binder resin forms a continuous phase and may be sufficient if it is a material excellent in mold processability, transparency, heat resistance, etc. Examples of the binder resin include known resins, e.g., a photocurable resist material having a reactive vinyl group such as acrylic acid-based, methacrylic acid-based, polyvinyl cinnamate-based and cyclic rubber-based resins, an epoxy resin, a silicone resin (including a cured (crosslinked) organopolysiloxane such as silicone rubber and silicone gel), a urea resin, a fluororesin, a polycarbonate resin, an acrylic resin, a urethane resin, a melamine resin, a polyvinyl resin, a polyamide resin, a phenol resin, a polyvinyl alcohol resin, a cellulose resin, an aliphatic ester resin, an aromatic ester resin, an aliphatic polyolefin resin, and an aromatic polyolefin resin. It is also possible to use a copolymerized resin thereof. A resin useful for the color conversion composition of the present invention is obtained by appropriately designing the resins above. Among these resins, a thermoplastic resin is more preferred, because the film forming process is facilitated. In view of transparency, heat resistance, etc., an epoxy resin, a silicone resin, an acrylic resin, or a mixture thereof may be suitably used.

In addition, for example, a dispersant or leveling agent for stabilizing the coated film, and an adhesion aid, e.g., a silane coupling agent as a modifier of the film surface, may also be added as an additive. Furthermore, an inorganic particle such as silica particle or silicone fine particle may also be added as a color conversion material precipitation inhibitor.

Among others, the binder resin is preferably a silicone resin in view of heat resistance. Among silicone resins, an addition reaction-curable silicone composition is preferred. The addition reaction-curable silicone composition is cured by heating at normal temperature or at a temperature of 50 to 200° C. and is excellent in the transparency, heat resistance and adhesiveness. The addition reaction-curable silicone composition is formed, for example, by a hydrosilylation reaction of a compound containing an alkenyl group bonded to a silicon atom with a compound having a hydrogen atom bonded to a silicon atom. Such a material includes those formed by a hydrosilylation reaction of a compound containing an alkenyl group bonded to a silicon atom, such as vinyltrimethoxysilane, vinyltriethoxysilane, allyltrimethoxysilane, propenyltrimethoxysilane, norbornenyltrimethoxysilane and octenyltrimethoxysilane, with a compound having a hydrogen atom bonded to a silicon atom, such as methylhydrogenpolysiloxane, dimethylpolysiloxane-CO-methylhydrogenpolysiloxane, ethylhydrogenpolysiloxane and methylhydrogenpolysiloxane-CO-methylphenylpolysiloxane. In addition, known materials described, for example, in JP-A-2010-159411 may also be utilized.

Furthermore, a commercially available silicone sealant for use in general LED may also be used. Specific examples thereof include OE-6630A/B, OE-6336A/B, both produced by Dow Corning Toray Co., Ltd., SCR-1012A/B, and SCR-1016A/B, both produced by Shin-Etsu Chemical Co., Ltd.

In the color conversion composition for the preparation of color conversion film of the present invention, a hydrosilylation reaction retarder such as acetylene alcohol is preferably blended as other components so as to inhibit curing at normal temperature and extend the pot life. In addition, for example, a fine particle such as fumed silica, glass powder or quartz powder, an inorganic filler such as titanium oxide, zirconium oxide, barium titanate or zinc oxide, a pigment, a flame retardant, a heat-resistant agent, an antioxidant, a dispersing agent, a solvent, and a tackifier such as silane coupling agent or titanium coupling agent, may be blended, if desired, to the extent of not impairing the effects of the present invention.

Above all, in view of surface smoothness of the color conversion film, a polydimethylsiloxane component having a low molecular weight, a silicone oil, etc. is preferably added to the composition for the preparation of color conversion film. Such a component is preferably added in an amount of 100 to 2,000 ppm, more preferably from 500 to 1,000 ppm, relative to the whole composition.

<Other Components>

The color conversion composition of the present invention may contain a light stabilizer, an antioxidant, a processing heat stabilizer, a light fastness stabilizer such as ultraviolet absorber, a silicone fine particle, and a silane coupling agent, other than the compound represented by formula (1) or (3) and a binder resin.

The light stabilizer includes a tertiary amine, a catechol derivative, and a nickel compound but is not particularly limited. One of these light stabilizers may be used alone, or a plurality thereof may be used in combination.

The antioxidant includes a phenol-based antioxidant such as 2,6-di-tert-butyl-p-cresol and 2,6-di-tert-butyl-4-ethylphenol but is not particularly limited. One of these antioxidants may be used alone, or a plurality thereof may be used in combination.

The processing heat stabilizer includes a phosphorus-based stabilizer such as tributyl phosphite, tricyclohexyl phosphite, triethylphosphine and diphenylbutylphosphine but is not particularly limited. One of these stabilizers may be used alone, or a plurality thereof may be used in combination.

The light fastness stabilizer includes, for example, benzotriazoles such as 2-(5-methyl-2-hydroxyphenyl) benzotriazole and 2-[2-hydroxy-3,5-bis (α,α-dimethylbenzyl) phenyl]-2H-benzotriazole but is not particularly limited. One of these light fastness stabilizers may be used alone, or a plurality thereof may be used in combination.

The content of such an additive in the color conversion composition of the present invention may vary depending on the molar extinction coefficient, fluorescence quantum yield and absorption intensity at excitation wavelength of the compound and the thickness or transmittance of the film formed, but the content is usually from $1.0\times10^{-3}$ to 30 parts by weight, preferably from $1.0\times10^{-2}$ to 15 parts by weight, more preferably from $1.0\times10^{-1}$ to 10 parts by weight, per 100 parts by weight of the component (B).

<Solvent>

The color conversion composition of the present invention may contain a solvent. The solvent is not particularly limited as long as it can adjust the viscosity of the resin in the flowing state and does not excessively affect the emission from luminescent substance and the durability. The solvent includes, for example, toluene, methyl ethyl ketone, methyl isobutyl ketone, hexane, acetone, terpineol, texanol, methyl cellosolve, butyl carbitol, butyl carbitol acetate, and propylene glycol monomethyl ether acetate. It is also possible to mix and use two or more kinds of these solvents. Among these solvents, toluene does not affect deterioration of the compound represented by formula (1) or (3), leaves less residual solvent after drying and therefore, is suitably used.

<Production Method of Color Conversion Composition>

One example of the method for producing the color conversion composition of the present invention is described below. Predetermined amounts of the above-described compound represented by formula (1) or (3), binder resin, solvent, etc. are mixed. After mixing these components to afford a predetermined composition, the mixture is homogeneously mixed and dispersed by means of a mixer/kneader such as homogenizer, rotation-revolution stirrer, three-roll mill, ball mill, planetary ball mill or beads mill, to obtain a color conversion composition. After mixing/dispersing or in the process of mixing/dispersing, defoaming is also preferably performed under a vacuum or reduced-pressure condition. In addition, it may also be possible to mix specific components in advance or apply a treatment such as aging. The solvent may be removed by an evaporator to give a desired solid content concentration.

<Preparation Method of Color Conversion Film>

In the present invention, the configuration of the color conversion film is not limited as long as the film contains a cured product of the color conversion composition. In the color conversion film, the cured product of the color conversion composition is preferably contained as a layer obtained by curing the color conversion composition.

Figure 2:
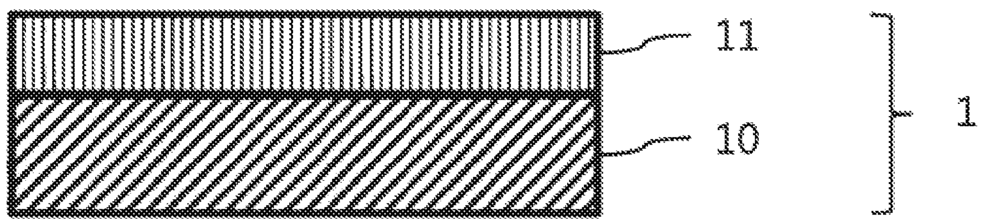
FIG. 2 is a schematic cross-sectional view illustrating one example of the color conversion film of the present invention.
Figure 3:
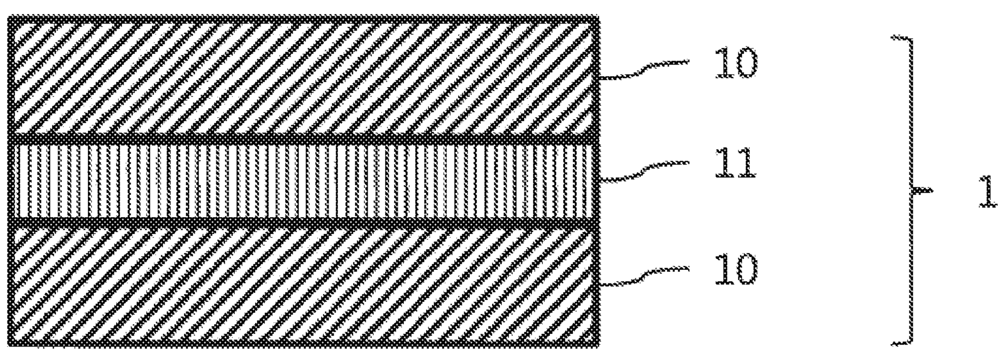
FIG. 3 is a schematic cross-sectional view illustrating one example of the color conversion film of the present invention.
Figure 4:
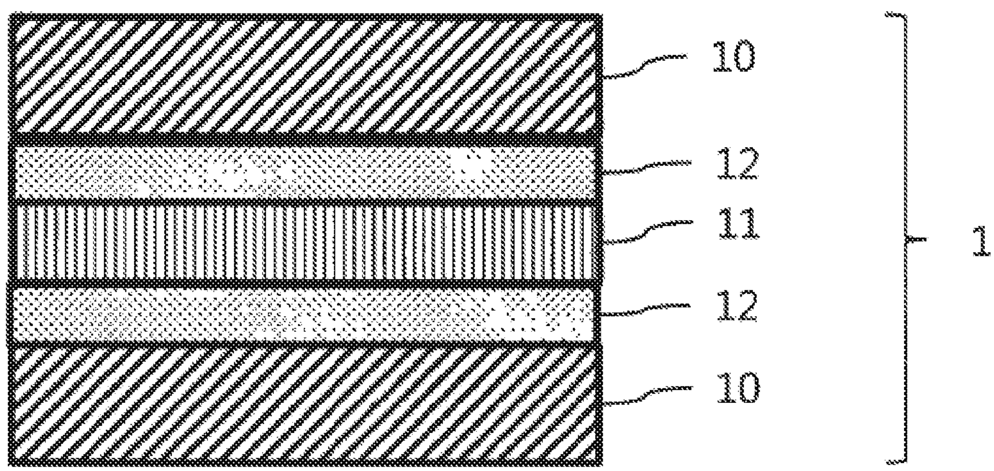
FIG. 4 is a schematic cross-sectional view illustrating one example of the color conversion film of the present invention.

Representative structural examples of the color conversion film include a film consisting of, as illustrated in FIG. 1, only a color conversion layer 11, a laminate including, as illustrated in FIG. 2, a substrate 10 and a color conversion layer 11 obtained by curing the color conversion composition, and a laminate including, as illustrated in FIG. 3, a color conversion layer 11 sandwiched by a plurality of substrate layers 10. In the color conversion film, as illustrated in FIG. 4, a barrier film 12 may be further provided so as to prevent deterioration of the color conversion layer due to oxygen, water or heat.

(Substrate Layer)

As the substrate layer, known metal, film, glass, ceramic, paper, etc. can be used without any particular limitation. Specifically, the substrate includes a metal sheet or foil such as aluminum (including an aluminum alloy), zinc, copper and iron; a film of plastic such as cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin and thermoplastic fluororesin that is a tetrafluoroethylene-ethylene copolymer (ETFE); a film of plastic including α-polyolefin resin, polycaprolactone resin, acrylic resin, silicone resin, or a copolymerized resin thereof with ethylene; paper having laminated thereon the plastic above; paper coated with the plastic above: paper having laminated or vapor-deposited thereon the metal above; and a plastic film having laminated or vapor-deposited thereon the metal above. In the case where the substrate is a metal sheet, the surface may be subjected to chrome- or nickel-plating or ceramic treatment.

Among these, in view of easy preparation of the color conversion film and easy molding of the color conversion film, glass or a resin film is preferably used. In the case of handling a film-like substrate, a film having high strength is preferred so as to remove the fear of rupture. In view of these required properties or profitability, a resin film is preferred, and among others, in view of profitability and handleability, a plastic film selected from the group consisting of PET, polyphenylene sulfide, polycarbonate and polypropylene is preferred. In the case of drying the color conversion film or in the case of performing pressure bonding and molding of the color conversion film by means of an extruder at a high temperature of 200° C. or more, a polyimide film is preferred in view of heat resistance. For the reason that separation of the sheet is facilitated, the surface of the substrate layer may be previously subjected to a release treatment.

The thickness of the substrate layer is not particularly limited, but the lower limit thereof is preferably 25 μm or more, more preferably 38 μm or more, and the upper limit thereof is preferably 5,000 μm or less, more preferably 3,000 μm or less.

(Color Conversion Layer)

One example of the method for producing the color conversion layer of the color conversion film of the present invention is described below. A color conversion composition prepared by the above-described method is applied onto a substrate and dried. The coating can be performed by means of a reverse roll coater, a blade coater, a slit die coater, a direct gravure coater, an offset gravure coater, a kiss coater, a natural roll coater, an air knife coater, a roll blade coater, a baribar roll blade coater, a two-stream coater, a rod coater, a wire bar coater, an applicator, a dip coater, a curtain coater, a spin coater, a knife coater, etc. In order to achieve thickness uniformity of the color conversion layer, the composition is preferably coated by means of a slit die coater.

The color conversion layer can be dried using a general heating apparatus such as hot air drier or infrared drier. For the heating of the color conversion film, a general heating apparatus such as hot air drier or infrared drier is used. In this case, the heating conditions are usually from 40 to 250° C. and from 1 minute to 5 hours, preferably from 60 to 200° C. and from 2 minutes to 4 hours. It is also possible to perform stepwise heating/curing such as step-cure.

After preparing the color conversion layer, the substrate may be changed, if desired. In this case, the simple method includes, but is not limited to, for example, a method of re-laminating the substrate by using a hot plate, and a method using a vacuum laminator or a dry film laminator.

The thickness of the color conversion layer is not particularly limited but is preferably from 10 to 1,000 μm. If the thickness is less than 10 μm, there arises a problem that the toughness of the film is reduced. If the thickness exceeds 1,000 μm, cracking is likely to occur, and it is difficult to mold a color conversion film. The thickness thereof is more preferably from 30 to 100 μm.

On the other hand, from the viewpoint of increasing the heat resistance of the color conversion film, the thickness of the color conversion film is preferably 200 μm or less, more preferably 100 μm or less, still more preferably 50 μm or less.

The thickness of the color conversion film as used in the present invention indicates the film thickness (average film thickness) measured based on JIS K7130 (1999), Plastics-Film and sheeting-Determination of thickness, Measurement Method A, a method of measuring the thickness by mechanical scanning.

(Barrier Film)

The barrier film includes a film appropriately used in the case of improving the gas barrier property for the color conversion layer, for example, a metal oxide or metal nitride thin film including an inorganic oxide such as silicon oxide, aluminum oxide, titanium oxide, tantalum oxide, zinc oxide, tin oxide, indium oxide, yttrium oxide and magnesium oxide, an inorganic nitride such as silicon nitride, aluminum nitride, titanium nitride and silicon carbide nitride, a mixture thereof, or the oxide or nitride having added thereto another element, and a film including various resins such as polyvinylidene chloride, acrylic resin, silicon-based resin, melamine-based resin, urethane-based resin, fluororesin, or a polyvinyl alcohol-based resin, e.g., saponified vinyl acetate. The film having a barrier function against water includes, for example, a film including various resins such as polyethylene, polypropylene, nylon, polyvinylidene chloride, vinylidene chloride-vinyl chloride copolymer, vinylidene chloride-acrylonitrile copolymer, fluoro resin and polyvinyl alcohol-based resin, e.g., saponified vinyl acetate.

The barrier film may be provided, as illustrated in FIG. 4, on both surfaces of the color conversion layer 11 or may be provided only on one surface thereof.

In addition, an auxiliary layer having an antireflection function, an antiglare function, an antireflection-antiglare function, a hardcoat function (anti-friction function), an antistatic function, an antifouling function, an electromagnetic wave shielding function, an infrared cutting function, an ultraviolet cutting function, a polarizing function, or a toning function may be further provided according to the function required of the color conversion film.

<Excitation Light>

As for the kind of excitation light, any excitation light may be used as long as it produces light in the wavelength region where the mixed luminescent substance, such as compound represented by formula (1) or (3), can absorb light. For example, excitation light from any of a fluorescent light source such as hot cathode tube, cold cathode tube and inorganic EL, an organic electroluminescence element light source, an LED, an incandescent light source, sunlight, etc. can be utilized in principle.

In particular, an LED is suitable excitation light and in the display or lighting applications, from the viewpoint that color purity of blue light is enhanced, a blue LED having excitation light in the range of 430 to 500 nm is more suitable excitation light.

The excitation light may have light having one kind of an emission peak or two or more kinds of emission peaks, but in order to increase the color purity, excitation light having one kind of an emission peak is preferred. It is also possible to combine and use a plurality of excitation light sources differing in the kind of emission peak.

<Light Source Unit>

The light source unit in the present invention is configured to include at least a light source and the above-described color conversion film. The method for disposing a light source and the color conversion film is not particularly limited, and the unit may have a configuration where a light source is firmly attached to the color conversion film, or may employ a remote phosphor system, in which a light source from the color conversion film is separated. In addition, for the purpose of increasing the color purity, the unit may have a configuration further including a color filter. As described above, the excitation energy of excitation light with a wavelength of 430 to 500 nm is relatively small and since decomposition of the luminescent substance such as compound represented by formula (1) or (3) can be prevented, the light source is preferably a light-emitting diode having maximum light emission in the range of 430 to 500 nm, more preferably from 450 to 470 nm.

In addition, it is preferred that the light source is a light-emitting diode having an emission wavelength peak in the range of 430 to 470 nm and an emission wavelength region in the range of 400 to 500 nm and the emission spectrum of the light-emitting diode satisfies mathematical expression (1):

[Math. 1]

$$1>\beta/\alpha\geq 0.15 \quad (1)$$

in which α is a light emission intensity at the emission wavelength peak of the emission spectrum, and β is a light emission intensity at the wavelength of emission wavelength peak+15 nm.

The light source unit in the present invention may be used in applications such as display, lighting, interior, indicator and signboard but, among others, is suitably used for the display or lighting applications.

EXAMPLES

The present invention is described below by referring to Examples, but the present invention is not limited by these Examples.

The compounds in the following Examples and Comparative Examples are the compounds shown below.

[Chem. 24]

G-1

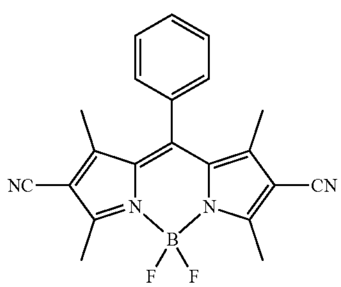

G-2

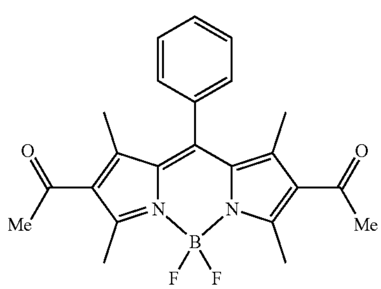

G-3

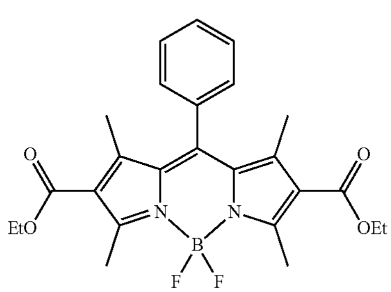

-continued

R-1

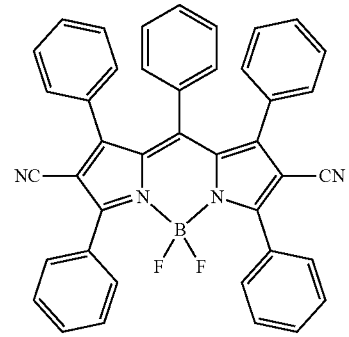

R-2

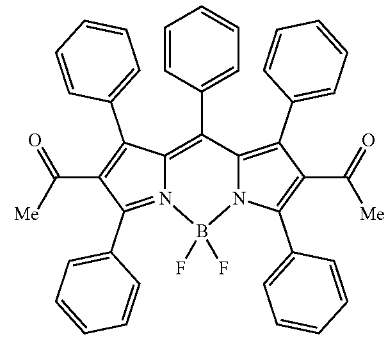

R-3

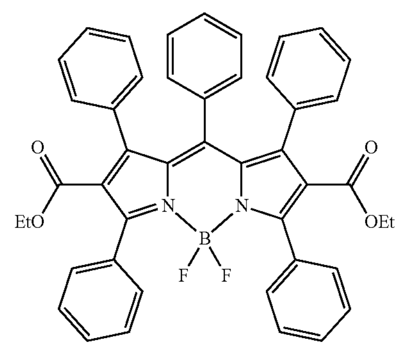

R-4

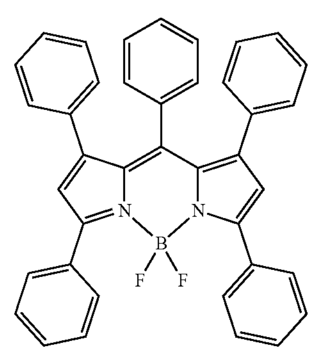

-continued
[Chem. 25]
G-4
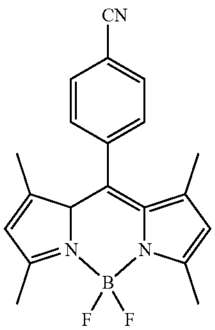
G-5
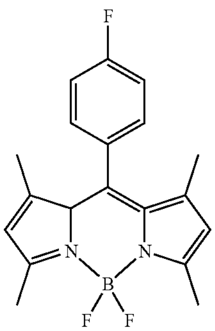
G-6
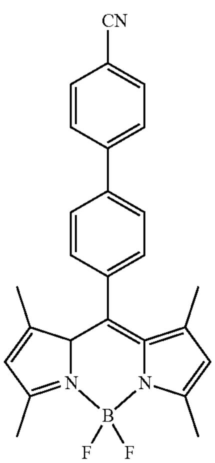
G-7
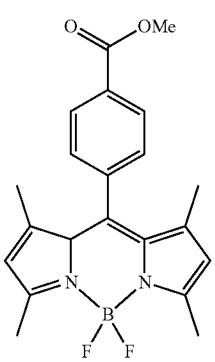
-continued
G-8
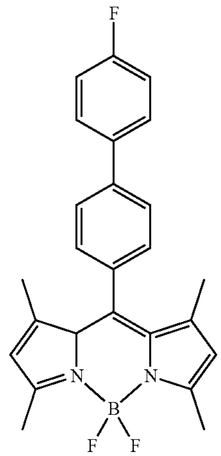
G-9
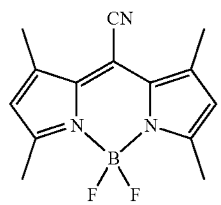
G-10
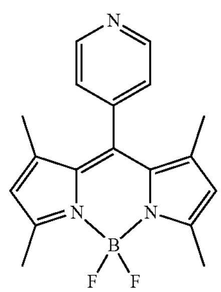
G-11
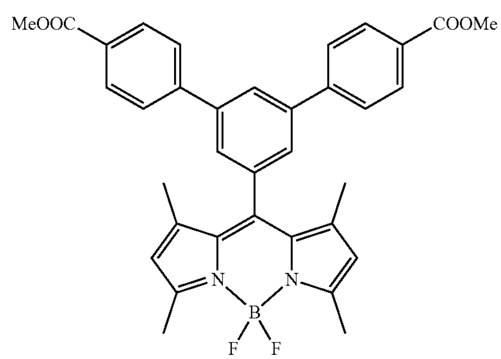
G-12
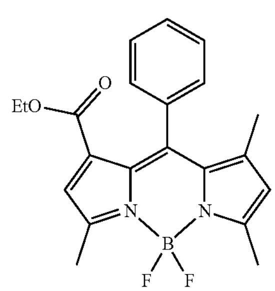

-continued
G-13
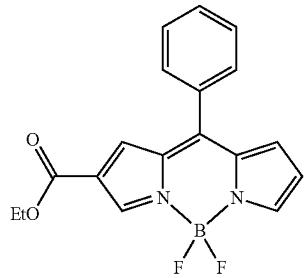
G-14
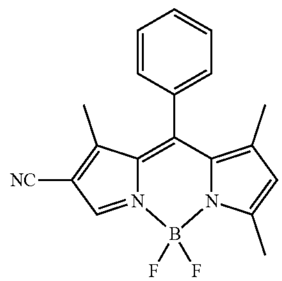
G-15
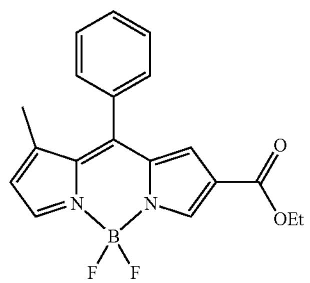
G-16
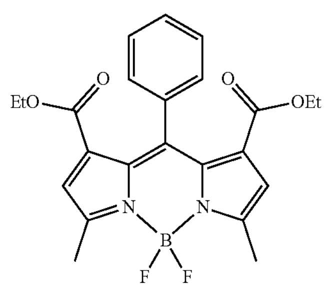
G-17
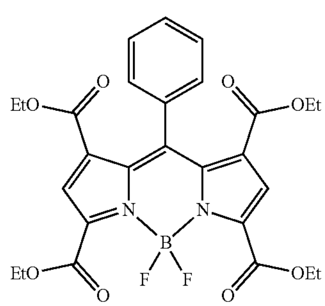
-continued
[Chem. 26]
G-18
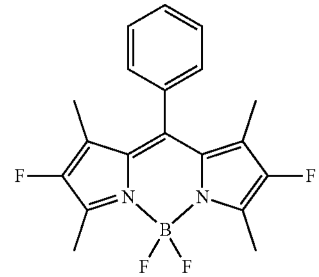
G-19
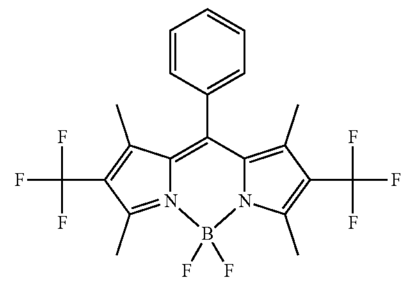
G-20
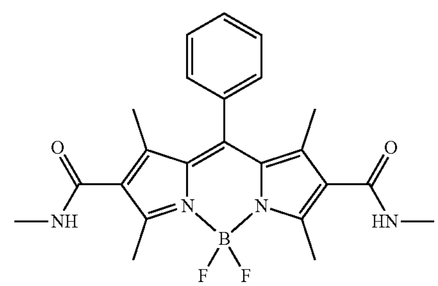
G-21
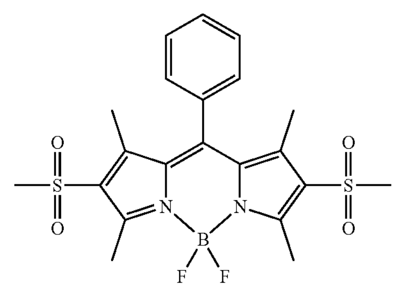
G-22
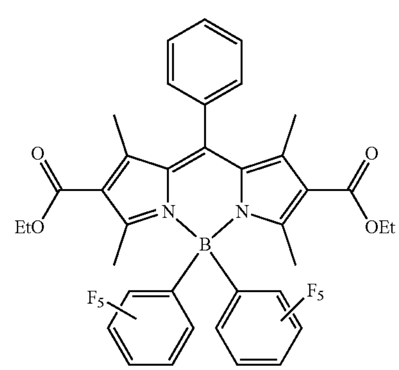

-continued
G-23
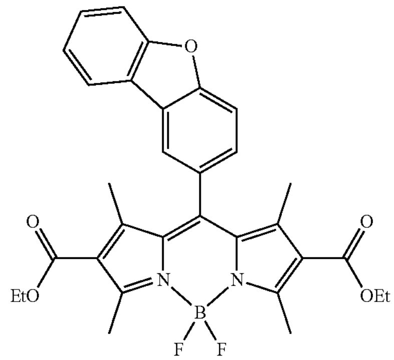
G-24
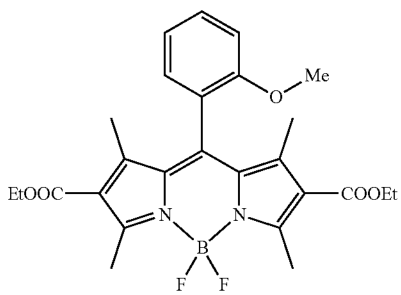
G-25
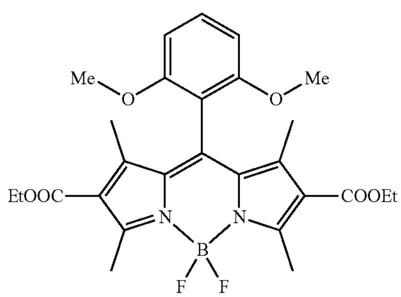
G-26
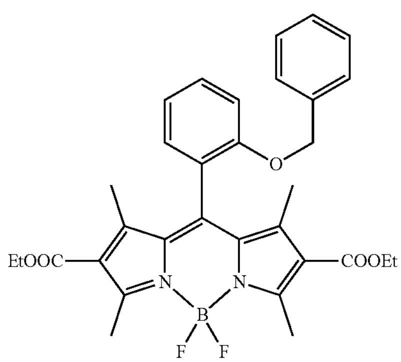
G-27
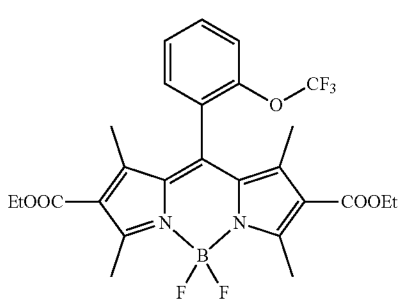
-continued
G-28
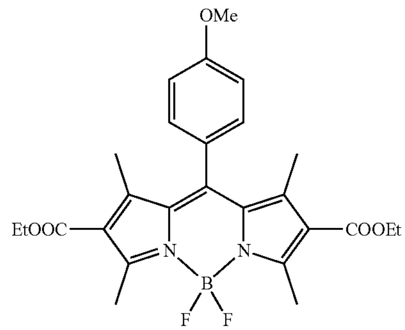
G-29
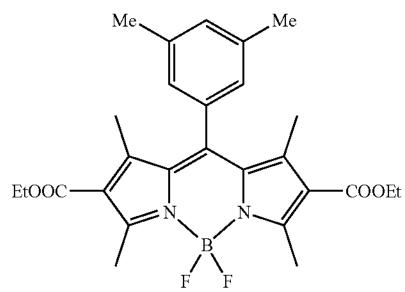
[Chem. 27]
G-30
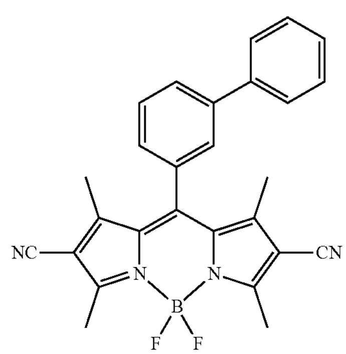
G-31
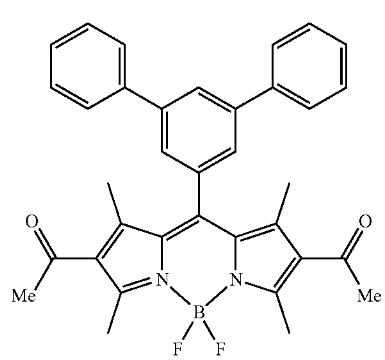

-continued
G-32
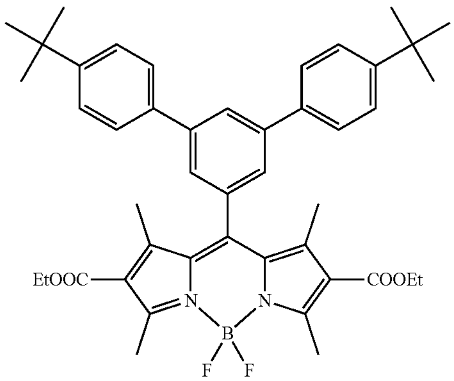
G-33
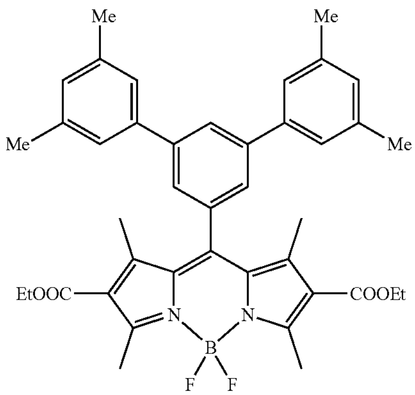
G-34
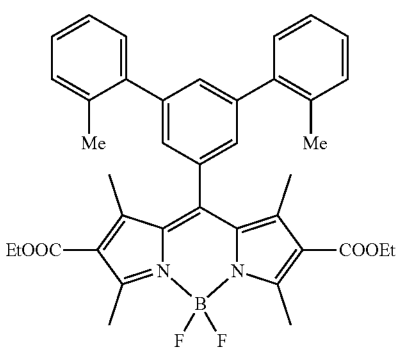
G-35
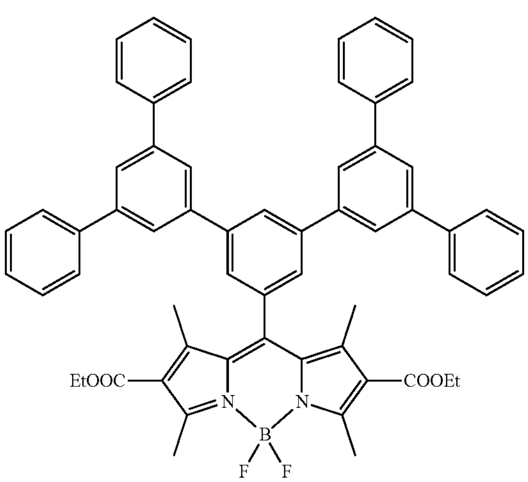
-continued
G-36
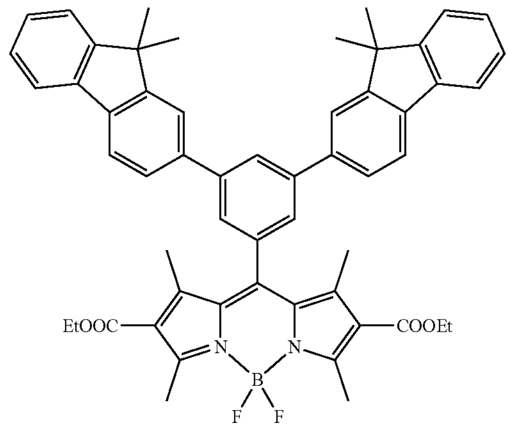
G-37
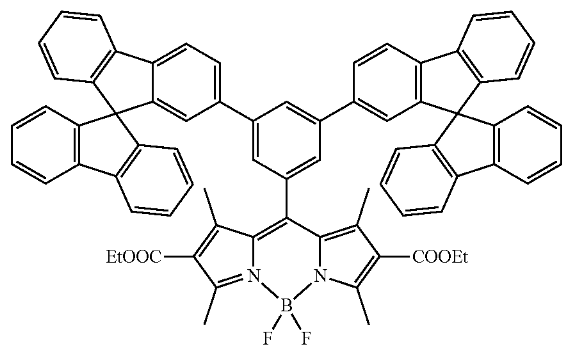
[Chem. 28]
R-5
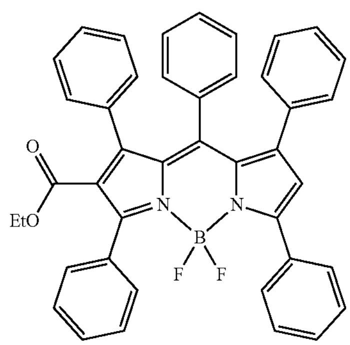
R-6
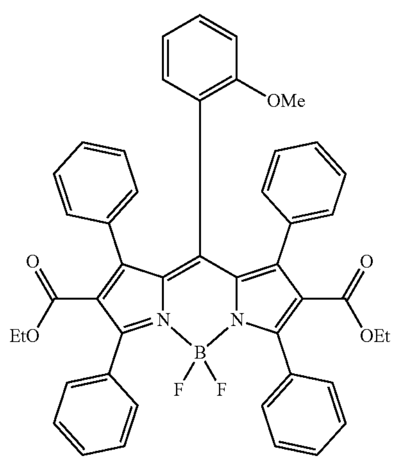

-continued
R-7
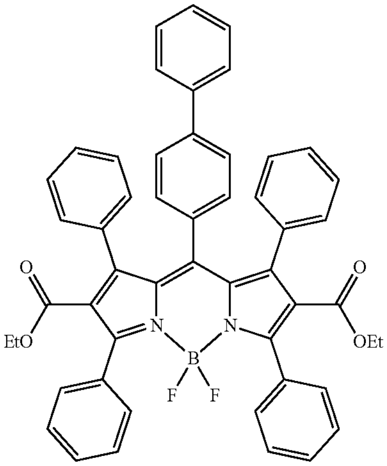
R-8
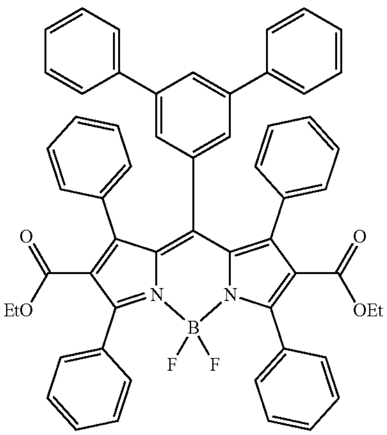
R-9
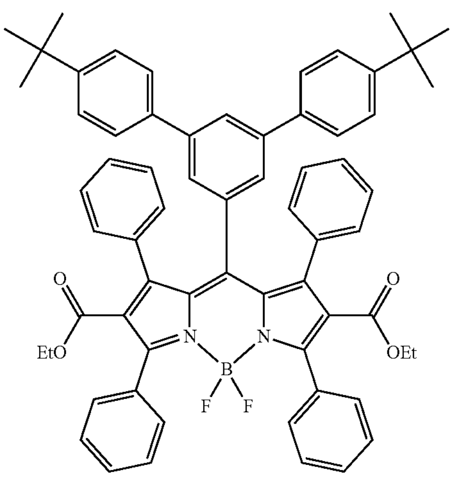
R-10
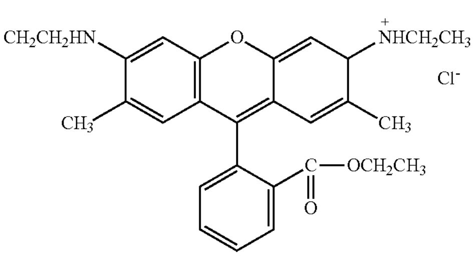
-continued
[Chem. 29]
G-101
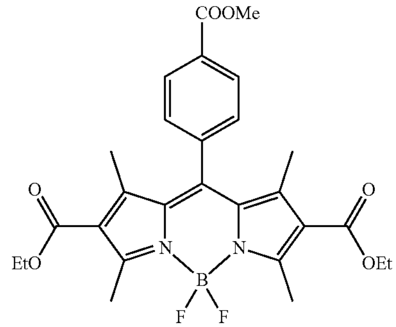
G-102
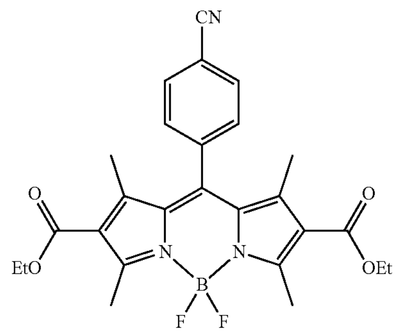
G-103
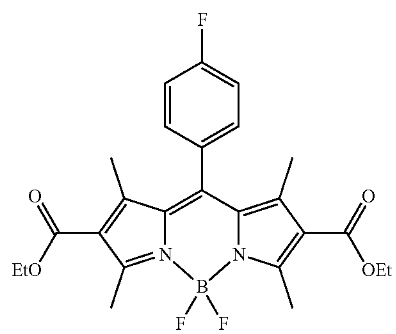
G-104
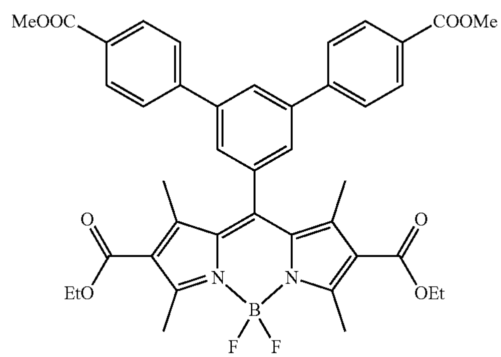

-continued
G-105
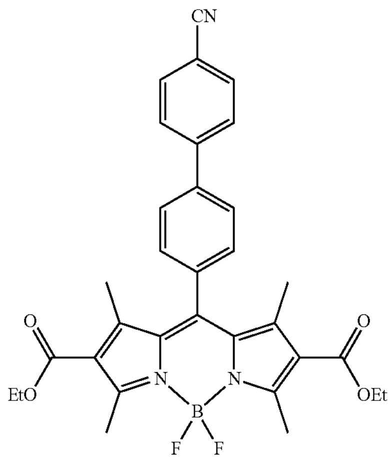
G-106
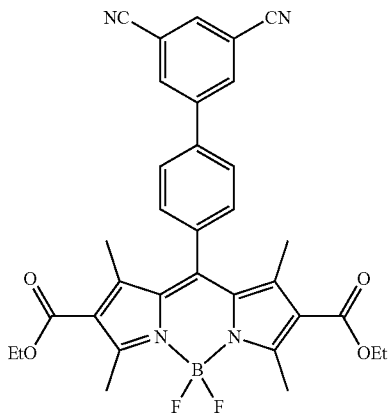
G-107
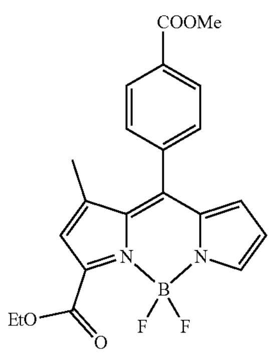
G-108
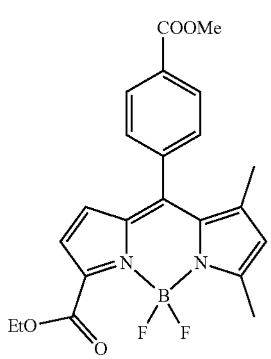
-continued
G-109
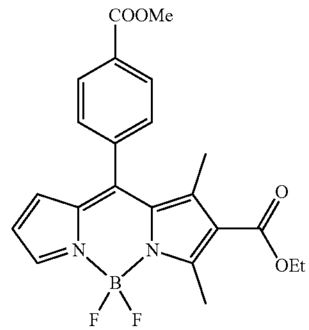
G-110
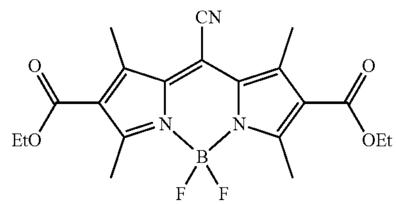
[Chem. 30]
G-111
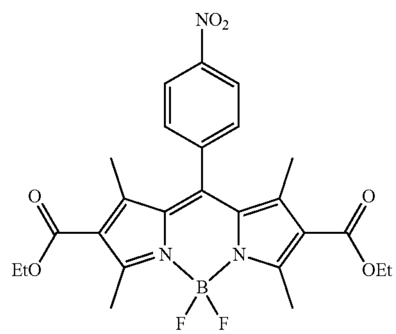
G-112
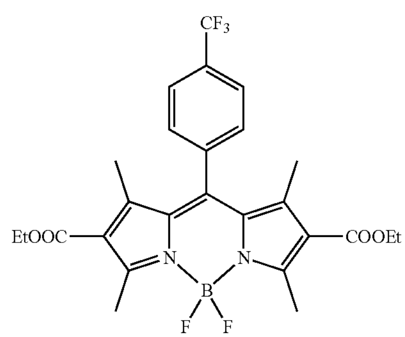
G-113
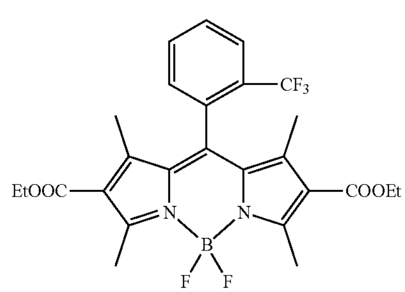

-continued
G-114
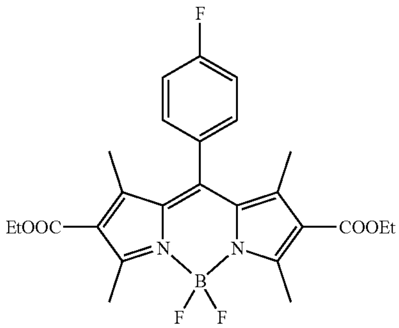
G-115
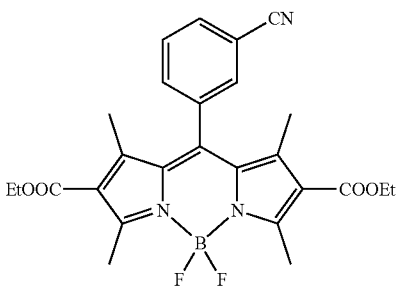
G-116
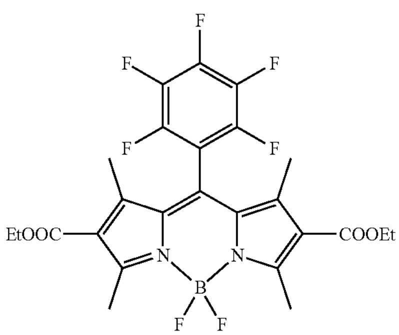
G-117
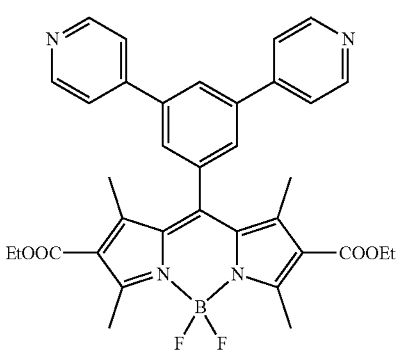
-continued
G-118
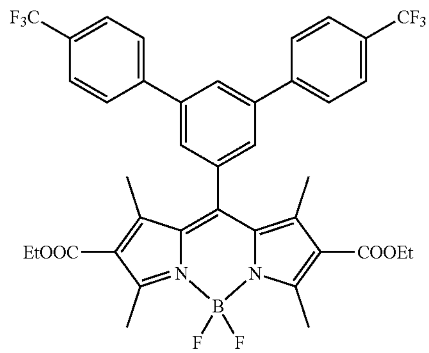
G-119
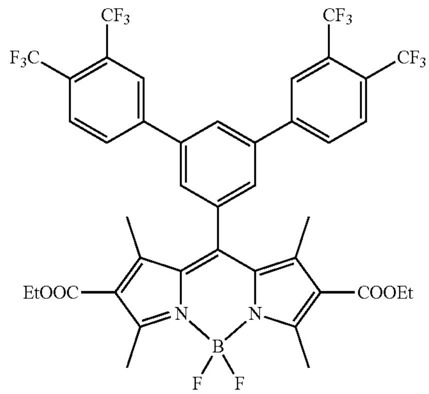
[Chem. 31]
R-101
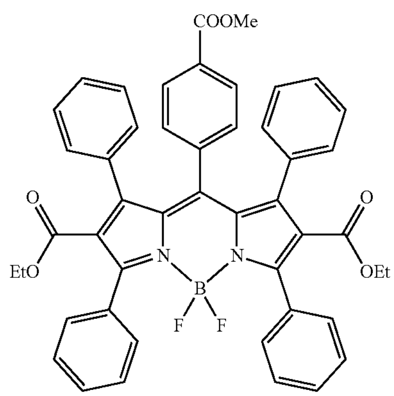
R-102
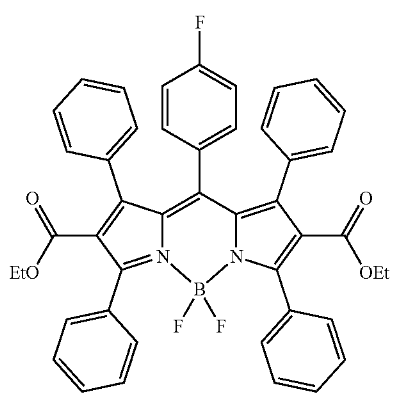

R-103
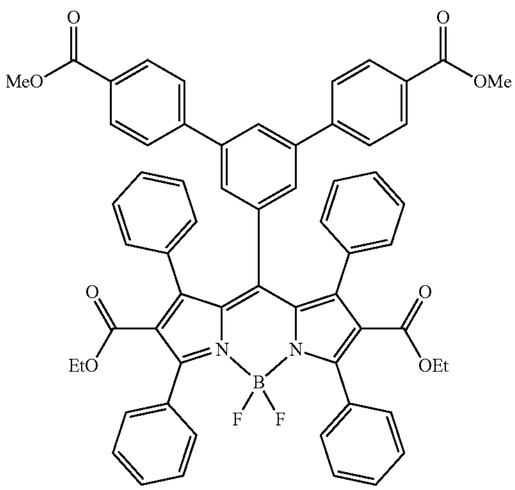
[Chem. 32]
G-201
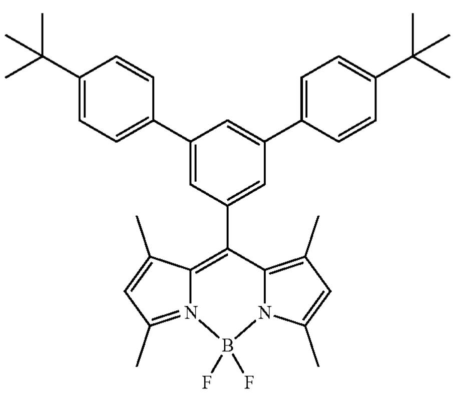
G-202
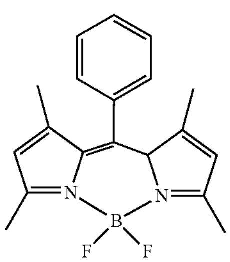
G-203
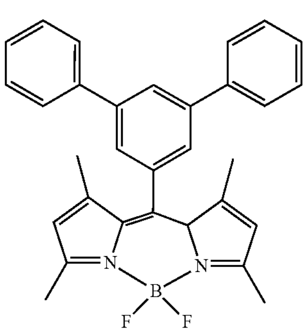
G-204
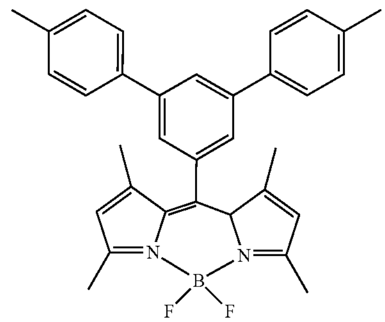
G-205
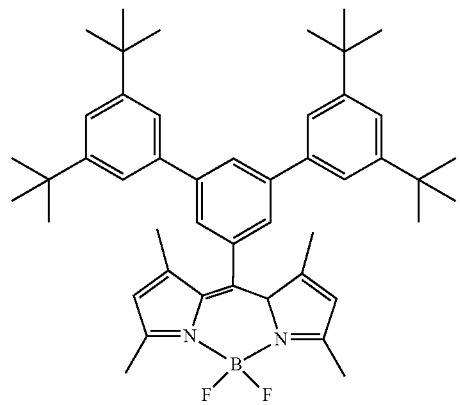
G-206
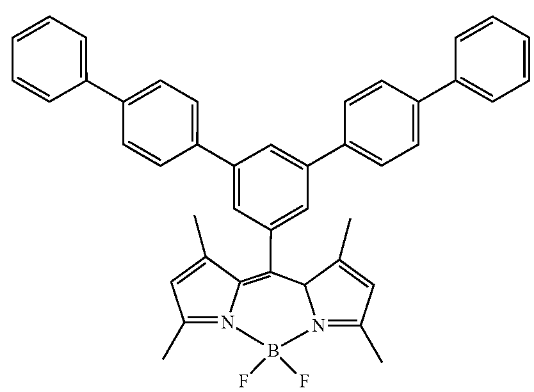
G-207
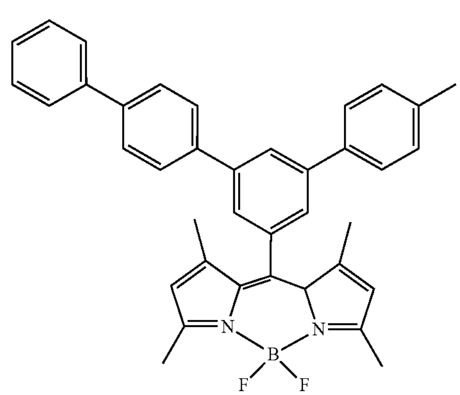

-continued

G-208

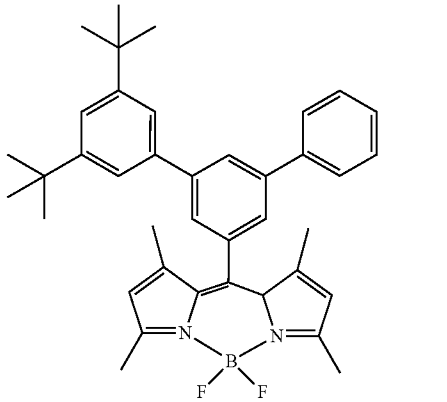

G-209

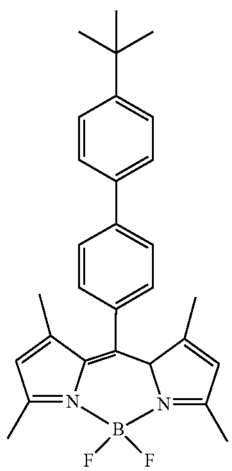

G-210

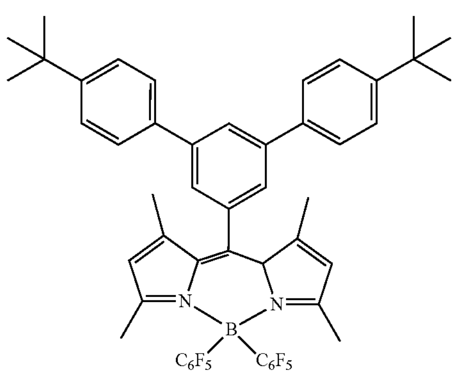

[Chem. 33]

G-301

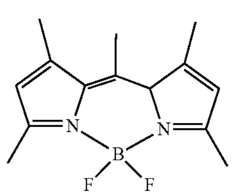

-continued

G-302

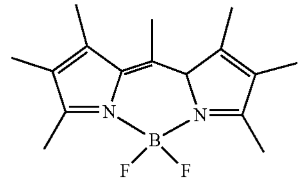

G-303

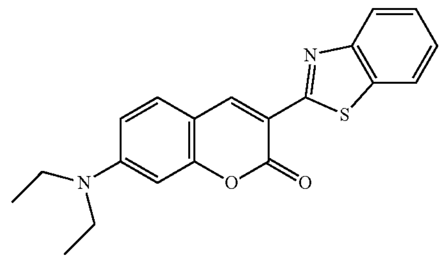

Evaluation methods as to structural analysis are described below.

<Measurement of $^1$H-NMR>

$^1$H-NMR of the compound was measured with a deuterated chloroform solution by using superconducting FTNMR EX-270 (manufactured by JEOL Ltd.).

<Measurement of Absorption Spectrum>

The absorption spectrum of the compound was measured on Spectrophotometer U-3200 (manufactured by Hitachi, Ltd.) after dissolving the compound in toluene at a concentration of $1\times10^{-6}$ mol/L.

<Measurement of Fluorescence Spectrum>

As for the fluorescence spectrum of the compound, the fluorescence spectrum at the time of dissolving the compound in toluene at a concentration of $1\times10^{-6}$ mol/L and exciting the solution at a wavelength of 460 nm was measured on Spectrofluorophotometer F-2500 (manufactured by Hitachi, Ltd.).

<Measurement of Color Conversion Characteristics>

An LED was lighted by flowing a current of 10 mA to a light emitting device having mounted therein each color conversion film and a blue LED element (Model Number PM2B-3LBE-SD, manufactured by ProLight, emission peak wavelength: 460 nm) and measured for the emission spectrum, half-value width, light emission intensity at peak wavelength, and chromaticity by using a spectral radiance meter (CS-1000, manufactured by KONICA MINOLTA, INC.). Here, the light emission intensity was measured with a given irradiation intensity and therefore, a high light emission intensity means that the luminous efficiency is high. That is, the luminous efficiency was evaluated by measuring the light emission intensity. In addition, since the color purity is higher as the half-value width is narrower, the color purity was evaluated by measuring the half-value width. The distance between each color conversion film and the blue LED element was set to be 3 cm.

Synthesis Example 1

Synthesis Method of Compound G-201

3,5-Dibromobenzaldehyde (3.0 g), 4-tert-butylphenylboronic acid (5.3 g), tetrakis (triphenylphosphine) palladium (0) (0.4 g), and potassium carbonate (2.0 g) were put in a flask and purged with nitrogen. Deaerated toluene (30 mL) and deaerated water (10 mL) were added thereto, and the mixture was refluxed for 4 hours. The reaction solution was cooled to room temperature, and the organic layer was subjected to liquid separation and then washed with a saturated saline solution. This organic layer was dried over magnesium sulfate and after filtration, the solvent was distilled off. The obtained reaction product was purified by silica gel chromatography to obtain 3,5-bis(4-tert-butylphenyl)benzaldehyde (3.5 g) as a white solid.

3,5-Bis(4-tert-butylphenyl)benzaldehyde (1.5 g) and 2,4-dimethylpyrrole (0.7 g) were put in the reaction solution and after adding dehydrated dichloromethane (200 mL) and trifluoroacetic acid (1 drop), the solution was stirred in a nitrogen atmosphere for 4 hours. A dehydrated dichloromethane solution of 2,3-dichloro-5,6-dicyano-1,4-benzoquinone (0.85 g) was added, and the solution was further stirred for 1 hour. After the completion of reaction, boron trifluoride-diethyl ether complex (7.0 mL) and diisopropylethylamine (7.0 mL) were added, followed by stirring for 4 hours. Then, water (100 mL) was added, followed by stirring, and the organic layer was obtained by liquid separation. This organic layer was dried over magnesium sulfate and after filtration, the solvent was distilled off. The obtained reaction product was purified by silica gel chromatography to obtain 0.4 g of Compound G-1 shown below (yield: 18%).

$^1$H-NMR ($CDCl_3$, ppm): 7.95 (s, 1H), 7.63-7.48 (m, 10H), 6.00 (s, 2H), 2.58 (s, 6H), 1.50 (s, 6H), 1.37 (s, 18H).

Figure 5:
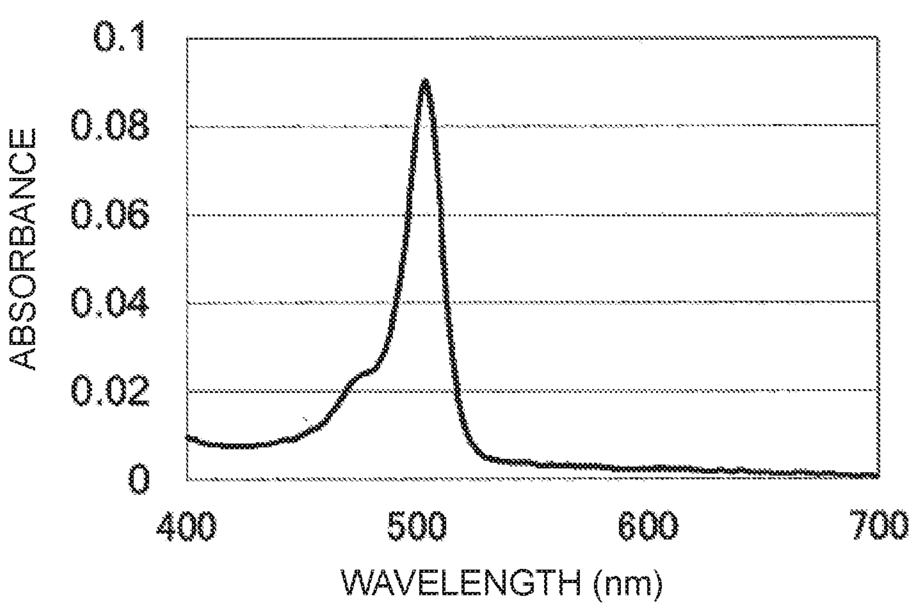
FIG. 5 is an absorption spectrum of the compound of Synthesis Example 1.
Figure 6:
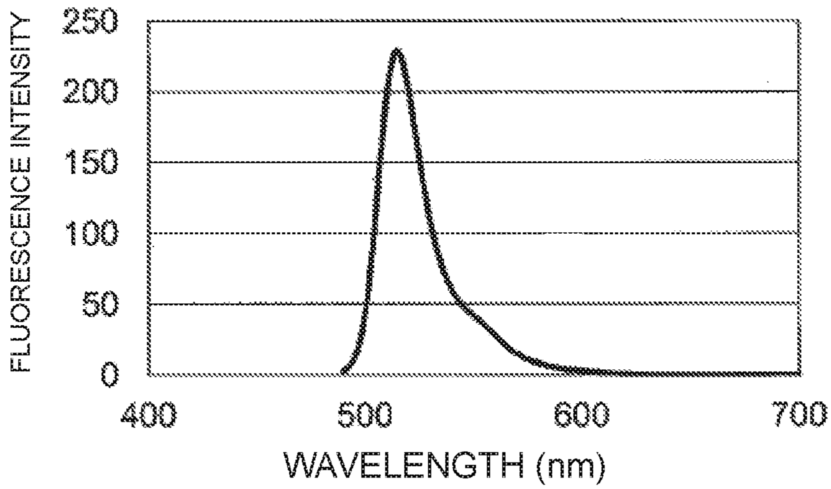
FIG. 6 is an emission spectrum of the compound of Synthesis Example 1.

The absorption spectrum of this compound was as illustrated in FIG. 5 and exhibited light absorption characteristics with a blue excitation light source (460 nm). The fluorescence spectrum was illustrated in FIG. 6 and exhibited a sharp emission peak in the green region. The compound exhibited a fluorescence quantum yield of 83% and was a compound capable of efficient color conversion.

Synthesis Example 2

Synthesis Method of Compound G-32:

Compound G-32 was synthesized in the same manner as in Synthesis Example 1 except that ethyl 2,4-dimethylpyrrole-3-carboxylate was used as the pyrrole raw material in place of 2,4-dimethylpyrrole.

Synthesis Example 3

Synthesis Method of Compound G-104:

Compound G-104 was synthesized in the same manner as in Synthesis Example 2 except that 4-(methoxycarbonyl)phenylboronic acid was used as the boronic acid raw material in place of 4-tert-butylphenylboronic acid.

Embodiment 1A

<Light Durability Test>

An LED chip was lighted by flowing a current of 10 mA to a light emitting device having mounted therein each color conversion film and a blue LED element (Model Number PM2B-3LBE-SD, manufactured by ProLight, emission peak wavelength: 460 nm) and measured for the initial luminance by using a spectral radiance meter (CS-1000, manufactured by KONICA MINOLTA, INC.). Here, the distance between each color conversion film and the blue LED element was set to be 3 cm. Thereafter, light from the blue LED element was continuously irradiated at room temperature, and the light durability was evaluated by observing the time until the luminance was reduced by a certain amount.

Example 1

0.20 Parts by weight of Compound G-1 as a luminescent material and 0.5 parts by weight of a curing agent were mixed per 100 parts by weight of silicone resin "OE-6630A/B" (produced by Dow Corning Toray Co., Ltd.), and the mixture was stirred and defoamed at 1,000 rpm for 20 minutes by using a planetary stirring/defoaming device, "MAZERUSTAR KK-400" (manufactured by KURABO INDUSTRIES LTD.), to obtain a color conversion composition as a resin liquid for film preparation.

The resin liquid for film preparation was applied onto "Cerapeel" BLK (produced by Toray Advanced Film Co., Ltd.) by use of a slit die coater, heated at 130° C. for 2 hours, and dried to obtain a color conversion film having a thickness of 200 μm.

Color conversion of blue LED light was performed using the color conversion film above, as a result, when only the green light emission region was extracted, high-color-purity green emission showing a peak wavelength of 530 nm and providing an emission spectrum with the half width at the peak wavelength of 25 nm was obtained. The light emission intensity at the peak wavelength was 1.12 in terms of relative value when the intensity in Comparative Example 1 described later is taken as 1.00. In addition, when light from the blue LED element was continuously irradiated at room temperature, the time until the luminosity was reduced by 5% was 210 hours.

Examples 2 to 45 and Comparative Examples 1 to 3

Color conversion films were prepared and evaluated in the same manner as in Example 1 except that the compound shown in Table 2 was used as the luminescent material. The results are shown in Table 2. Here, Light Emission Intensity (relative value) in the Table is a relative value when the intensity in Comparative Example 1 is taken as 1.00.

Example 46

0.20 Parts by weight of Compound G-1, 0.08 parts by weight of Compound R-1, as luminescent materials, and 0.5 parts by weight of a curing agent were mixed per 100 parts by weight of two-component thermosetting epoxy-based acrylic resin, and the mixture was stirred at 300 rpm for 1 hour to produce a composition.

The composition above was applied onto a stretched polyethylene terephthalate film (XG5P1, produced by Toray Advanced Materials Inc.) by use of a bar coating system and then dried at 120° C. for 5 minutes to form a coating layer having an average film thickness of 10 μm. Thereafter, a diffusion film ("Texcell" (registered trademark) TDF127, produced by Toray Advanced Materials Inc.) was laminated and then matured at 60° C. for 1 hour to obtain a color conversion film.

Color conversion of blue LED light was performed using the color conversion film above, as a result, when only the green light emission region was extracted, high-color-purity green emission showing a peak wavelength of 530 nm and providing an emission spectrum with the half width at the peak wavelength of 25 nm was obtained, whereas when only the red light emission region was extracted, high-color-purity red emission showing a peak wavelength of 637 nm and providing an emission spectrum with the half width at the peak wavelength of 47 nm was obtained. The light emission intensity at the peak wavelength was 1.13 for green emission and 1.07 for red emission, in terms of relative value when the intensity in Comparative Example 4 described later is taken as 1.00. In addition, when light from the blue LED element was continuously irradiated at room temperature, the time until the luminosity was reduced by 5% was 250 hours.

Examples 47 to 57 and Comparative Examples 4 and 5

Color conversion films were prepared and evaluated in the same manner as in Example 46 except that the compound shown in Table 3 was used as the luminescent material. The results are shown in Table 3. Here, Light Emission Intensity (relative value) in the Table is a relative value when the intensity in Comparative Example 4 is taken as 1.00.

TABLE 2

| | Luminescent Material | Peak Wave-length (nm) | Half-Value Width (nm) | Light Emission Intensity (relative value) | Light Durability (h) |
|---|---|---|---|---|---|
| Example 1 | G-1 | 530 | 25 | 1.12 | 210 |
| Example 2 | G-2 | 526 | 25 | 1.16 | 200 |
| Example 3 | G-3 | 524 | 25 | 1.20 | 230 |
| Example 4 | G-4 | 525 | 25 | 1.12 | 100 |
| Example 5 | G-5 | 525 | 25 | 1.12 | 110 |
| Example 6 | G-6 | 254 | 25 | 1.13 | 110 |
| Example 7 | G-7 | 525 | 25 | 1.13 | 120 |
| Example 8 | G-8 | 524 | 25 | 1.13 | 100 |
| Example 9 | G-9 | 540 | 25 | 1.10 | 100 |
| Example 10 | G-10 | 535 | 25 | 1.12 | 110 |
| Example 11 | G-11 | 524 | 25 | 1.20 | 120 |
| Example 12 | G-12 | 524 | 25 | 1.21 | 160 |
| Example 13 | G-13 | 524 | 25 | 1.05 | 210 |
| Example 14 | G-14 | 525 | 25 | 1.21 | 210 |
| Example 15 | G-15 | 524 | 25 | 1.21 | 210 |
| Example 16 | G-16 | 525 | 25 | 1.20 | 160 |
| Example 17 | G-17 | 524 | 25 | 1.05 | 170 |
| Example 18 | G-18 | 524 | 25 | 1.20 | 210 |
| Example 19 | G-19 | 525 | 25 | 1.21 | 220 |
| Example 20 | G-20 | 530 | 25 | 1.21 | 210 |
| Example 21 | G-21 | 535 | 25 | 1.20 | 220 |
| Example 22 | G-22 | 524 | 25 | 1.21 | 210 |
| Example 23 | G-23 | 524 | 25 | 1.20 | 210 |
| Example 24 | G-24 | 524 | 25 | 1.34 | 210 |
| Example 25 | G-25 | 525 | 25 | 1.32 | 200 |
| Example 26 | G-26 | 524 | 25 | 1.32 | 220 |
| Example 27 | G-27 | 525 | 25 | 1.32 | 210 |
| Example 28 | G-28 | 525 | 25 | 1.33 | 200 |
| Example 29 | G-29 | 525 | 25 | 1.33 | 200 |
| Example 30 | G-30 | 540 | 25 | 1.41 | 220 |
| Example 31 | G-31 | 535 | 25 | 1.42 | 210 |
| Example 32 | G-32 | 524 | 25 | 1.45 | 310 |
| Example 33 | G-33 | 525 | 25 | 1.45 | 320 |
| Example 34 | G-34 | 524 | 25 | 1.44 | 310 |
| Example 35 | G-35 | 525 | 25 | 1.47 | 330 |
| Example 36 | G-36 | 525 | 25 | 1.47 | 320 |
| Example 37 | G-37 | 524 | 25 | 1.47 | 320 |
| Example 38 | R-1 | 637 | 47 | 1.07 | 440 |
| Example 39 | R-2 | 635 | 47 | 1.09 | 410 |
| Example 40 | R-3 | 635 | 47 | 1.09 | 450 |
| Example 41 | R-5 | 635 | 47 | 1.08 | 450 |
| Example 42 | R-6 | 634 | 47 | 1.21 | 440 |
| Example 43 | R-7 | 635 | 47 | 1.25 | 450 |
| Example 44 | R-8 | 634 | 47 | 1.26 | 430 |
| Example 45 | R-9 | 635 | 47 | 1.28 | 450 |
| Comparative Example 1 | G-303 | 501 | 55 | 1.00 | 20 |
| Comparative Example 2 | R-4 | 630 | 47 | 1.00 | 20 |
| Comparative Example 3 | R-10 | 605 | 90 | 0.80 | 18 |

TABLE 3

| | Luminescent Material | | Peak Wave-length | Half-Value Width | Light Emission Intensity (relative value) | | Light Durability |
|---|---|---|---|---|---|---|---|
| | (a) | (b) | (nm) | (nm) | (a) | (b) | (h) |
| Example 46 | G-1 | R-1 | 530, 637 | 25, 47 | 1.13 | 1.07 | 250 |
| Example 47 | G-2 | R-1 | 526, 637 | 25, 48 | 1.15 | 1.08 | 270 |
| Example 48 | G-3 | R-1 | 524, 637 | 25, 47 | 1.21 | 1.07 | 280 |
| Example 49 | G-101 | R-1 | 524, 637 | 25, 47 | 1.21 | 1.07 | 400 |
| Example 50 | G-104 | R-1 | 523, 637 | 25, 47 | 1.25 | 1.08 | 420 |
| Example 51 | G-201 | R-1 | 522, 637 | 25, 47 | 1.20 | 1.07 | 190 |
| Example 52 | G-3 | R-2 | 524, 635 | 25, 47 | 1.20 | 1.10 | 290 |
| Example 53 | G-3 | R-3 | 524, 635 | 25, 48 | 1.21 | 1.10 | 290 |
| Example 54 | G-3 | R-101 | 526, 635 | 25, 48 | 1.20 | 1.11 | 350 |
| Example 55 | G-202 | R-3 | 517, 635 | 25, 47 | 1.10 | 1.09 | 45 |
| Example 56 | G-3 | R-4 | 524, 630 | 25, 48 | 1.20 | 1.00 | 70 |
| Example 57 | G-303 | R-1 | 502, 630 | 55, 47 | 1.00 | 1.00 | 25 |
| Comparative Example 4 | G-303 | R-4 | 524, 629 | 55, 47 | 1.00 | 1.00 | 10 |
| Comparative Example 5 | G-303 | R-10 | 524, 605 | 55, 90 | 0.98 | 0.80 | 10 |

Example 58

0.30 Parts by weight of Compound G-101 as a luminescent material and 0.5 parts by weight of a curing agent were mixed per 100 parts by weight of silicone resin "OE-6630AB" (produced by Dow Corning Toray Co., Ltd.), and the mixture was stirred and defoamed at 1,000 rpm for 20 minutes by using a planetary stirring/defoaming device, "MAZERUSTAR KK-400" (manufactured by KURABO INDUSTRIES LTD.), to obtain a color conversion composition as a resin liquid for film preparation.

The resin liquid for film preparation was applied onto "Cerapeel" BLK (produced by Toray Advanced Film Co., Ltd.) by use of a slit die coater, heated at 130° C. for 2 hours, and dried to obtain a color conversion film having a thickness of 200 μm.

Color conversion of blue LED light was performed using the color conversion film above, as a result, when only the green light emission region was extracted, high-color-purity green emission showing a peak wavelength of 530 nm was obtained. The light emission intensity at the peak wavelength was 1.21 in terms of relative value when the intensity in Comparative Example 6 described later is taken as 1.00. In addition, when light from the blue LED element was continuously irradiated at room temperature, the time until the luminosity was reduced by 5% was 670 hours.

Examples 59 to 79 and Comparative Examples 6 to 9

Color conversion films were prepared and evaluated in the same manner as in Example 58 except that the compound shown in Table 4 was used as the luminescent material. The results are shown in Table 4. Here, Light Emission Intensity (relative value) in the Table is a relative value when the intensity in Comparative Example 6 is taken as 1.00.

TABLE 4

| | Luminescent Material | Peak Wave-length (nm) | Half-Value Width (nm) | Light Emission Intensity (relative value) | Light Durability (h) |
|---|---|---|---|---|---|
| Example 58 | G-101 | 530 | 25 | 1.21 | 670 |
| Example 59 | G-102 | 526 | 25 | 1.12 | 620 |
| Example 60 | G-103 | 524 | 25 | 1.18 | 630 |
| Example 61 | G-104 | 530 | 25 | 1.25 | 700 |
| Example 62 | G-105 | 526 | 25 | 1.18 | 670 |
| Example 63 | G-106 | 524 | 25 | 1.18 | 650 |
| Example 64 | G-107 | 525 | 25 | 1.05 | 500 |
| Example 65 | G-108 | 524 | 25 | 1.15 | 510 |
| Example 66 | G-109 | 524 | 25 | 1.20 | 620 |
| Example 67 | G-110 | 540 | 25 | 1.05 | 620 |
| Example 68 | G-111 | 527 | 25 | 1.21 | 610 |
| Example 69 | G-112 | 526 | 25 | 1.18 | 610 |
| Example 70 | G-113 | 525 | 25 | 1.19 | 610 |
| Example 71 | G-114 | 526 | 25 | 1.21 | 610 |
| Example 72 | G-115 | 524 | 25 | 1.19 | 610 |
| Example 73 | G-116 | 510 | 25 | 1.21 | 610 |
| Example 74 | G-117 | 535 | 25 | 1.21 | 710 |
| Example 75 | G-118 | 524 | 25 | 1.23 | 700 |
| Example 76 | G-119 | 525 | 25 | 1.24 | 710 |
| Example 77 | R-101 | 635 | 47 | 1.15 | 800 |
| Example 78 | R-102 | 635 | 47 | 1.15 | 800 |
| Example 79 | R-103 | 636 | 47 | 1.21 | 810 |
| Comparative Example 6 | G-3 | 517 | 25 | 1.00 | 100 |
| Comparative Example 7 | G-303 | 502 | 56 | 0.98 | 90 |
| Comparative Example 8 | R-3 | 630 | 47 | 1.00 | 200 |
| Comparative Example 9 | R-10 | 607 | 91 | 0.81 | 180 |

Embodiment 1B

<Light Durability Test>

An LED chip was lighted by flowing a current of 10 mA to a light emitting device having mounted therein each color conversion film and a blue LED element (Model Number PM2B-3LBE-SD, manufactured by ProLight, emission peak wavelength: 460 nm) and measured for the initial luminance by using a spectral radiance meter (CS-1000, manufactured by KONICA MINOLTA, INC.). Here, the distance between each color conversion film and the blue LED element was set to be 3 cm. Subsequently, the luminance after continuous irradiation with light from the blue LED element at room temperature for 20 hours was measured. The light durability was evaluated by calculating the luminance retention ratio according to the following formula.

Luminance retention ratio (%)=(luminance 20 hours after blue LED irradiation/initial luminance)×100

(The first decimal place is rounded off.)

Example 80

Using a 300 ml-volume polyethylene-made container, 99.78 wt % of "OE-6630A/B" (produced by Dow Corning Toray, Co., Ltd.) as a silicone resin and 0.22 wt % of Compound G-201 were mixed.

Thereafter, the mixture was stirred and defoamed at 1,000 rpm for 20 minutes by using a planetary stirring/defoaming device, "MAZERUSTAR KK-400" (manufactured by KURABO INDUSTRIES LTD.), to obtain a resin liquid for film preparation.

The resin liquid for film preparation was applied onto "Cerapeel" BLK (produced by Toray Advanced Film Co., Ltd.) by use of a slit die coater, heated at 130° C. for 2 hours, and dried to obtain a color conversion film having a thickness of 200 μm.

Color conversion of blue LED light was performed using the color conversion film above, as a result, when only the green light emission region was extracted, C.I.E. chromaticity coordinates (0.22, 0.72) were obtained, and high-color-purity green emission showing a maximum emission wavelength of 526 nm and providing an emission spectrum with the half width at the maximum emission wavelength of 25 nm was obtained. The light emission intensity at the maximum emission wavelength was 2.80 in terms of relative value when the intensity in case of using Compound G-301 described later is taken as 1.00. In addition, the luminance retention ratio of the color conversion film was 95%, and the light durability was very good.

Comparative Example 10

A color conversion film was prepared in the same manner as in Example 80 except that G-301 was used as the compound. Color conversion of blue LED light was performed using this color conversion film, as a result, when only the green light emission region was extracted, C.I.E. chromaticity coordinates (0.22, 0.72) were obtained, and high-color-purity green emission providing an emission spectrum with the half-value width of 25 nm was obtained, but the fluorescence quantum yield of Compound G-301 was 41%, and the light emission intensity was therefore weak compared with Example. In addition, the luminance retention ratio of the color conversion film was 43%, resulting in poor light durability.

Comparative Example 11

A color conversion film was prepared in the same manner as in Example 80 except that G-302 was used as the compound. Color conversion of blue LED light was performed using this color conversion film, as a result, when only the green light emission region was extracted, C.I.E. chromaticity coordinates (0.24, 0.68) were obtained, and high-color-purity green emission providing an emission spectrum with the half-value width of 25 nm was obtained, but the fluorescence quantum yield of Compound G-302 was 42%, and the light emission intensity was therefore weak compared with Example. In addition, the luminance retention ratio of the color conversion film was 42%, resulting in poor light durability.

Examples 81 to 93

Color conversion films were prepared in the same manner as in Example 80 except that the compound shown in Table 5 was used as the luminescent material. The C.I.E. chromaticity coordinates, half-value width of emission spectrum, florescence quantum yield, and light emission intensity (a relative value when the intensity in case of using Compound G-301 is taken as 1.00) at maximum emission wavelength, in the green light emission region when color conversion of blue LED light was performed using these color conversion films, are shown in Table 5.

TABLE 5

| | Compound | C.I.E. Chromaticity Coordinates | Maximum Emission Wavelength (nm) | Half-Value Width in Emission Spectrum (nm) | Fluorescence Quantum Yield (%) | Light Emission Intensity at Maximum Emission Wavelength (relative value) | Light Durability (%) |
|---|---|---|---|---|---|---|---|
| Example 80 | G-201 | (0.22, 0.72) | 526 | 25 | 83 | 2.80 | 95 |
| Example 81 | G-202 | (0.25, 0.67) | 523 | 28 | 69 | 2.42 | 82 |
| Example 82 | G-203 | (0.22, 0.72) | 527 | 26 | 80 | 2.67 | 84 |
| Example 83 | G-204 | (0.22, 0.72) | 527 | 25 | 79 | 2.66 | 89 |
| Example 84 | G-205 | (0.22, 0.72) | 527 | 25 | 81 | 2.70 | 90 |
| Example 85 | G-206 | (0.22, 0.72) | 526 | 25 | 80 | 2.69 | 92 |
| Example 86 | G-207 | (0.22, 0.72) | 526 | 26 | 80 | 2.68 | 87 |
| Example 87 | G-208 | (0.22, 0.72) | 527 | 25 | 81 | 2.71 | 85 |
| Example 88 | G-209 | (0.22, 0.72) | 527 | 25 | 79 | 2.67 | 83 |
| Example 89 | G-210 | (0.22, 0.72) | 527 | 27 | 78 | 2.66 | 92 |
| Example 90 | G-7 | (0.22, 0.72) | 526 | 27 | 75 | 2.55 | 98 |
| Example 91 | G-4 | (0.22, 0.72) | 529 | 25 | 68 | 2.32 | 98 |
| Example 92 | G-6 | (0.22, 0.72) | 526 | 25 | 75 | 2.56 | 98 |
| Example 93 | G-11 | (0.22, 0.72) | 526 | 26 | 82 | 2.80 | 99 |
| Comparative Example 10 | G-301 | (0.22, 0.72) | 520 | 28 | 41 | 1.00 | 43 |
| Comparative Example 11 | G-302 | (0.24, 0.68) | 539 | 28 | 42 | 0.98 | 42 |
| Comparative Example 12 | G-303 | (0.27, 0.61) | 490 | 55 | 96 | 2.81 | 90 |
| Comparative Example 13 | quantum dot (CdSe) | (0.22, 0.70) | 526 | 35 | 50 | 2.20 | 45 |

Comparative Example 12

A color conversion film was prepared in the same manner as in Example 80 except that G-303 was used as the compound. Color conversion of blue LED light was performed using the color conversion film above, as a result, when only the green light emission region was extracted, C.I.E. chromaticity coordinates (0.27, 0.61) were obtained, and the half-value width of the emission spectrum was 55 nm. The light emission intensity at the maximum emission wavelength was 2.81 in terms of relative value when the intensity in case of using Compound G-301 is taken as 1.00. The light durability was 90% which was good, but the emission spectrum was broadened, and the color purity was therefore reduced.

Comparative Example 13

A color conversion film was prepared in the same manner as in Example 80 except that a quantum dot (CdSe, dot diameter: 3 nm, produced by Sigma-Aldrich Co. LLC) was used as the compound. When only the green light emission region was extracted, C.I.E. chromaticity coordinates (0.22, 0.70) were obtained, and the half-value width of the emission spectrum was 35 nm, but the luminance retention ratio of this color conversion film was 45%, resulting in poor light durability.

DESCRIPTION OF REFERENCE NUMERALS AND SIGNS

1 Color conversion film
10 Substrate layer
11 Color conversion layer
12 Barrier film

The invention claimed is:

1. A color conversion composition for converting incident light into light having longer wavelength than the incident light, wherein the color conversion composition comprises a compound represented by formula (1) and a binder resin:

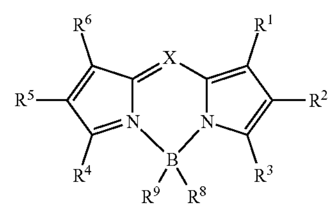

(1)

wherein

X is C—$R^7$, each of $R^1$, $R^3$, $R^4$ and $R^6$, which may be the same as or different from one another, is hydrogen, a halogen, a substituted or unsubstituted alkyl group, a substituted or unsubstituted cycloalkyl group, a substituted or unsubstituted alkoxy group, a substituted or unsubstituted aryl ether group, a substituted or unsubstituted heterocyclic group, a substituted or unsubstituted alkylthio group, a substituted or unsubstituted aryl thioether group, a substituted or unsubstituted amino group, a substituted or unsubstituted silyl group, or a cyano group, $R^2$ and $R^5$, which may be the same as or different from one another, is selected from hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, an aldehyde group, a substituted or unsubstituted carbonyl group, a carboxyl group, a substituted or unsubstituted oxycarbonyl group, a substituted or unsubstituted carbamoyl group, a substituted or unsubstituted ester group, a substituted or unsubstituted sulfonyl group, a substituted or unsubstituted amide group, a substituted or unsubstituted amino group, a nitro group, a substituted or unsubstituted silyl group, a substituted or unsubstituted siloxanyl group, a substituted or unsubstituted boryl group, and a substituted or unsubstituted phosphine oxide group, $R^7$ is either a substituted or unsubstituted aryl group or a substituted or unsubstituted heteroaryl group, and $R^7$ is represented by formula (2):

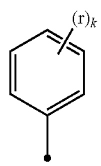

(2)

wherein r is a substituted or unsubstituted aryl group, or a substituted or unsubstituted heteroaryl group, k is an integer of 1 to 3, and when k is 2 or more, r may be the same as or different from one another, and each of $R^8$ and $R^9$, which may be the same as or different from one another, is selected from a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxyl group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, and a halogen.

2. The color conversion composition according to claim 1, wherein in formula (2), r is a substituted or unsubstituted alkyl group, a substituted or unsubstituted alkoxy group, or a halogen.

3. The color conversion composition according to claim 1, wherein in formula (2), k is 1 or 2.

4. The color conversion composition according to claim 1, wherein at least one of $R^1$, $R^3$, $R^4$ and $R^6$ is a substituted or unsubstituted alkyl group.

5. The color conversion composition according to claim 1, wherein the compound represented by formula (1) emits light having a peak wavelength observed in the region of 500 to 580 nm, by use of excitation light.

6. The color conversion composition according to claim 1, wherein the compound represented by formula (1) emits light having a peak wavelength observed in the region of 580 to 750 nm, by use of excitation light.

7. The color conversion composition according to claim 1, wherein the color conversion composition comprises the following luminescent materials (a) and (b) and at least one of the luminescent materials (a) and (b) is a compound represented by formula (1):

(a) a luminescent material emitting light having a peak wavelength observed in the region of 500 to 580 nm by use of excitation light, and (b) a luminescent material emitting light having a peak wavelength observed in the region of 580 to 750 nm upon excitation by at least either one of excitation light and luminescence from the luminescent material (a).

8. The color conversion composition according to claim 7, wherein both of the luminescent materials (a) and (b) are a compound represented by formula (1).

9. The color conversion composition according to claim 7, wherein a content $w_a$ of the luminescent material (a) and a content $w_b$ of the luminescent material (b) have a relationship of $w_a \geq w_b$.

10. The color conversion composition according to claim 1, further comprising a solvent.

11. The color conversion composition according to claim 1, wherein the binder resin is a thermoplastic resin.

12. A color conversion film comprising a layer comprising a cured product of the color conversion composition according to claim 1.

13. The color conversion film according to claim 12, further comprising a barrier film.

14. A light source unit comprising a light source and the color conversion film according to claim 12.

15. The light source unit according to claim 14, wherein the light source is a light-emitting diode having a maximum light emission in a range of 430 to 500 nm.

16. The light source unit according to claim 15, wherein the light source is a light-emitting diode having a maximum light emission in a range of 450 to 470 nm.

17. The light source unit according to claim 14, wherein the light source is a light-emitting diode having an emission peak wavelength in a range of 430 to 470 nm and an emission wavelength region in a range of 400 to 500 nm, and an emission spectrum of the light-emitting diode satisfies equation (1):

$$1>\beta/\alpha\geq;0.15 \quad (1)$$

wherein

α is a light emission intensity at the emission wavelength peak of the emission spectrum, and β is a light emission intensity at a wavelength of emission wavelength peak+15 nm.

18. A display comprising the color conversion film according to claim 12.

19. A lighting comprising the color conversion film according to claim 12.

* * * * *